US012765146B2

(12) United States Patent
Akimoto

(10) Patent No.: US 12,765,146 B2
(45) Date of Patent: Oct. 13, 2026

(54) METHOD FOR MANUFACTURING AN IMAGE DISPLAY DEVICE INCLUDING ROUGHENING A LIGHT-EMITTING SURFACE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 380 days.

(21) Appl. No.: 18/474,548

(22) Filed: Sep. 26, 2023

(65) Prior Publication Data

US 2024/0021773 A1 Jan. 18, 2024

Related U.S. Application Data

(63) Continuation of application No. PCT/JP2022/011368, filed on Mar. 14, 2022.

(30) Foreign Application Priority Data

Mar. 30, 2021 (JP) ................................ 2021-057934

(51) Int. Cl.
*H10H 20/857* (2025.01)
*H10D 86/40* (2025.01)
(Continued)

(52) U.S. Cl.
CPC ........ *H10H 20/857* (2025.01); *H10D 86/441* (2025.01); *H10D 86/60* (2025.01);
(Continued)

(58) Field of Classification Search
CPC ............. H10H 20/857; H10H 20/8514; H10H 20/0361; H10H 20/0364; H10H 20/0363;
(Continued)

(56) References Cited

U.S. PATENT DOCUMENTS 10,090,335 B2 10/2018 Kang et al.
2014/0124799 A1 5/2014 Youn et al.
(Continued)

FOREIGN PATENT DOCUMENTS

JP 2002-141492 A 5/2002
JP 2015-015321 A 1/2015
(Continued)

OTHER PUBLICATIONS

Hyeryun Kim et al., "Fabrication of full-color GaN-based light-emitting diodes on nearly lattice-matched flexible metal foils", Scientific Reports, 7:2112, May 18, 2017.
(Continued)

*Primary Examiner* — Wael M Fahmy
*Assistant Examiner* — Tiberiu Dan Onuta
(74) *Attorney, Agent, or Firm* — Foley & Lardner LLP

(57) ABSTRACT

A method for manufacturing an image display device according to an embodiment includes: preparing a first substrate that includes a circuit element formed on a first surface of a substrate, a first wiring layer connected to the circuit element, and a first insulating film covering the circuit element and the first wiring layer; forming a graphene-including layer on the first insulating film; forming a semiconductor layer that includes a light-emitting layer on the graphene-including layer; forming a light-emitting element that includes a light-emitting surface on the graphene-including layer and includes a top surface at a side opposite to the light-emitting surface by patterning the semiconductor layer; forming a second insulating film covering the first insulating film, the graphene-including layer, and the light-emitting element; forming a first via extending through the first and second insulating films; and forming a second wiring layer on the second insulating film.

9 Claims, 33 Drawing Sheets

(51) Int. Cl.
*H10D 86/60* (2025.01)
*H10H 20/01* (2025.01)
*H10H 20/851* (2025.01)
*H10W 90/00* (2026.01)

(52) U.S. Cl.
CPC ........ *H10H 20/8514* (2025.01); *H10W 90/00* (2026.01); *H10H 20/0361* (2025.01); *H10H 20/0364* (2025.01)

(58) Field of Classification Search
CPC .. H10H 20/851; H10H 20/819; H10H 20/815; H10H 20/8515; H10H 20/855; H10H 29/142; H10H 20/80; H10H 29/10; H10D 86/441; H10D 86/60; H10D 86/40; H10W 90/00; H10W 20/01; H10W 20/40; G09F 9/00; G09F 9/30; G09F 9/33
See application file for complete search history.

(56) References Cited

U.S. PATENT DOCUMENTS

| | | | | |
|---|---|---|---|---|
| 2014/0138722 | A1* | 5/2014 | Yamada | H10H 20/83 257/98 |
| 2014/0267683 | A1 | 9/2014 | Bibl et al. | |
| 2014/0339496 | A1* | 11/2014 | Chu | H10H 20/018 257/13 |
| 2018/0294311 | A1 | 10/2018 | Hsiang et al. | |
| 2018/0301442 | A1 | 10/2018 | Han et al. | |
| 2019/0019816 | A1* | 1/2019 | Kang | H10D 86/441 |
| 2019/0355766 | A1 | 11/2019 | Zhang et al. | |
| 2020/0303471 | A1 | 9/2020 | Akimoto | |
| 2022/0059518 | A1 | 2/2022 | Akimoto | |
| 2022/0069188 | A1 | 3/2022 | Akimoto | |
| 2022/0149228 | A1 | 5/2022 | Akimoto | |
| 2022/0302233 | A1* | 9/2022 | Liu | G06V 40/12 |

FOREIGN PATENT DOCUMENTS

| | | | | |
|---|---|---|---|---|
| JP | 2016-512347 | A | 4/2016 | |
| JP | 2020-507107 | A | 3/2020 | |
| WO | WO-2019168187 | A1 * | 9/2019 | C30B 29/46 |
| WO | WO-2020/196271 | A1 | 10/2020 | |
| WO | WO-2020/226044 | A1 | 11/2020 | |
| WO | WO-2020/230668 | A1 | 11/2020 | |
| WO | WO-2021/014972 | A1 | 1/2021 | |

OTHER PUBLICATIONS

Jeong Woo Shon et al., "Fabrication of full-color InGaN-based light-emitting diodes on amorphous substrates by pulsed sputtering", Scientific Reports, 4:5325, Jun. 23, 2014.
International Search Report Written Opinion of the International Searching Authority issued in the corresponding International Patent Application No. PCT/JP2022/011368, dated May 10, 2022.

* cited by examiner

METHOD FOR MANUFACTURING AN IMAGE DISPLAY DEVICE INCLUDING ROUGHENING A LIGHT-EMITTING SURFACE

CROSS-REFERENCE TO RELATED APPLICATIONS

The present application is a bypass continuation of PCT Application No. PCT/JP2022/011368, filed Mar. 14, 2022, which claims priority to Japanese Application No. 2021-057934, filed Mar. 30, 2021. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (e.g., see Japanese Patent Publication No. 2002-141492).

SUMMARY

An embodiment of the invention provides a method for manufacturing an image display device and an image display device in which a transfer process of a light-emitting element is shortened, and the yield is increased.

A method for manufacturing an image display device according to an embodiment of the invention includes a process of preparing a first substrate that includes a circuit element formed on a first surface of a substrate, a first wiring layer connected to the circuit element, and a first insulating film covering the circuit element and the first wiring layer, a process of forming a graphene-including layer on the first insulating film, a process of forming a semiconductor layer that includes a light-emitting layer on the graphene-including layer, a process of forming a light-emitting element that includes a light-emitting surface on the graphene-including layer and a top surface at a side opposite to the light-emitting surface by patterning the semiconductor layer, a process of forming a second insulating film covering the first insulating film, the graphene-including layer, and the light-emitting element, a process of forming a first via extending through the first and second insulating films, and a process of forming a second wiring layer on the second insulating film. The first via is located between the first wiring layer and the second wiring layer and electrically connects the first wiring layer and the second wiring layer.

An image display device according to an embodiment of the invention includes a first member including a first surface, a circuit element located on the first surface, a first wiring layer electrically connected to the circuit element, a first insulating film covering the first surface, the circuit element, and the first wiring layer, a graphene-including layer located on the first insulating film, a light-emitting element that includes a light-emitting surface on the graphene-including layer and a top surface at a side opposite to the light-emitting surface, a second insulating film covering the first insulating film and the light-emitting element, a first via extending through the first and second insulating films, and a second wiring layer located on the second insulating film. The first via is located between the first wiring layer and the second wiring layer and electrically connects the first wiring layer and the second wiring layer.

An image display device according to an embodiment of the invention includes a first member including a first surface, a circuit element located on the first surface, a first wiring layer electrically connected to the circuit element, a first insulating film covering the first surface, the circuit element, and the first wiring layer, a light-transmitting member extending through the first insulating film and the first member, a light-emitting element that includes a light-emitting surface on the light-transmitting member and a top surface at a side opposite to the light-emitting surface, a second insulating film covering the first insulating film and the light-emitting element, a first via extending through the first and second insulating films, and a second wiring layer located on the second insulating film. The first member includes a light-shielding part having a lower light transmittance than the light-transmitting member. The first via is located between the first wiring layer and the second wiring layer and electrically connects the first wiring layer and the second wiring layer.

An image display device according to an embodiment of the invention includes a light-transmitting member including a first surface, multiple transistors located on the first surface, a first wiring layer electrically connected to the multiple transistors, a first insulating film covering the first surface, the multiple transistors, and the first wiring layer, a graphene-including layer located on the first insulating film, a first semiconductor layer including a light-emitting surface on the graphene-including layer in which multiple light-emitting regions are formable in the light-emitting surface, multiple light-emitting layers located on the first semiconductor layer, multiple second semiconductor layers that are located respectively on the multiple light-emitting layers and are of a different conductivity type from the first semiconductor layer, a second insulating film covering the first insulating film, the first semiconductor layer, the multiple light-emitting layers, and the multiple second semiconductor layers, multiple first vias extending through the first and second insulating films, and a second wiring layer located on the second insulating film. The multiple second semiconductor layers are separated by the second insulating film. The multiple light-emitting layers are separated by the second insulating film. The multiple first vias are located between the first wiring layer and the second wiring layer and electrically connect the first wiring layer and the second wiring layer.

An image display device according to an embodiment of the invention includes a light-transmitting member including a first surface, a circuit element located on the first surface, a first wiring layer electrically connected to the circuit element, a first insulating film covering the first surface, the circuit element, and the first wiring layer, a graphene-including layer located on the first insulating film, multiple light-emitting elements that each include a light-emitting surface on the graphene-including layer and a top surface at a side opposite to the light-emitting surface, a second insulating film covering the first insulating film and the multiple light-emitting elements, a first via extending through the first and second insulating films, and a second wiring layer located on the second insulating film. The first via is located between the first wiring layer and the second wiring layer and electrically connects the first wiring layer and the second wiring layer.

According to an embodiment of the invention, a method for manufacturing an image display device is realized in which a transfer process of a light-emitting element is shortened, and the yield is increased.

According to an embodiment of the invention, a high-definition image display device is realized in which a light-emitting element can be reduced in size.

DETAILED DESCRIPTION

Figure 1:
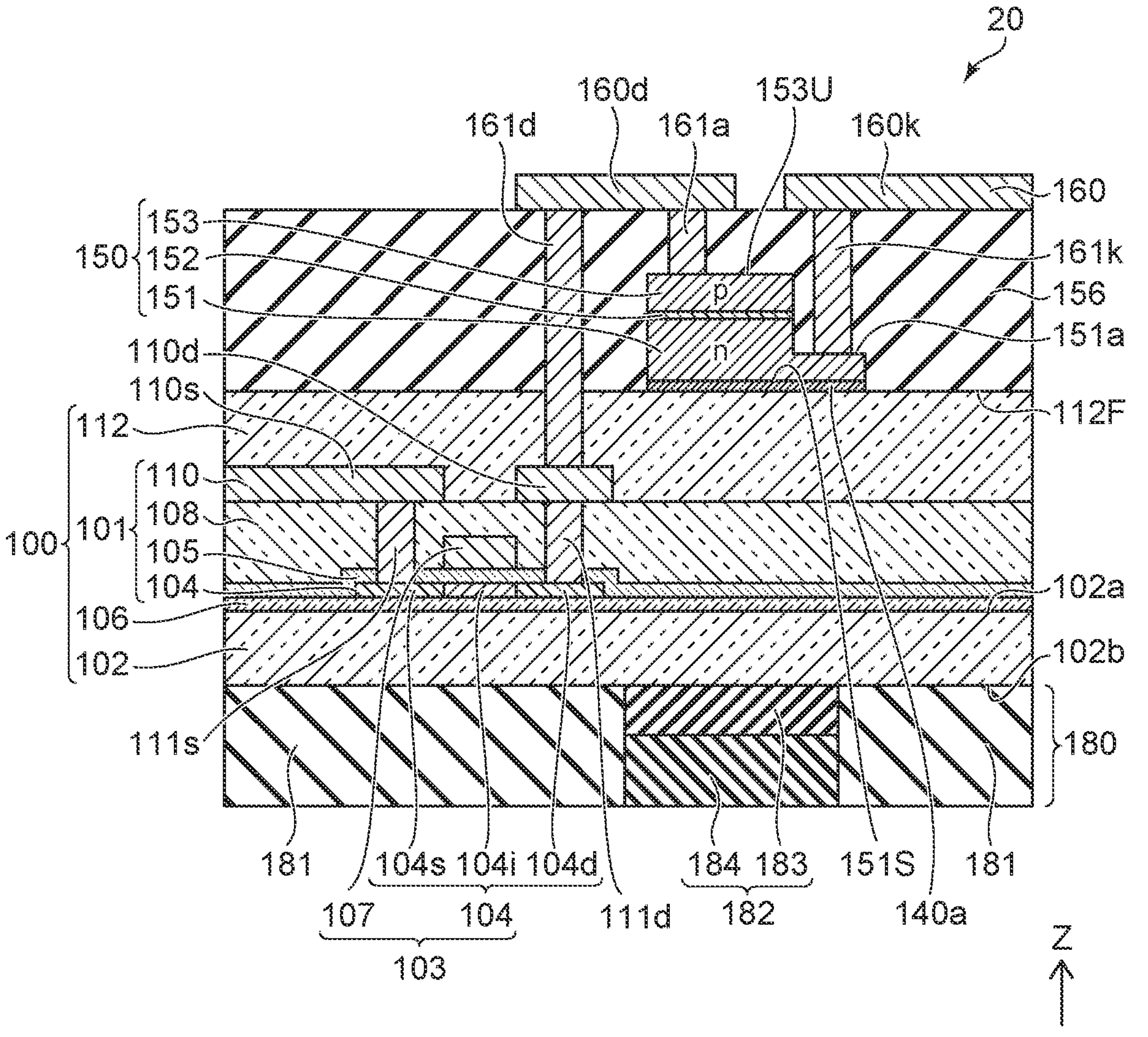
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are identified with the same reference numerals, and a repeated detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment.

Figure 12:
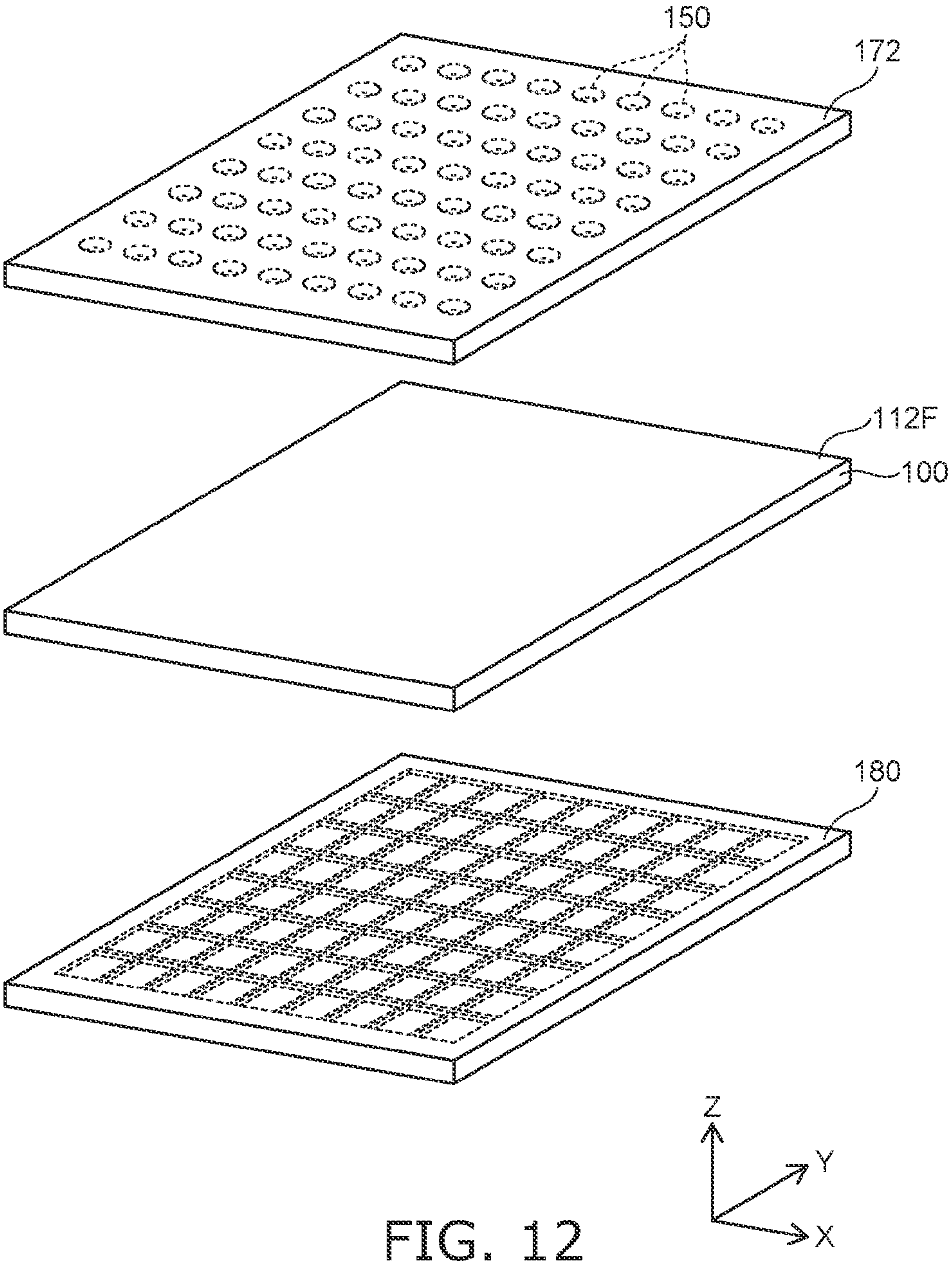
FIG. 12 is a schematic perspective view illustrating the image display device of the first embodiment.
Figure 13:
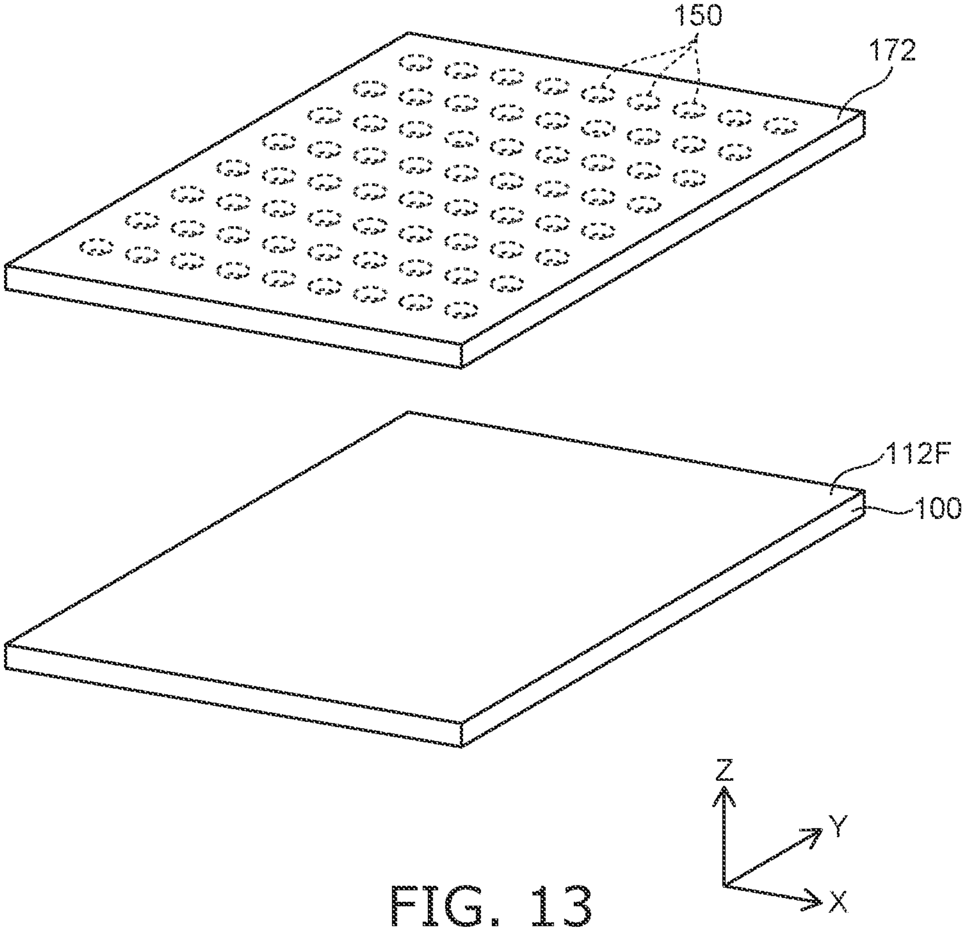
FIG. 13 is a schematic perspective view illustrating an image display device of a modification of the first embodiment.

An XYZ three-dimensional coordinate system may be used in the following description. Light-emitting elements 150 are arranged in a two-dimensional planar configuration as shown in FIGS. 12 and 13 below. The light-emitting element 150 is provided for each subpixel 20. The two-dimensional plane in which the subpixels 20 are arranged is taken as an XY plane. The subpixels 20 are arranged along the X-axis direction and the Y-axis direction. FIG. 1 is an auxiliary cross section along line AA' of FIG. 4 below, and is a cross-sectional view in which cross sections of multiple planes perpendicular to the XY plane are joined in one plane. In FIG. 1, and in other drawings as well, in a cross-sectional view of multiple planes perpendicular to the XY plane, the X-axis and the Y-axis are not illustrated, and the Z-axis perpendicular to the XY plane is shown. That is, in these drawings, the plane perpendicular to the Z-axis is the XY plane.

Although the positive direction of the Z-axis is called "up" or "above" and the negative direction of the Z-axis is called "down" or "below" hereinbelow, the directions along the Z-axis are not always limited to directions in which gravity acts. A length in a direction along the Z-axis may be called a height.

The subpixel 20 includes a light-emitting surface 151S that is substantially parallel to the XY plane. The light-emitting surface 151S is a surface that radiates light mainly in the negative direction of the Z-axis orthogonal to the XY plane. According to the embodiment, its modifications, and all of the embodiments and their modifications described below, the light-emitting surface radiates light mainly in the negative direction of the Z-axis.

As shown in FIG. 1, the subpixel 20 of the image display device includes a substrate (a first member) 102, a transistor (a circuit element) 103, a first wiring layer 110, a first inter-layer insulating film (a first insulating film) 112, a graphene sheet 140*a*, the light-emitting element 150, a second inter-layer insulating film (a second insulating film) 156, a via (a first via) 161*d*, and a second wiring layer 160. The subpixel 20 further includes a color filter 180.

According to the embodiment, the transistor 103 is located on one surface (a first surface) 102*a* of the substrate 102. The color filter 180 is located at another surface 102*b* of the substrate 102. The substrate 102 is light-transmissive and is, for example, a glass substrate.

The transistor 103 is formed on the TFT underlying film 106 located on the surface 102*a*. The transistor 103 is, for example, a thin film transistor (TFT). The transistor 103 is covered with an insulating film 108, and the insulating film 108 is covered with the first inter-layer insulating film 112 together with the first wiring layer 110 located on the insulating film 108.

The light-emitting element 150 is located on the first inter-layer insulating film 112 with the graphene sheet 140*a* interposed. The light-emitting element 150 radiates light by being driven by the transistor 103 located in a lower layer than the light-emitting element 150. The light that is radiated from the light-emitting element 150 is incident on the color filter 180 via the first inter-layer insulating film 112, the insulating film 108, an insulating layer 105, the TFT underlying film 106, and the substrate 102. The light that is incident on the color filter 180 is converted into light of the desired wavelength by the color filter 180 and radiated externally. Thus, according to the embodiment, the light that is radiated from the light-emitting element 150 travels in the negative direction of the Z-axis and is radiated externally. This is similar for the modifications and other embodiments described below as well.

The configuration of the subpixel 20 will now be described in detail.

The color filter 180 includes a light-shielding part 181 and a color conversion part 182. The color conversion part 182 is provided to correspond to the shape of the light-emitting surface 151S below the light-emitting surface 151S of the light-emitting element 150. The part of the color filter 180 other than the color conversion part 182 is used as the light-shielding part 181. The light-shielding part 181 is a so-called black matrix that reduces blur due to color mixing of the light emitted from the adjacent color conversion part 182, etc., and makes it possible to display a sharp image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of a color conversion layer 183 and a filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer of the filter layer 184.

When the color conversion part 182 has two layers, one layer is the color conversion layer 183, and the other layer is the filter layer 184. The color conversion layer 183 is stacked on the filter layer 184, and the color conversion layer 183 is located at a position more proximate to the light-emitting element 150 than the filter layer 184.

The color conversion layer 183 converts the wavelength of the light emitted by the light-emitting element 150 into the desired wavelength. When the subpixel 20 emits red, for example, the light of the wavelength of the light-emitting element 150, i.e., 467 nm±30 nm, is converted into light of a wavelength of about 630 nm±20 nm. When the subpixel 20 emits green, for example, the light of the wavelength of the light-emitting element 150, i.e., 467 nm±30 nm, is converted into light of a wavelength of about 532 nm±20 nm.

The filter layer 184 of a subpixel that emits red or green shields the wavelength component of the blue light emission that remains without undergoing color conversion by the color conversion layer 183. The filter layer 184 of a subpixel that emits blue shields the wavelength component of light other than blue.

When the color of the light emitted by the subpixel 20 is blue, the light may be output via the color conversion layer 183 or may be output via the filter layer 184 without passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide the color conversion layer 183 to convert the wavelength of the output light into about 467 nm±30 nm.

The subpixel 20 may include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

The color filter 180 is provided in contact with the surface 102*b* of the substrate 102, and the TFT underlying film 106 is provided over the surface 102*a* at the side opposite to the surface 102*b*. The transistor 103 is located on the TFT underlying film 106. The TFT underlying film 106 is provided to ensure the flatness when forming the transistor 103 and to protect the TFT channel of the transistor 103 from contamination, etc., in the heat processing. The TFT underlying film 106 is an insulating film of $SiO_2$, etc., and is light-transmissive.

In addition to the transistor 103, other circuit elements such as transistors, capacitors, etc., are formed on the TFT underlying film 106, and a circuit 101 is configured by wiring parts, etc. For example, the transistor 103 in FIG. 3 below corresponds to a drive transistor 26. Also, a select transistor 24, a capacitor 28, etc., are circuit elements in FIG. 3. The circuit 101 includes the TFT channel 104, the insulating layer 105, the insulating film 108, vias 111*s* and 111*d*, and the first wiring layer 110.

In the example, the transistor 103 is a p-channel TFT. The transistor 103 includes the TFT channel 104 and a gate 107. It is favorable to form the TFT channel 104 by a low-temperature polysilicon (LTPS) process. In a LTPS process, the TFT channel 104 is formed by polycrystallizing and activating an amorphous Si region formed on the TFT underlying film 106. For example, laser annealing by a laser is used to polycrystallize and activate the amorphous Si region. The TFT that is formed by the LTPS process has sufficiently high mobility.

The TFT channel 104 includes regions 104*s*, 104*i*, and 104*d*. The regions 104*s*, 104*i*, and 104*d* each are located on the TFT underlying film 106. The region 104*i* is located between the region 104*s* and the region 104*d*. The regions 104*s* and 104*d* include an impurity such as boron (B), boron fluoride (BF), or the like and form p-type semiconductor regions. The region 104*s* has an ohmic connection with the via 111*s*, and the region 104*d* has an ohmic connection with the via 111*d*.

The insulating layer 105 is located on the TFT underlying film 106 and the TFT channel 104. The insulating layer 105 is, for example, $SiO_2$. The insulating layer 105 may be a multilevel insulating layer that includes $SiO_2$, $Si_3N_4$, etc.

The gate 107 is located on the TFT channel 104 with the insulating layer 105 interposed. The insulating layer 105 is provided to insulate the TFT channel 104 and the gate 107 and insulate from other adjacent circuit elements. The current that flows between the regions 104*s* and 104*d* can be controlled by forming a channel in the region 104*i* when a lower potential than that of the region 104*s* is applied to the gate 107.

For example, the gate 107 may be formed of polycrystalline Si or may be formed of a refractory metal such as W, Mo, etc., for example, the gate 107 is formed by CVD, etc., when the gate 107 is formed of a polycrystalline Si film.

The insulating film 108 is located on the insulating layer 105 and the gate 107. The insulating film 108 is, for example, an inorganic film of $SiO_2$, $Si_3N_4$, etc. The insulating film 108 is favorably a stacked film of $SiO_2$, $Si_3N_4$, etc. The insulating film 108 is provided to separate adjacent circuit elements such as the transistors 103, etc., from each other. The insulating film 108 provides a surface that is flat enough not to hinder the formation of the first wiring layer 110. The insulating film 108, the insulating layer 105, and the TFT underlying film 106 are light-transmissive.

The first wiring layer 110 is located on the insulating film 108. The first wiring layer 110 can include multiple wiring parts that can have different potentials. The first wiring layer 110 includes wiring parts 110*s* and 110*d*. The wiring parts 110*s* and 110*d* are formed to be separated from each other and can be connected to different potentials.

In FIG. 1 and subsequent cross-sectional views, unless otherwise noted, the reference numeral of a wiring layer is displayed beside a wiring part included in the wiring layer. For example, in FIG. 1, the reference numeral of the first wiring layer 110 is displayed beside the wiring part 110*s*.

The wiring part 110*s* is located above the region 104*s*. For example, the wiring part 110*s* is connected to a power supply line 3 shown in FIG. 3 below. The wiring part 110*d* is located above the region 104*d*. One end of the via 161*d* is connected to the wiring part 110*d*. The other end of the via 161*d* is connected to the second wiring layer 160.

The vias 111*s* and 111*d* extend through the insulating film 108 and the insulating layer 105. The via 111*s* is located between the wiring part 110*s* and the region 104*s* and electrically connects the wiring part 110*s* and the region 104*s*. The via 111*d* is located between the wiring part 110*d* and the region 104*d* and electrically connects the wiring part 110*d* and the region 104*d*.

The wiring part 110*s* is connected to the region 104*s* by the via 111*s*. The region 104*s* is a source region of the transistor 103. Accordingly, for example, the source region of the transistor 103 is electrically connected to the power supply line 3 of the circuit of FIG. 3 by the via 111*s* and the wiring part 110*s*.

The wiring part 110*d* is connected to the region 104*d* by the via 111*d*. The region 104*d* is a drain region of the transistor 103. Accordingly, the drain region of the transistor 103 is electrically connected to the second wiring layer 160 by the via 111*d*, the wiring part 110*d*, and the via 161*d*.

The first inter-layer insulating film 112 is provided to cover the insulating film 108 and the first wiring layer 110. As described in the manufacturing method described below, the first inter-layer insulating film 112 provides a planarized surface 112F for forming a graphene layer and for performing crystal growth of a semiconductor layer on the graphene layer. The first inter-layer insulating film 112 is formed of a light-transmitting organic material and is formed of, for example, a transparent resin. The transparent resin can be, for example, a silicon resin such as SOG (Spin On Glass) or the like, a novolak phenolic resin, etc.

The graphene sheet 140*a* is provided for each light-emitting element 150 on the planarized surface 112F. The light-emitting surface 151S contacts the graphene sheet 140*a*. The light-emitting element 150 is located on the planarized surface 112F with the graphene sheet 140*a* interposed. The outer perimeter of the graphene sheet 140*a* when projected onto the XY plane substantially matches the outer perimeter of the light-emitting element 150 when projected onto the XY plane. Because the thickness of the graphene sheet 140*a* is sufficiently thin, the graphene sheet 140*a* can transmit light.

As described below with reference to FIG. 6B and subsequent drawings, the graphene sheet 140*a* is formed by etching a graphene layer 1140. The graphene layer 1140 is used as a seed for forming the light-emitting element 150.

The light-emitting element 150 includes a top surface 153U located at the side opposite to the light-emitting surface 151S. In the example, the outer perimeter shapes of the light-emitting surface 151S and the top surface 153U when projected onto the XY plane are quadrangular or rectangular, and the light-emitting element 150 is, for example, a prismatic element located on the planarized surface 112F with the graphene sheet 140*a* interposed. The cross section of the prism may be a polygon having five or more sides. The light-emitting element 150 is not limited to a prismatic element and may be a cylindrical element.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are stacked in this order from the light-emitting surface 151S toward the top surface 153U. The light-emitting surface 151S is provided by the n-type semiconductor layer 151. The light-emitting element 150 radiates light in the negative direction of the Z-axis via the graphene sheet 140*a*, the first inter-layer insulating film 112, the insulating film 108, the insulating layer 105, the TFT underlying film 106, the substrate 102, and the color filter 180.

The n-type semiconductor layer 151 includes a connection part 151*a*. Together with the graphene sheet 140*a*, the connection part 151*a* is provided to protrude in one direction from the n-type semiconductor layer 151 over the planarized surface 112F. The height of the connection part 151*a* from the light-emitting surface 151S is the same as the height of the n-type semiconductor layer 151 from the light-emitting surface 151S or less than the height of the n-type semiconductor layer 151 from the light-emitting surface 151S. The connection part 151*a* is a portion of the n-type semiconductor layer 151. The connection part 151*a* is connected to one end of a via 161*k*, and the n-type semiconductor layer 151 is electrically connected to the via 161*k* by the connection part 151*a*.

When the light-emitting element 150 is prismatic, the shape of the light-emitting element 150 when projected onto the XY plane is, for example, substantially square or rectangular. When the shape of the light-emitting element 150 when projected onto the XY plane is polygonal including quadrangular, the corner portions of the light-emitting element 150 may be rounded. When the shape of the light-emitting element 150 when projected onto the XY plane is cylindrical, the shape of the light-emitting element 150 when projected onto the XY plane is not limited to circular and may be, for example, elliptical. The degree of freedom of the wiring layout and the like is increased by appropriately selecting the shape, arrangement, etc., of the light-emitting element in a plan view.

For example, the light-emitting element 150 favorably uses a gallium nitride compound semiconductor including a light-emitting layer of $In_XAl_YGa_{1-X-Y}N$ ($0 \le X$, $0 \le Y$, and $X+Y<1$), etc. Hereinbelow, the gallium nitride compound semiconductor described above may be called simply gallium nitride (GaN). According to an embodiment of the invention, the light-emitting element 150 is a so-called light-emitting diode. It is sufficient for the wavelength of the light emitted by the light-emitting element 150 to be in the range from the near-ultraviolet region to the visible region, e.g., about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The second inter-layer insulating film 156 covers the planarized surface 112F, the graphene sheet 140*a*, and the light-emitting element 150. The second inter-layer insulating film 156 separates from other adjacent light-emitting elements 150. The second inter-layer insulating film 156 protects the light-emitting element 150 from the surrounding environment by covering the light-emitting element 150. It is sufficient for the surface of the second inter-layer insulating film 156 to be flat enough to form the second wiring layer 160 on the second inter-layer insulating film 156.

The second inter-layer insulating film 156 is formed of an organic insulating material. It is favorable for the organic insulating material included in the second inter-layer insulating film 156 to be a light-reflective resin, e.g., a white resin. By using a white resin as the second inter-layer insulating film 156, the light emitted by the light-emitting element 150 in the lateral direction can be reflected and guided toward the light-emitting surface 151S side, and so the luminous efficiency of the light-emitting element 150 can be substantially improved.

The white resin is formed by dispersing fine scattering particles having a Mie scattering effect in a silicon resin such as SOG or the like, a transparent resin such as a novolak phenolic resin, etc. The fine scattering particles are colorless or white and have a diameter of about 1/10 to about several times the wavelength of the light emitted by the light-emitting element 150. The fine scattering particles that are favorably used have a diameter of about ½ of the light wavelength. For example, $TiO_2$, $Al_2O_3$, ZnO, etc., are examples of such a fine scattering particle.

The white resin also can be formed by utilizing many fine voids or the like dispersed in a transparent resin. When whitening the second inter-layer insulating film 156, for example, a $SiO_2$ film or the like formed by ALD (Atomic-Layer-Deposition) or CVD may be used by overlaying with SOG, etc.

The second inter-layer insulating film 156 may be a black resin. By using a black resin as the second inter-layer insulating film 156, the scattering of the light inside the subpixel 20 is suppressed, and stray light is more effectively suppressed. An image display device in which stray light is suppressed can display a sharper image.

The second wiring layer 160 is located on the second inter-layer insulating film 156. The second wiring layer 160 can include multiple wiring parts that can have different potentials. The second wiring layer 160 includes wiring parts 160*d* and 160*k*. The wiring parts 160*d* and 160*k* are formed to be separated and can be connected to different potentials.

A connection member 161*a* is located between the top surface 153U and the wiring part 160*d* located above the top surface 153U, and the top surface 153U is connected to the wiring part 160*d* by the connection member 161*a*. The wiring part 160*d* also is located above the wiring part 110*d*. The wiring part 160*k* is located above the connection part 151*a*. For example, the wiring part 160*k* is connected to a ground line 4 of the circuit of FIG. 3.

The via 161*d* extends through the second and first inter-layer insulating films 156 and 112 and reach the wiring part 110*d*. The via 161*d* is located between the wiring part (the first wiring part) 160*d* and the wiring part 110*d* and electrically connects the wiring part 160*d* and the wiring part 110*d*. Accordingly, the p-type semiconductor layer 153 is electrically connected to the drain region of the transistor 103 via the connection member 161*a*, the wiring part 160*d*, the via 161*d*, the wiring part 110*d*, and the via 111*d*.

The via (the second via) 161*k* extends through the second inter-layer insulating film 156 and reach the connection part 151*a*. The via 161*k* is located between the wiring part (the second wiring part) 160*k* and the connection part 151*a* and connects the wiring part 160*k* and the connection part 151*a*. Accordingly, for example, the n-type semiconductor layer 151 is electrically connected to the ground line 4 of the circuit of FIG. 3 via the connection part 151*a*, the via 161*k*, and the wiring part 160*k*.

For example, the first wiring layer 110, the connection member 161*a*, and the vias 111*s*, 111*d*, 161*d*, and 161*k* are formed of Al, an alloy of Al, a stacked film of Al, Ti, and the like, etc. For example, in a stacked film of Al and Ti, Al is stacked on a thin film of Ti, and then Ti is stacked on the Al.

A protective layer also may be provided over the second inter-layer insulating film 156 and the second wiring layer 160 to protect from the external environment.

Modification 1

Figure 2:
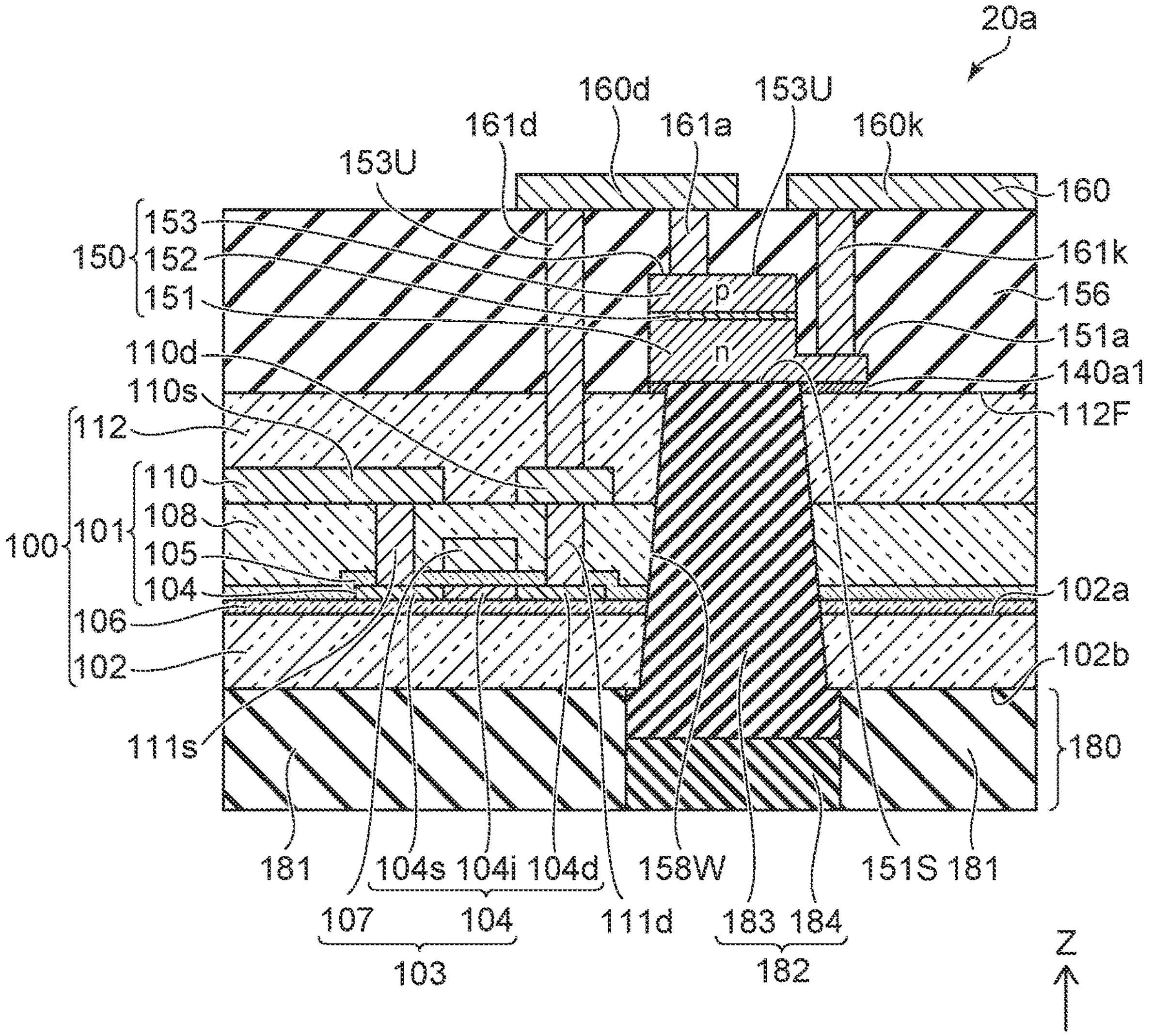
FIG. 2 is a schematic cross-sectional view illustrating a portion of an image display device according to a modification of the first embodiment.

FIG. 2 is a schematic cross-sectional view illustrating a portion of an image display device according to a modification of the embodiment.

In a subpixel 20*a* of the image display device of the modification as shown in FIG. 2, a portion of the color filter 180 extends through a graphene sheet 140*a*1, the first inter-layer insulating film 112, the insulating film 108, the insulating layer 105, the TFT underlying film 106, and the substrate 102. In the example, a portion of the color filter 180 is the color conversion layer 183. The light-emitting surface 151S is provided over the graphene sheet 140*a*1 and the color conversion layer 183. Accordingly, the light that is emitted by the light-emitting element 150 directly enters the color conversion layer 183 via the light-emitting surface 151S, passes through the filter layer 184, and is radiated externally.

The components of the circuit 101 including the transistor 103 are located on the light-shielding part 181 of the color filter 180 with the substrate 102 interposed.

The color conversion layer 183 fills an opening that extends through the graphene sheet 140*a*1, the first inter-layer insulating film 112, the insulating film 108, the insulating layer 105, the TFT underlying film 106, and the substrate 102 and reaches the light-emitting surface 151S, and the color conversion layer 183 is provided to cover a wall surface 158W and the light-emitting surface 151S of the opening. According to the modification, the light that is emitted from the light-emitting element 150 directly enters the color filter 180; therefore, the attenuation of the intensity until reaching the color filter 180 can be suppressed.

Although the modification has a configuration in which the color filter 180 is provided over the surface 102*b* of the substrate 102, the wall surface 158W, and the light-emitting surface 151S, for example, the components of the circuit 101 such as the transistor 103, etc., may be located on the color filter 180 without interposing the substrate 102 as in the third embodiment described below.

Similarly to the second inter-layer insulating film 156, the first inter-layer insulating film 112 and the insulating film 108 may be formed of a light-reflective material such as a white resin, etc. Accordingly, the light that travels through the color conversion layer 183 can be prevented from leaking into the first inter-layer insulating film 112 and the insulating film 108, and the attenuation of the intensity can be suppressed.

Because the thickness of the graphene sheet 140*a*1 can be thin enough to have a high light transmittance, the color conversion layer 183 may not extend through the graphene sheet.

Figure 3:
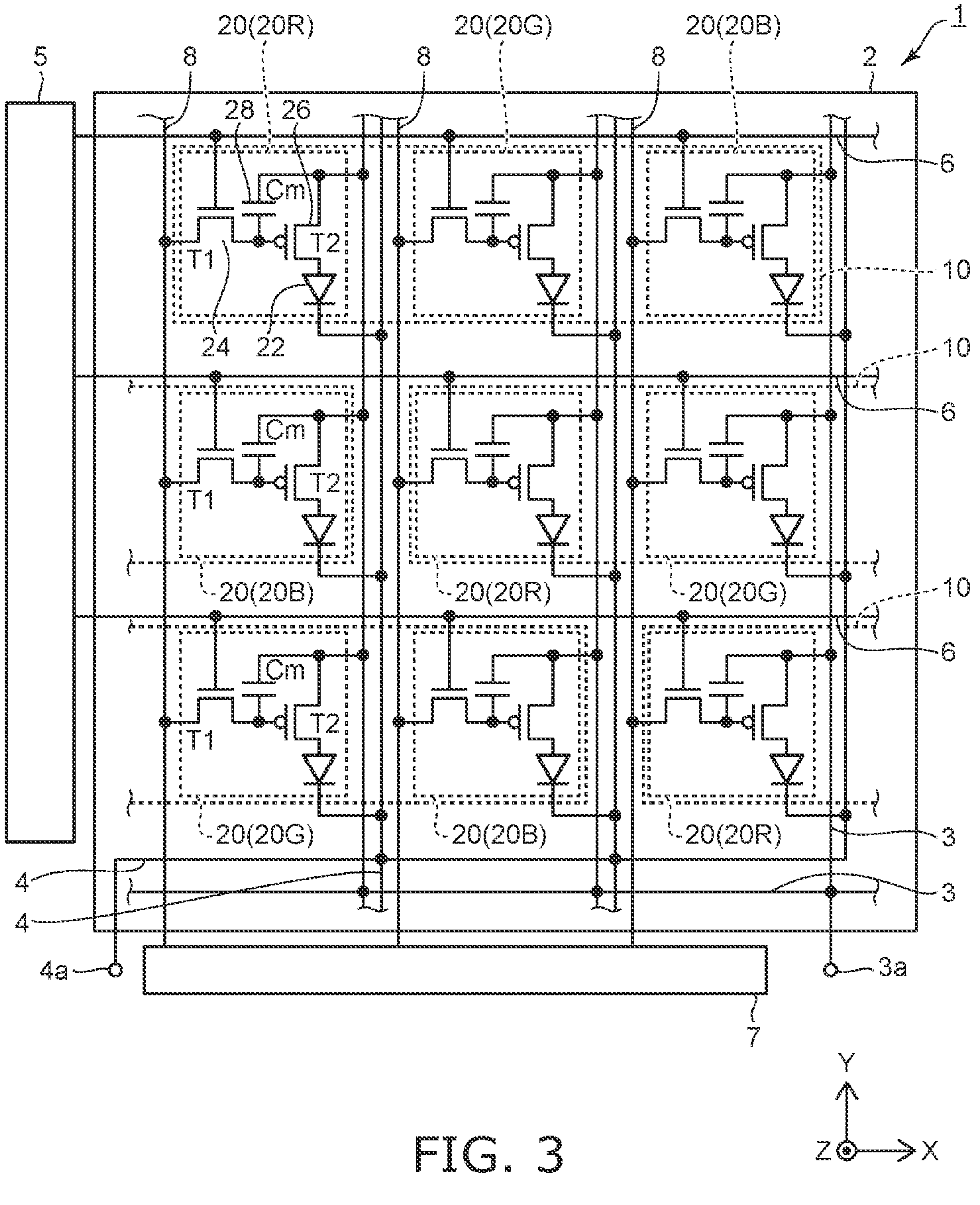
FIG. 3 is a schematic block diagram illustrating the image display device of the first embodiment.

FIG. 3 is a schematic block diagram illustrating the image display device according to the embodiment.

As shown in FIG. 3, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 3. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3*a* and the GND terminal 4*a*. The power supply terminal 3*a* and the GND terminal 4*a* are located respectively at end portions of the power supply line 3 and the ground line 4, and are connected to a DC power supply circuit located outside the display region 2. The power supply terminal 3*a* supplies a positive voltage when referenced to the GND terminal 4*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the outer edge of the display region 2 in the Y-axis direction. The row selection circuit 5 is electrically connected to the subpixel 20 of each column via the scanning line 6, and supplies a select signal to each subpixel 20.

The signal voltage output circuit 7 is located along the outer edge of the display region 2 in the X-axis direction. The signal voltage output circuit 7 is electrically connected to the subpixel 20 of each row via the signal line 8, and supplies a signal voltage to each subpixel 20.

Figure 4:
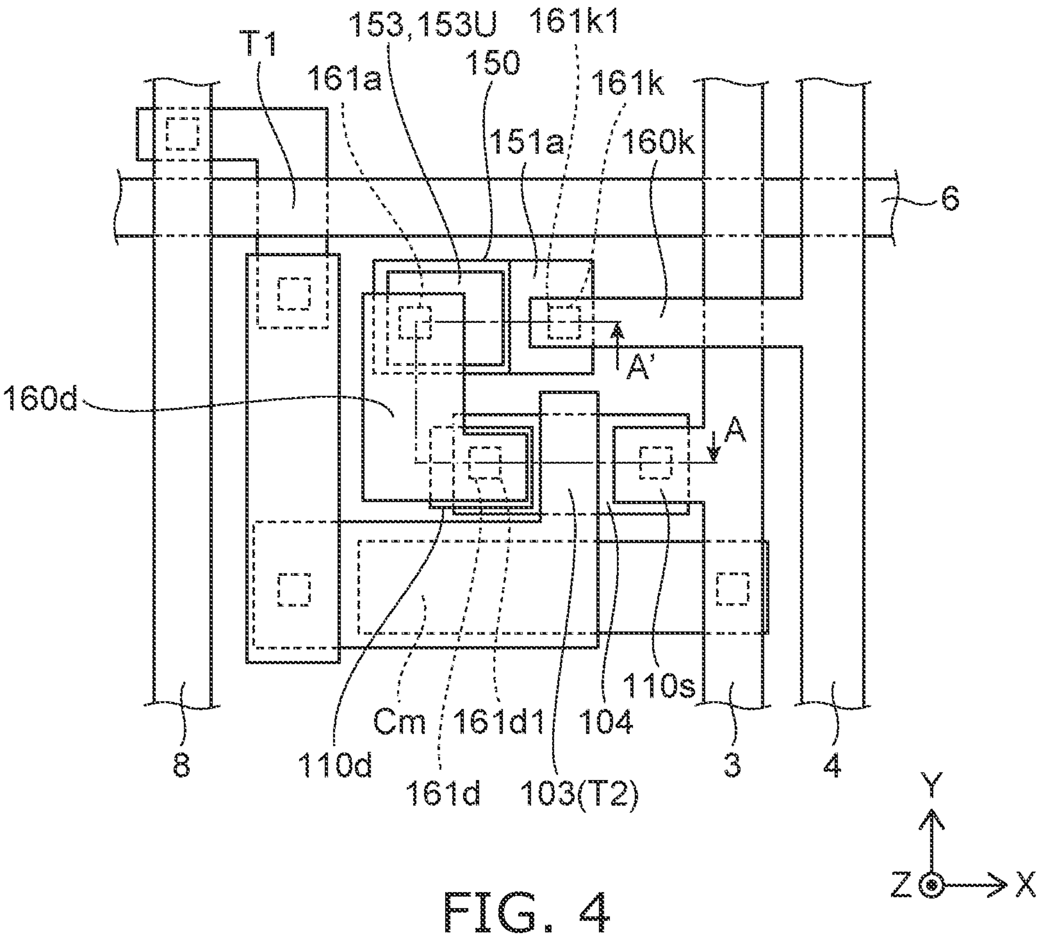
FIG. 4 is a schematic plan view illustrating a portion of the image display device of the first embodiment.

The subpixel 20 includes a light-emitting element 22, the select transistor 24, the drive transistor 26, and the capacitor 28. In FIGS. 3 and 4 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and the anode electrode of the light-emitting element 22 is connected to the drain electrode of the drive transistor 26. Major electrodes of the drive transistor 26 and the select transistor 24 are drain electrodes and source electrodes. The anode electrode of the light-emitting element 22 is connected to the p-type semiconductor layer. The cathode electrode of the light-emitting element 22 is connected to the n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 allows a current corresponding to the signal voltage to flow in the light-emitting element 22. The light-emitting element 22 emits light of a luminance corresponding to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. The luminance of the subpixel 20 is determined by the current flowing in the light-emitting element 22. An image is displayed in the display region 2 by the subpixels 20 emitting light of the gradations based on the determined luminances.

FIG. 4 is a schematic plan view illustrating a portion of the image display device of the embodiment.

In FIG. 4, the cutting plane line of the cross-sectional views of FIG. 1, etc., is illustrated by line AA'. According to the embodiment, the light-emitting element 150 and the drive transistor 103 are stacked in the Z-axis direction with the first and second inter-layer insulating films 112 and 156 interposed. The light-emitting element 150 corresponds to the light-emitting element 22 of FIG. 3. The drive transistor 103 corresponds to the drive transistor 26 of FIG. 3 and is labeled T2 as well.

As shown in FIG. 4, the anode electrode of the light-emitting element 150 is provided by the p-type semiconductor layer 153 shown in FIG. 1. The connection member 161*a* is located on the top surface 153U of the p-type semiconductor layer 153. The p-type semiconductor layer 153 is connected to the wiring part 160*d* via the connection member 161*a*. The wiring part 160*d* is connected to the via 161*d* by a contact hole 161*d*1, and the wiring part 160*d* is connected to the wiring part 110*d* located in the lower layer by the via 161*d*.

The wiring part 110*d* is connected to the drain electrode of the transistor 103 by the via 111*d* shown in FIG. 1. The drain electrode of the transistor 103 is a portion of the TFT channel 104 and is the region 104*d* shown in FIG. 1. The source electrode of the transistor 103 is connected to the wiring part 110*s* by the via 111*s* shown in FIG. 1. The source electrode of the transistor 103 is the region 104*s* shown in FIG. 1. In the example, the first wiring layer 110 includes the power supply line 3, and the wiring part 110*s* is connected to the power supply line 3.

The cathode electrode of the light-emitting element 150 is provided by the connection part 151*a*. The connection part 151*a* is located in a higher layer than the transistor 103 and the first wiring layer 110. The connection part 151*a* is electrically connected to the wiring part 160*k* by the via 161*k*. More specifically, one end of the via 161*k* is connected to the connection part 151*a*. The other end of the via 161*k* is connected to the wiring part 160*k* via a contact hole 161*k*1. The wiring part 160*k* is connected to the ground line 4.

Thus, by using the via 161*d* in the light-emitting element 150, the first wiring layer 110 that is located in a lower layer than the light-emitting element 150 can be electrically connected to the second wiring layer 160. By using the via 161*k* in the light-emitting element 150, the connection part 151*a* that is located lower than the second wiring layer 160 can be electrically connected to the second wiring layer 160.

A method for manufacturing the image display device of the embodiment will now be described.

FIGS. 5A to 8 are schematic cross-sectional views illustrating a portion of the method for manufacturing the image display device of the embodiment.

Figure 5A:
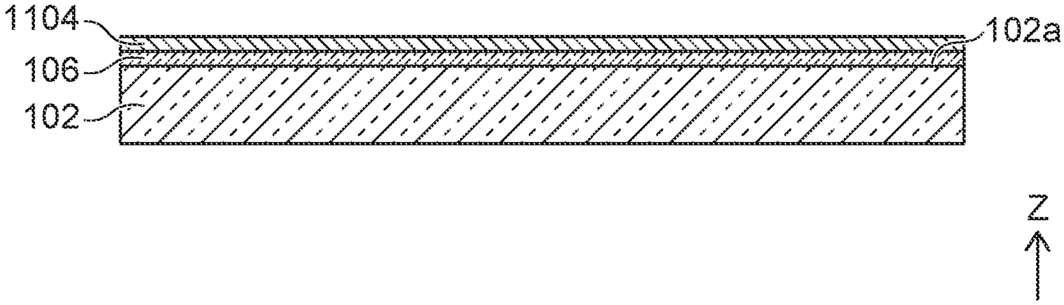
FIG. 5A is a schematic cross-sectional view illustrating a portion of a method for manufacturing the image display device of the first embodiment.

As shown in FIG. 5A, the substrate 102 is prepared according to the method for manufacturing the image display device of the embodiment. The substrate 102 is a light-transmitting substrate and is, for example, a substantially rectangular glass substrate of about 1500 mm×1800 mm. The TFT underlying film 106 is formed on the one surface (the first surface) 102*a*. For example, the TFT underlying film 106 is formed by CVD. A Si layer 1104 is formed on the TFT underlying film 106 that is formed. The Si layer 1104 is an amorphous Si layer when forming, and is polycrystallized after forming by, for example, scanning an excimer laser pulse multiple times.

Figure 5B:
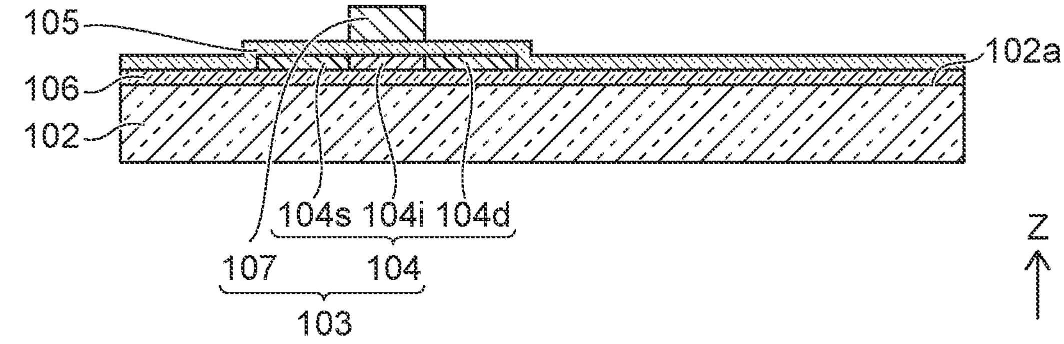
FIG. 5B is a schematic cross-sectional view illustrating a portion of the method for manufacturing the image display device of the first embodiment.

As shown in FIG. 5B, the transistor 103 is formed at a prescribed position on the TFT underlying film 106. For example, the transistor 103 is formed as follows in a LTPS process.

The polycrystallized Si layer 1104 shown in FIG. 5A is patterned into an island configuration such as the transistor 103 shown in FIG. 4 to form the TFT channel 104. The insulating layer 105 is formed to cover the TFT underlying film 106 and the TFT channel 104. The insulating layer 105 functions as a gate insulating film. The gate 107 is formed on the TFT channel 104 with the insulating layer 105 interposed. The gate 107 is selectively doped with an impurity such as B or the like and thermally activated to form the transistor 103. The regions 104*s* and 104*d* are used as p-type active regions and function respectively as the source region and drain region of the transistor 103. The region 104*i* is used as an n-type active region and functions as a channel.

Figure 6A:
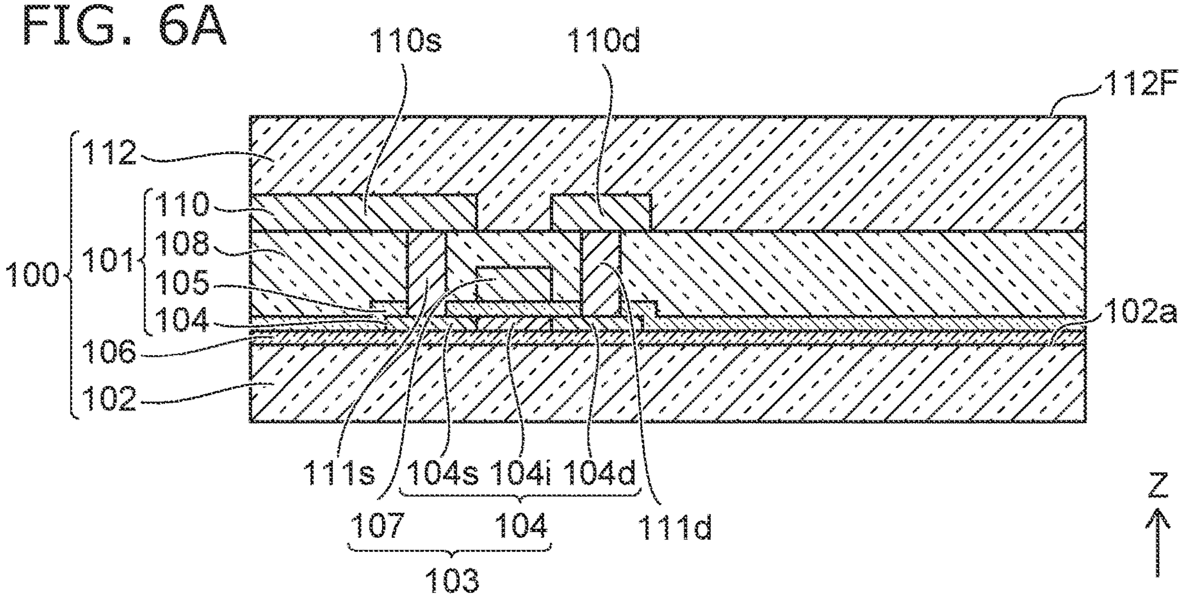
FIG. 6A is a schematic cross-sectional view illustrating a portion of the method for manufacturing the image display device of the first embodiment.

As shown in FIG. 6A, the insulating film 108 is formed to cover the insulating layer 105 and the gate 107. An appropriate formation method according to the material of the insulating film 108 is applied to form the insulating film 108. For example, technology such as ALD, CVD, or the like is used when the insulating film 108 is formed of $SiO_2$.

It is sufficient for the insulating film 108 to be flat enough to form the first wiring layer 110, and a planarizing process may not always be performed. The number of processes can be reduced when a planarizing process of the insulating film 108 is not performed.

The vias 111*s* and 111*d* are formed to extend through the insulating film 108 and the insulating layer 105. The via 111*s* is formed to reach the region 104*s*. The via 111*d* is formed to reach the region 104*d*. For example, RIE or the like is used to form via holes for forming the vias 111*s* and 111*d*.

The first wiring layer 110 that includes the wiring parts 110*s* and 110*d* is formed on the insulating film 108. The wiring part 110*s* is connected to one end of the via 111*s*. The wiring part 110*d* is connected to one end of the via 111*d*. The first wiring layer 110 may be formed simultaneously with the formation of the vias 111*s* and 111*d*.

The first inter-layer insulating film (the first insulating film) 112 is formed to cover the insulating film 108 and the first wiring layer 110. The planarized surface 112F is formed by planarizing the surface of the first inter-layer insulating film 112 by chemical mechanical polishing (CMP), etc.

Thus, a drive circuit substrate (a first substrate) 100 is formed. The manufacturing processes of the drive circuit substrate 100 may be performed in the same plant or in a different plant from the formation process of the semiconductor layer described below and subsequent processes.

Figure 6B:
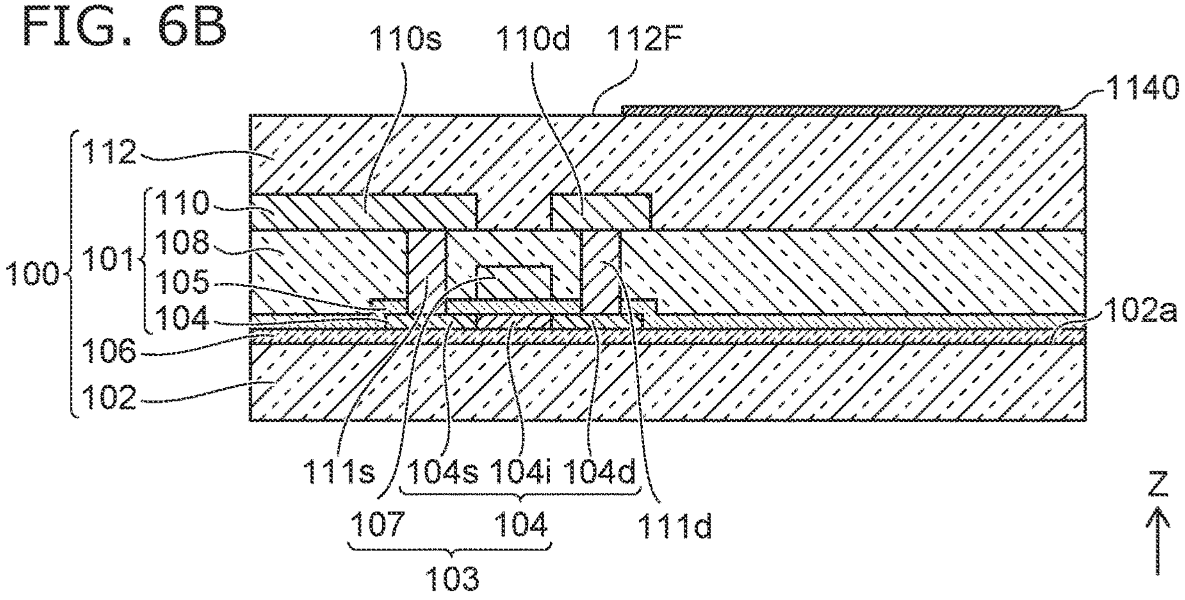
FIG. 6B is a schematic cross-sectional view illustrating a portion of the method for manufacturing the image display device of the first embodiment.

As shown in FIG. 6B, the graphene layer 1140 is formed on the planarized surface 112F. The graphene layer 1140 is a graphene-including layer and is favorably formed by stacking several layers to about 10 layers of a single-layer graphene layer. The graphene layer 1140 that is cut to the appropriate size and shape is located at a prescribed position on the planarized surface 112F and held by suction to the planarized surface 112F by the flatness of the planarized surface 112F. For example, the graphene layer 1140 may be bonded on the planarized surface 112F by an adhesive, etc.

The outer perimeter of the cut graphene layer 1140 when projected onto the XY plane is determined according to the outer perimeter of a semiconductor layer 1150 shown in FIG. 7A below when projected onto the XY plane. The outer perimeter of the graphene layer 1140 when projected onto the XY plane and the outer perimeter of the semiconductor layer 1150 when projected onto the XY plane are set to sufficiently include the outer perimeter of the light-emitting element 150 of FIG. 7B below when projected onto the XY plane. That is, the outer perimeter of the light-emitting element 150 is located within the outer perimeter of the graphene layer 1140 and within the outer perimeter of the semiconductor layer 1150 when projected onto the XY plane.

Figure 7A:
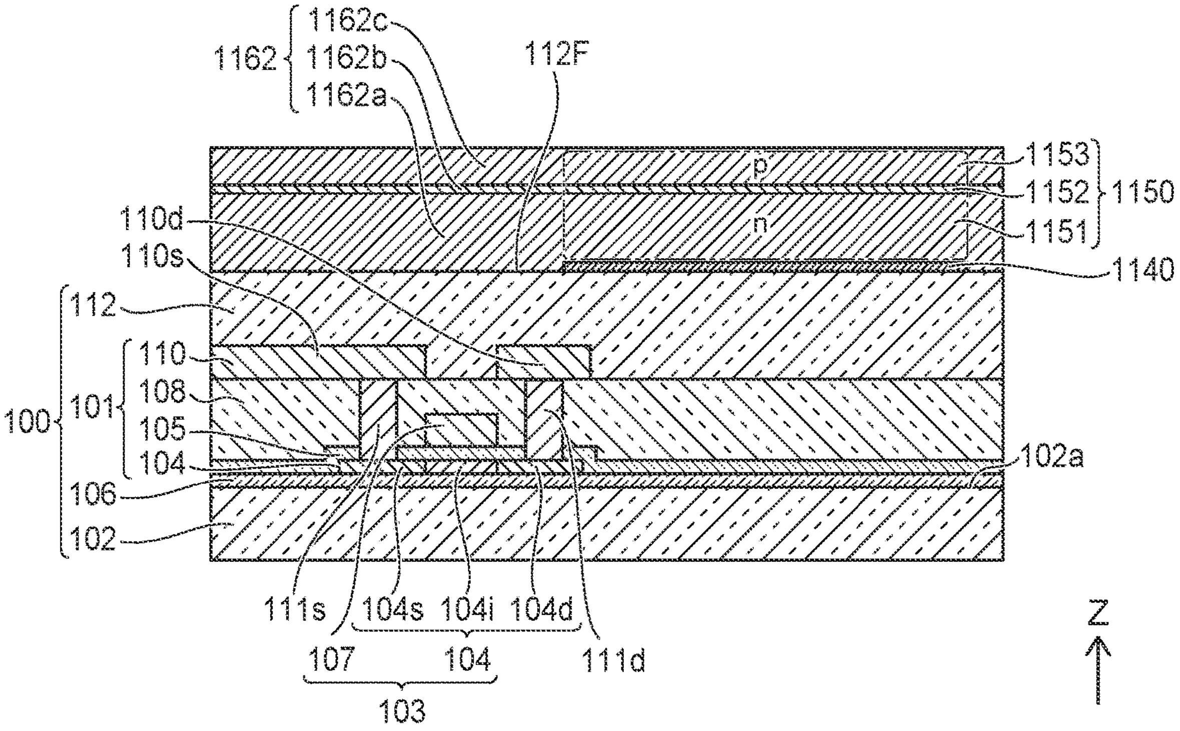
FIG. 7A is a schematic cross-sectional view illustrating a portion of the method for manufacturing the image display device of the first embodiment.

As shown in FIG. 7A, the semiconductor layer 1150 is formed over the graphene layer 1140. The semiconductor layer 1150 includes an n-type semiconductor layer 1151, a light-emitting layer 1152, and a p-type semiconductor layer 1153 formed in this order from the graphene layer 1140 side in the positive direction of the Z-axis. The semiconductor layer 1150 includes, for example, GaN, and more specifically, $In_XAl_YGa_{1-X-Y}N$ ($0 \leq X$, $0 \leq Y$, and $X+Y<1$), etc. In the initial growth of the semiconductor layer 1150, crystal defects caused by crystal lattice mismatch easily occur, and crystals having GaN as a major component generally have n-type semiconductor characteristics. Therefore, the yield can be increased by growing the semiconductor layer 1150 from the n-type semiconductor layer 1151 on the graphene layer 1140.

To form the semiconductor layer 1150, physical vapor deposition such as vapor deposition, ion beam deposition, molecular beam epitaxy (MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the graphene layer 1140 in low-temperature sputtering at a low temperature of about 400° C. to about 700° C. (see Non-Patent Literature 1 and 2, etc.). For example, the drive circuit substrate 100 is formed on a vitreous substrate 102, and such low-temperature sputtering is self-aligning when forming the semiconductor layer 1150 on the drive circuit substrate 100.

By using appropriate film formation technology, the GaN semiconductor layer 1150 is grown on the graphene layer 1140, and the semiconductor layer 1150 that is monocrystallized and includes the light-emitting layer 1152 is thereby formed on the graphene layer 1140. The semiconductor layer 1150 is formed inside the region shown by the double dot-dash line of FIG. 7A.

There are cases where an amorphous deposit 1162 that includes materials of the growth species such as Ga is deposited on the planarized surface 112F at which the graphene layer 1140 does not exist in the growth process of the semiconductor layer 1150. In the example, the deposit

1162 includes deposits 1162*a*, 1162*b*, and 1162*c* stacked in this order from the planarized surface 112F in the positive direction of the Z-axis. The deposit 1162*a* is deposited when forming the n-type semiconductor layer 1151, the deposit 1162*b* is deposited when forming the light-emitting layer 1152, and the deposit 1162*c* is deposited when forming the p-type semiconductor layer 1153; however, the configuration is not limited thereto.

The semiconductor layer 1150 is not limited to being directly formed on the graphene layer 1140 and may be formed on a buffer layer formed on the graphene layer 1140. There are cases where the GaN crystal growth can be promoted by providing a buffer layer. The buffer layer may be an insulating material, a metal material, etc., and may be any type of material as long as the buffer layer can be formed sufficiently thin enough that transmissivity to light is not lost and the material promotes GaN crystal growth.

Figure 7B:
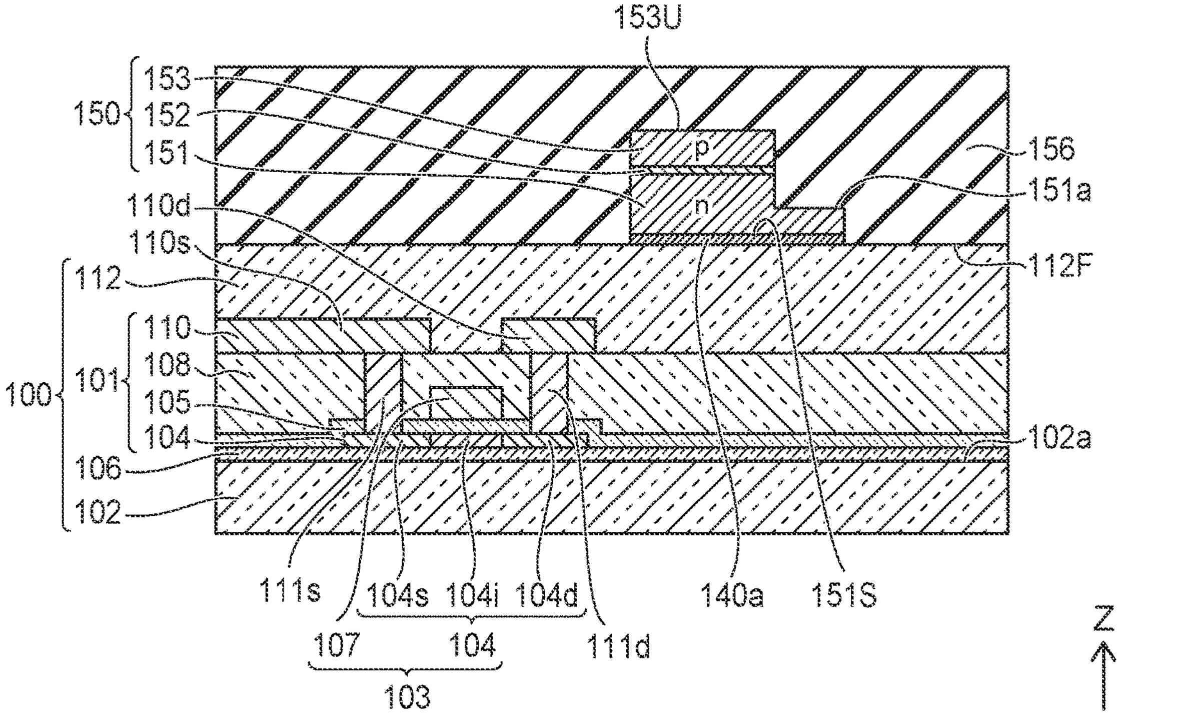
FIG. 7B is a schematic cross-sectional view illustrating a portion of the method for manufacturing the image display device of the first embodiment.

As shown in FIG. 7B, the light-emitting element 150 is formed by patterning the semiconductor layer 1150 shown in FIG. 7A by etching.

In the formation process of the light-emitting element 150, the connection part 151*a* is formed, and then the other parts are formed by further etching. The light-emitting element 150 that includes the connection part 151*a* protruding in the positive direction of the X-axis from the n-type semiconductor layer 151 over the planarized surface 112F can be formed thereby. For example, a dry etching process is used to form the light-emitting element 150, and it is favorable to use anisotropic plasma etching (Reactive Ion Etching (RIE)).

The graphene layer 1140 shown in FIG. 7A is shaped into the graphene sheet 140*a* by over etching when forming the light-emitting element 150. Therefore, the outer perimeter of the graphene sheet 140*a* when projected onto the XY plane substantially matches the outer perimeter of the light-emitting element 150 when projected onto the XY plane.

The second inter-layer insulating film (the second insulating film) 156 is formed to cover the planarized surface 112F, the graphene sheet 140*a*, and the light-emitting element 150.

Figure 8:
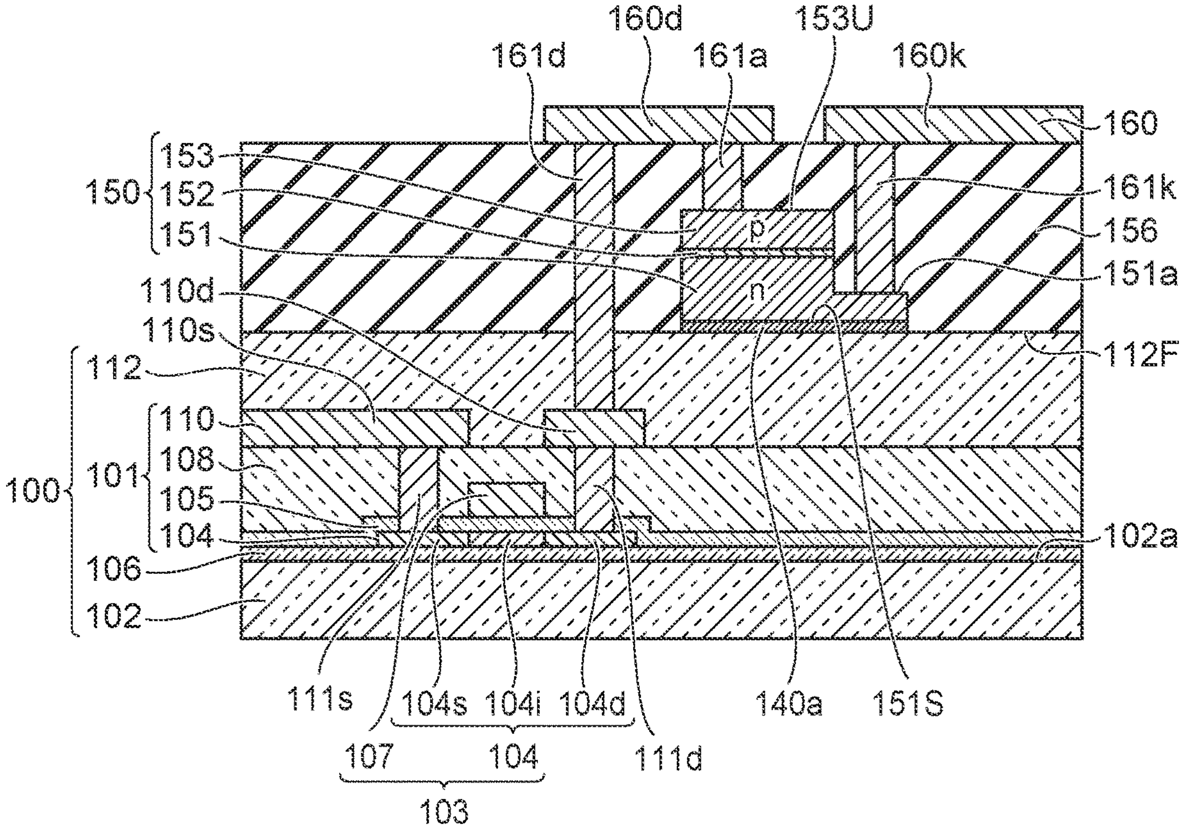
FIG. 8 is a schematic cross-sectional view illustrating a portion of the method for manufacturing the image display device of the first embodiment.

As shown in FIG. 8, a via hole that extends through the second and first inter-layer insulating films 156 and 112 and reaches the wiring part 110*d* is filled with a conductive material to form the via 161*d* (the first via). A via hole that extends through the second inter-layer insulating film 156 and reaches the connection part 151*a* is filled with a conductive material to form the via (the second via) 161*k*. A contact hole that is formed to reach the top surface 153U is filled with a conductive material to form the connection member 161*a*. For example, RIE or the like is used to form the via holes and the contact holes.

The second wiring layer 160 that includes the wiring parts 160*d* and 160*k* is formed on the second inter-layer insulating film 156. The wiring part 160*d* is connected to the connection member 161*a* and one end of the via 161*d*. The wiring part 160*k* is connected to one end of the via 161*k*. The second wiring layer 160 may be formed simultaneously with the formation of the vias 161*k* and 161*d* and the connection member 161*a*. Thus, the wiring part 160*d* and the wiring part 110*d* are electrically connected by the via 161*d*, and the wiring part 160*k* and the connection part 151*a* are electrically connected by the via 161*k*.

A formation process of a color filter will now be described.

FIGS. 9A to 9D are schematic cross-sectional views illustrating a portion of the method for manufacturing the image display device of the embodiment.

FIGS. 9A to 9D show a method for forming a color filter by inkjet printing.

Figure 9A:
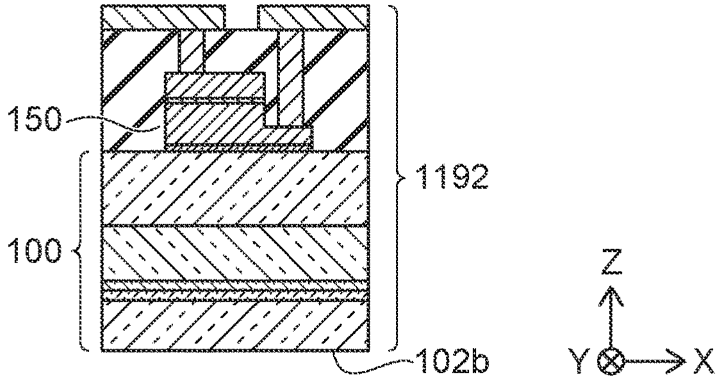
FIG. 9A is a schematic cross-sectional view illustrating a portion of the method for manufacturing the image display device of the first embodiment.

A structure body 1192 is prepared as shown in FIG. 9A. In addition to the drive circuit substrate 100 and the light-emitting element 150, the structure body 1192 includes the second inter-layer insulating film 156, the second wiring layer 160, the vias 161*d* and 161*k*, and the connection member 161*a* shown in FIG. 8.

Figure 9B:
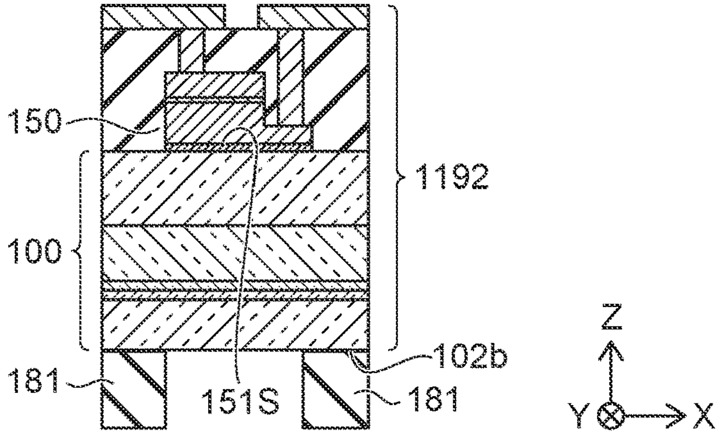
FIG. 9B is a schematic cross-sectional view illustrating a portion of the method for manufacturing the image display device of the first embodiment.

As shown in FIG. 9B, the light-shielding part 181 is formed in the region on the surface 102*b* that does not include the outer perimeter of the light-emitting surface 151S when projected onto the XY plane. For example, the light-shielding part 181 is formed using screen printing, photolithography technology, etc.

Figure 9C:
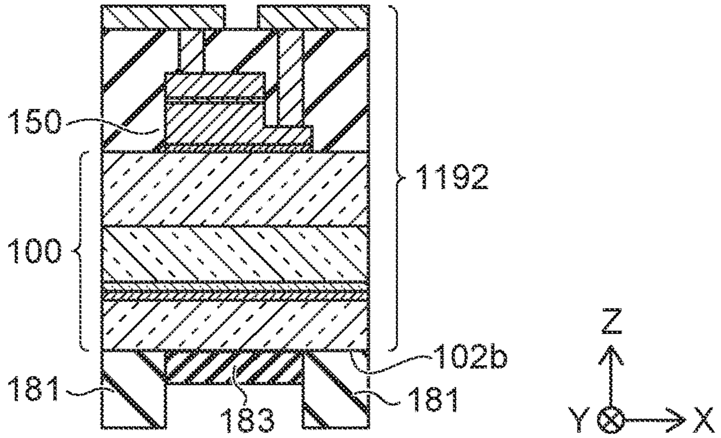
FIG. 9C is a schematic cross-sectional view illustrating a portion of the method for manufacturing the image display device of the first embodiment.

As shown in FIG. 9C, the color conversion layer 183 is formed by dispensing a fluorescer that corresponds to the light emission color from an inkjet nozzle. The fluorescer that is used to form the color conversion layer 183 is dispensed onto the surface 102*b*. The fluorescer also colors the region on the surface 102*b* between the light-shielding part 181.

The fluorescer includes, for example, a fluorescent coating that uses a general fluorescer material, a perovskite fluorescer material, and a quantum dot fluorescer material. It is favorable to use a perovskite fluorescer material or a quantum dot fluorescer material because the light emission colors can be realized with high monochromaticity and high color reproducibility.

After printing by squirting from the inkjet nozzle, drying processing is performed using an appropriate temperature and time.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable to set the dispensed amount of the blue fluorescer to completely fill the region formed by the light-shielding part 181.

Figure 9D:
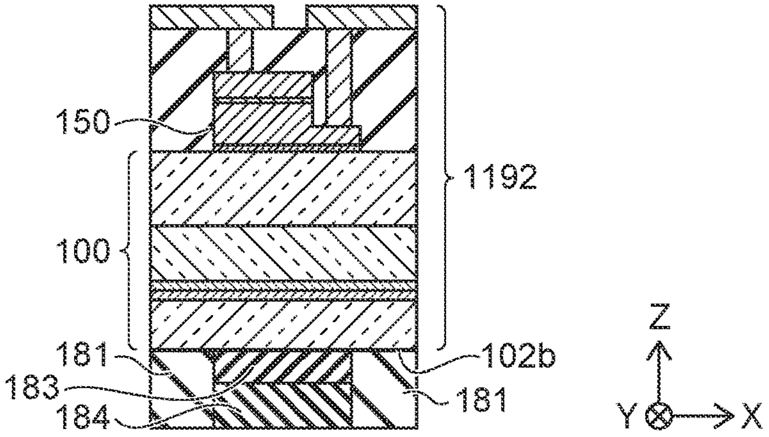
FIG. 9D is a schematic cross-sectional view illustrating a portion of the method for manufacturing the image display device of the first embodiment.

As shown in FIG. 9D, the coating for the filter layer 184 is dispensed from the inkjet nozzle. The coating is applied to overlap the coating of the fluorescer. The dispensed amount is set to completely fill the region formed by the light-shielding part 181.

After the color filter 180 is formed, the structure body 1192 is diced together with the color filter 180 to form the image display device. The formation process of the color filter 180 may be performed after dicing the structure body 1192.

Figure 10:
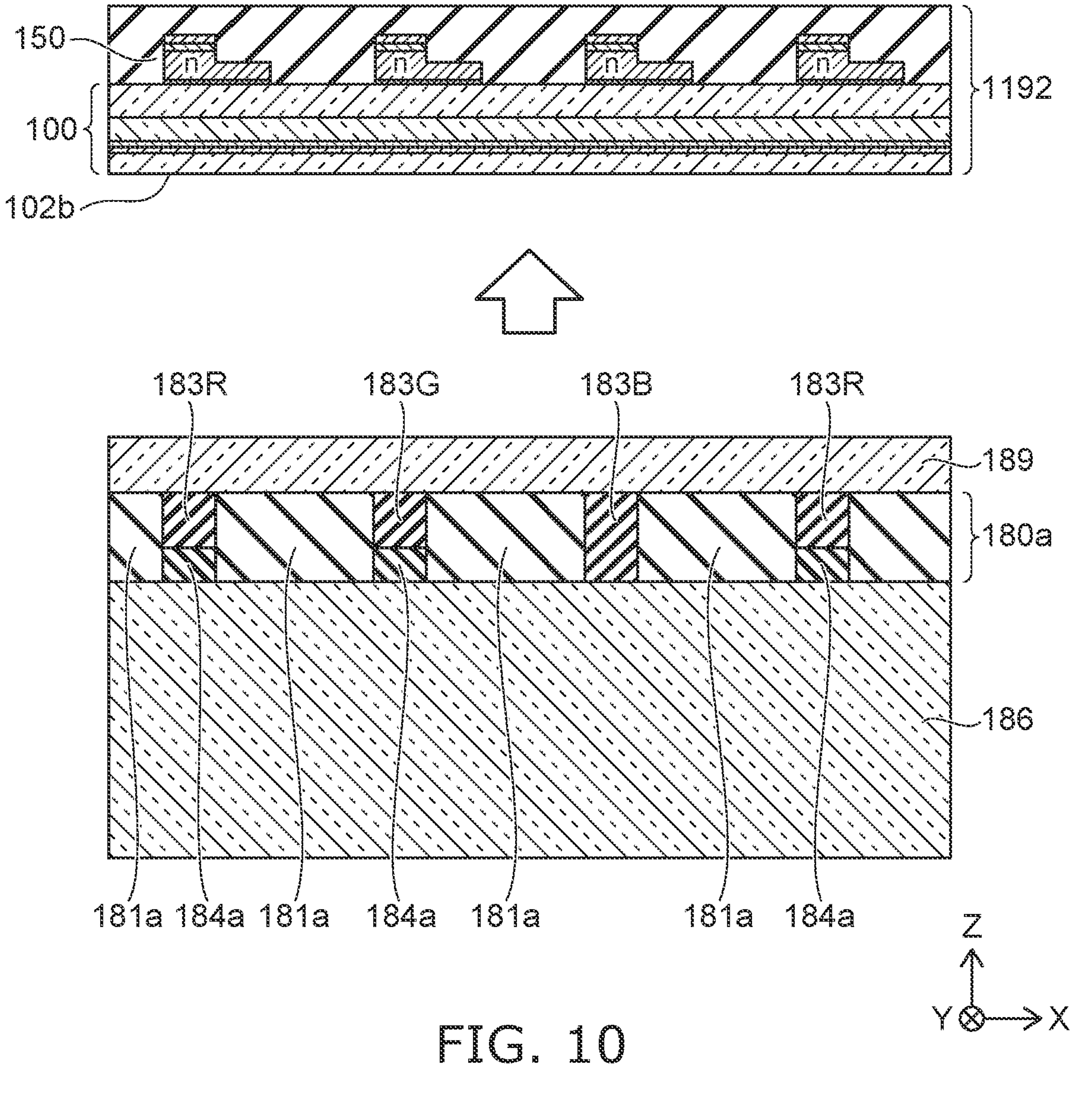
FIG. 10 is a schematic cross-sectional view illustrating a portion of a modification of the method for manufacturing the image display device of the first embodiment.

FIG. 10 is a schematic cross-sectional view illustrating a portion of a modification of the method for manufacturing the image display device of the embodiment.

FIG. 10 shows a method of forming a film-type color filter 180*a*.

The drawing above the arrow in FIG. 10 shows the structure body 1192. The drawing below the arrow shows a glass substrate 186, the color filter 180*a* bonded to the glass substrate 186, and a transparent thin film adhesive layer 189 that bonds the color filter 180*a* to the structure body 1192. The arrow illustrates how the color filter 180*a* is adhered, together with the glass substrate 186 and the transparent thin film adhesive layer 189, to the structure body 1192.

To avoid complexity in FIG. 10, the components and/or their reference numerals are not illustrated for some of the components of the structure body 1192. The components inside the structure body 1192 that are not illustrated in FIG. 10 are shown in FIG. 8. The components shown in FIG. 8 are the components of the circuit 101 inside the drive circuit substrate 100, the vias 161*d* and 161*k*, and the second wiring layer 160.

As shown in FIG. 10, the color filter 180*a* includes a light-shielding part 181*a*, color conversion layers 183R, 183G, and 183B, and a filter layer 184*a*. The light-shielding part 181*a* has a function similar to that of the light-shielding part 181 when an inkjet technique is used. The color conversion layers 183R, 183G, and 183B are formed to have functions and materials similar to those of the color conversion layer 183 when an inkjet technique is used. The color conversion layer 183R is a conversion layer outputting red light. The color conversion layer 183G is a conversion layer outputting green light. The color conversion layer 183B is a conversion layer outputting blue light. The filter layer 184*a* is formed to have functions and materials similar to those of the filter layer 184 when an inkjet technique is used.

The color filter 180*a* is bonded to the structure body 1192 at one surface. The other surface of the color filter 180*a* is bonded to the glass substrate 186. The transparent thin film adhesive layer 189 is located at the one surface of the color filter 180*a*, and the one surface of the color filter 180*a* is bonded to the surface 102*b* of the structure body 1192 via the transparent thin film adhesive layer 189.

In the subpixel that uses the film-type color filter 180*a*, the transparent thin film adhesive layer 189 is formed between the substrate 102 and the color filter 180*a* by the procedure described above.

In the case of the image display device of the modification shown in FIG. 2, the color filter is formed as follows.

Figure 11:
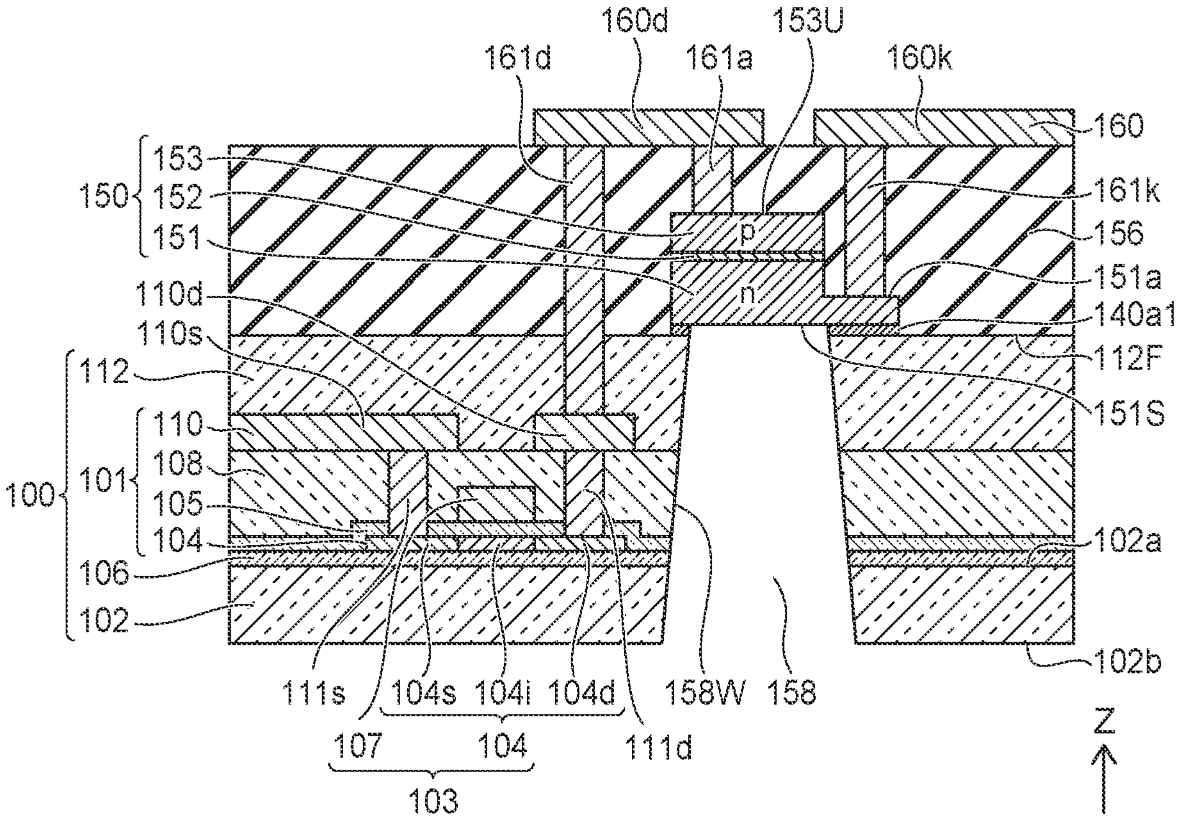
FIG. 11 is a schematic cross-sectional view illustrating a portion of a method for manufacturing an image display device of a modification of the first embodiment.

FIG. 11 is a schematic cross-sectional view illustrating a method for manufacturing the image display device of the modification.

According to the modification, the process described with reference to FIG. 11 is performed before performing the process of forming the color filter. The process of FIG. 11 continues from the process described with reference to FIG. 8.

An opening 158 is formed as shown in FIG. 11. The opening 158 is formed from the surface 102*b* of the substrate 102 to expose the light-emitting surface 151S. More specifically, the opening 158 is formed by sequentially removing portions of the substrate 102, the TFT underlying film 106, the insulating layer 105, the insulating film 108, the first inter-layer insulating film 112, and the graphene sheet 140*a* shown in FIG. 8. The opening 158 is formed by wet etching using a solvent corresponding to the material, etc.

Subsequently, a color filter is formed by inkjet printing by the method described with reference to FIGS. 9A to 9D. In the formation process of the color conversion layer 183, the fluorescer is dispensed to fill the opening 158, and the fluorescer is formed to cover the light-emitting surface 151S and the wall surface 158W of the opening 158. The fluorescer also is dispensed between the light-shielding part 181. The filter layer 184 is formed to fill between the light-shielding part 181.

When forming a film-type color filter, for example, the opening 158 shown in FIG. 11 is filled with a transparent resin. Subsequently, a color filter can be formed by adhering the color filter to the exposed surface of the transparent resin filled into the opening 158 and onto the surface 102*b* of the substrate 102 via the transparent thin film adhesive layer 189 shown in FIG. 10.

It is desirable to make the color conversion layer 183 as thick as possible to increase the color conversion efficiency for both the color filter 180 formed by inkjet printing and the film-type color filter 180*a*. On the other hand, when the color conversion layer 183 is too thick, the light emitted by the color conversion approximates Lambertian, but the blue light that is not color-converted has an emission angle limited by the light-shielding part 181. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

FIG. 12 is a schematic perspective view illustrating the image display device according to the embodiment.

In the image display device of the embodiment as shown in FIG. 12, the drive circuit substrate 100 in which the circuit 101 including the transistor is formed is located on the color filter 180, and a light-emitting circuit part 172 that includes many light-emitting elements 150 is located on the planarized surface 112F. In addition to the light-emitting element 150, the light-emitting circuit part 172 includes the graphene sheet 140*a*, the second inter-layer insulating film 156, and the second wiring layer 160 shown in FIG. 1. The drive circuit substrate 100 and the light-emitting circuit part 172 are electrically connected by the vias 161*d* and 161*k* shown in FIG. 1.

Modification 2

FIG. 13 is a schematic perspective view illustrating an image display device according to a modification of the embodiment.

According to the embodiment shown in FIG. 1 and the modification shown in FIG. 2, the image display device can be formed without providing the color filters 180 and 180*a*, and a monochromatic light-emitting image display device can be made as in the example.

In the image display device of the modification as shown in FIG. 13, the light-emitting circuit part 172 that includes many light-emitting elements 150 is located on the planarized surface 112F of the drive circuit substrate 100.

The modification also is applicable to other embodiments and their modifications described below.

Effects of the image display device of the embodiment will now be described.

According to the method for manufacturing the image display device of the embodiment, the semiconductor layer 1150 that is formed by crystal growth on the planarized surface 112F of the drive circuit substrate 100 is etched to form the light-emitting element 150. Subsequently, the light-emitting element 150 is covered with the second inter-layer insulating film 156 and electrically connected with the circuit 101 made inside the drive circuit substrate 100. Therefore, the manufacturing processes are markedly reduced compared to when singulated light-emitting elements are individually transferred to the substrate 102.

According to the method for manufacturing the image display device 1 of the embodiment, the graphene layer 1140 that is formed on the planarized surface 112F can be used as a seed for the crystal growth of the semiconductor layer 1150. Sufficiently high productivity can be realized because the graphene layer 1140 can be easily formed at the planarized surface 112F.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable; however, the method for manufacturing the image display device of the embodiment provides the following effects.

According to the method for manufacturing the image display device of the embodiment, the transfer process of the light-emitting elements 150 can be reduced because the light-emitting elements 150 are formed after forming the entire semiconductor layer 1150 on the graphene layer 1140 formed on the planarized surface 112F. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the graphene layer 1140, the light-emitting element 150 can be provided with self-alignment by appropriately cutting the graphene layer 1140 and adhering on the planarized surface 112F. This is favorable for a higher-definition display because alignment of the light-emitting element on the drive circuit substrate 100 is unnecessary, and it is easy to reduce the size of the light-emitting element 150.

According to the embodiment, the light-emitting element is formed directly by etching, etc., on the drive circuit substrate 100 in which the circuit 101 is already embedded, and then the light-emitting element 150 and the circuit 101 in a lower layer than the light-emitting element 150 are electrically connected by via formation, etc. Therefore, a uniform connection structure can be realized, and the reduction of the yield can be suppressed.

The drive circuit substrate 100 can include a drive circuit, a scanning circuit, and the like including TFTs, etc. A LTPS process or the like is advantageous in that existing manufacturing processes and plants of flat panel displays can be utilized, and the circuit 101 that is included in the drive circuit substrate 100 can be made in a light-transmitting substrate such as a glass substrate, etc.

In the image display device of the embodiment, the light-emitting element 150 is stacked on the drive circuit substrate 100, and there are cases where the optical path from the light-emitting surface 151S to the outside is long. The optical path of the light emitted from the light-emitting element 150 includes the distance from the light-emitting surface 151S to the surface 102*b*. There are cases where this distance is about 1 μm to about several μm. That is, the light that is output from the light-emitting surface 151S is radiated externally via the optical path of about 1 μm to about several μm. Therefore, the light that is output from the light-emitting surface 151S is attenuated more than when directly radiated externally according to the length of the optical path. According to the modification shown in FIG. 2, the optical path is filled with the color conversion layer 183, and the intensity of the light emitted outside is attenuated according to the absorptance for the light by the fluorescer included in the color conversion layer 183.

Other than the light-emitting surface 151S, the light-emitting element 150 is covered with the second inter-layer insulating film 156. By forming the second inter-layer insulating film 156 of a material having high light reflectivity such as a white resin, etc., the sideward-scattered light and the like of the light-emitting element 150 can be reflected so that the sideward-scattered light and the like do not leak at the side of the light-emitting element 150.

Thus, in the image display device of the embodiment, the light-emitting element 150 is covered with the second inter-layer insulating film 156, and the light that travels in directions other than the light-emitting surface 151S can be confined inside the light-emitting element 150. The light that is confined inside the light-emitting element 150 is reflected at the interface between the light-emitting element 150 and the second inter-layer insulating film 156, and a portion of the light is guided toward the light-emitting surface 151S side. Accordingly, the substantial luminous efficiency of the light-emitting element 150 can be increased, and light of sufficient intensity can be radiated externally even when the intensity of the light is attenuated by the optical absorptance of the fluorescer and/or the long optical path until being radiated externally from the light-emitting surface 151S.

According to the modification shown in FIG. 2, when the first inter-layer insulating film 112 and the insulating film 108 are formed of a light-reflective material such as a white resin, etc., light leakage can be further prevented, and the attenuation of the intensity of the emitted light can be more effectively suppressed.

Second Embodiment

Figure 14:
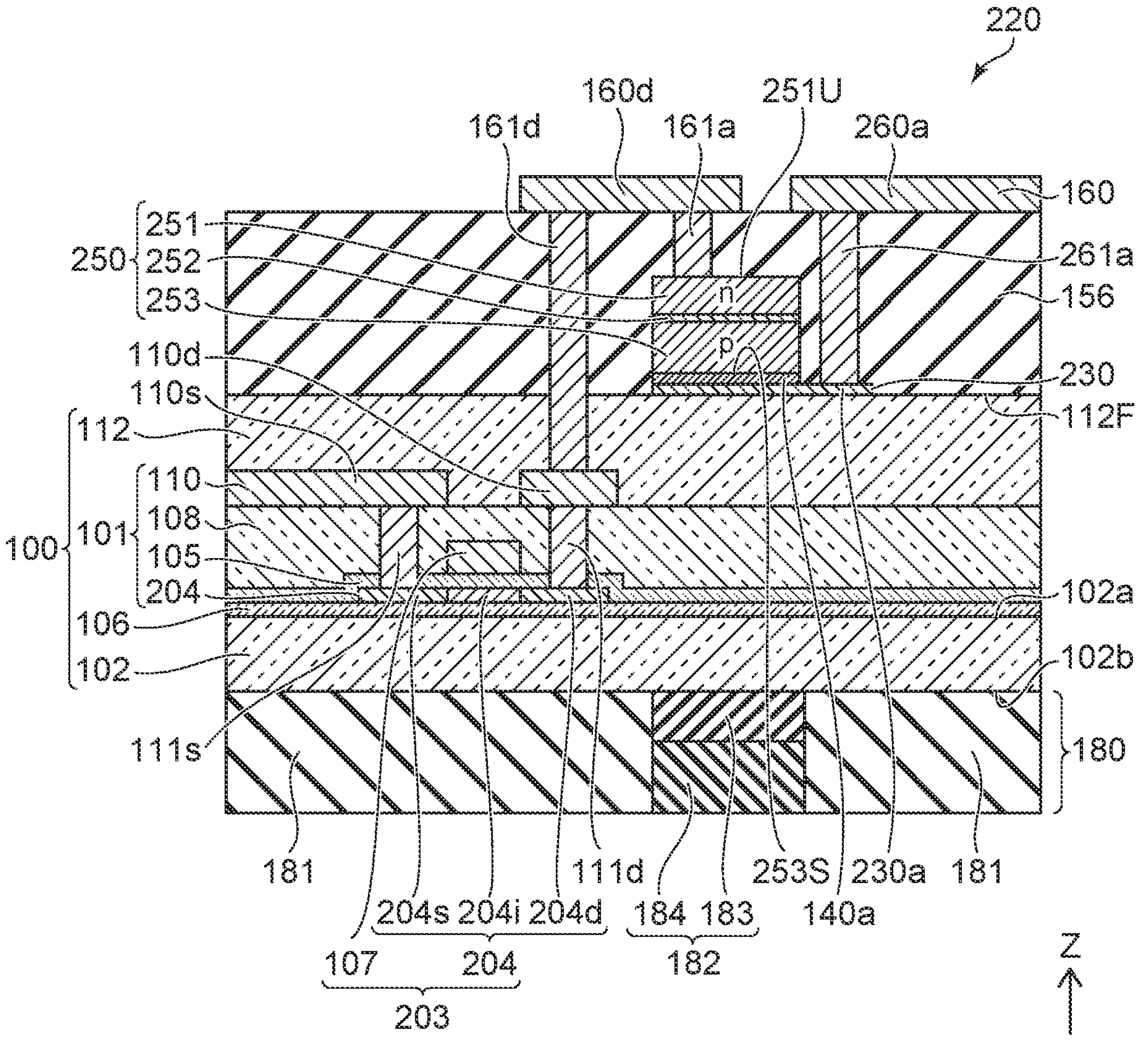
FIG. 14 is a schematic cross-sectional view illustrating a portion of an image display device according to a second embodiment.

FIG. 14 is a schematic cross-sectional view illustrating a portion of an image display device according to the embodiment.

According to the embodiment, the configurations of a light-emitting element 250 and a transistor 203 are different from those of the other embodiments described above. Specifically, a light-emitting surface 253S is provided by a p-type semiconductor layer 253, and the transistor 203 has an n-channel. The embodiment also differs from the other embodiments described above in that the p-type semiconductor layer 253 and a via 261*a* are connected by a third wiring layer 230. The same components as those of the other embodiments are marked with the same reference numerals, and a detailed description is omitted as appropriate.

As shown in FIG. 14, the image display device of the embodiment includes a subpixel 220. The subpixel 220 includes the substrate 102, the third wiring layer 230, the graphene sheet 140*a*, the transistor 203, the first wiring layer 110, the first inter-layer insulating film 112, the light-emitting element 250, the second inter-layer insulating film 156, the via 161*d*, and the second wiring layer 160. The subpixel 220 further includes the color filter 180.

According to the embodiment, similarly to the other embodiments described above, the circuit 101 that includes the transistor 203 is located on the one surface 102*a* of the substrate 102. The color filter 180 is located at the other surface 102*b* of the substrate 102. The configuration of the color filter 180 is the same as that of the other embodiments described above, and a detailed description is omitted.

The transistor 203 is located on the TFT underlying film 106. The transistor 203 is an n-channel TFT. The transistor 203 includes the TFT channel 204 and the gate 107. Similarly to the other embodiments described above, the transistor 203 is favorably formed by a LTPS process, etc. According to the embodiment, the circuit 101 includes the TFT channel 204, the insulating layer 105, the insulating film 108, the vias 111*s* and 111*d*, and the first wiring layer 110.

The TFT channel 204 includes regions 204*s*, 204*i*, and 204*d*. The regions 204*s*, 204*i*, and 204*d* are located on the TFT underlying film 106. The regions 204*s* and 204*d* are doped with an impurity such as phosphorus (P) or the like and activated to form n-type semiconductor regions. The region 204*s* has an ohmic connection with the via 111*s*. The region 204*d* has an ohmic connection with the via 111*d*.

The gate 107 is located on the TFT channel 204 with the insulating layer 105 interposed. The insulating layer 105 insulates the TFT channel 204 and the gate 107.

In the transistor 203, a channel is formed in the region 204*i* when a higher voltage than that of the region 204*s* is applied to the gate 107. The current that flows between the regions 204*s* and 204*d* is controlled by the voltage of the gate 107 with respect to the region 204*s*. The TFT channel 204 and the gate 107 are formed using materials and formation methods similar to those of the TFT channel 104 and the gate 107 according to the other embodiments described above.

The first wiring layer 110 includes the wiring parts 110*s* and 110*d*. For example, the wiring part 110*s* is connected to the ground line 4 shown in FIG. 15 below.

The vias 111*s* and 111*d* extend through the insulating film 108. The via 111*s* is located between the wiring part 110*s* and the region 204*s*. The via 111*s* electrically connects the wiring part 110*s* and the region 204*s*. The via 111*d* is located between the wiring part 110*d* and the region 204*d*. The via 111*d* electrically connects the wiring part 110*d* and the region 204*d*. The vias 111*s* and 111*d* are formed using materials and formation methods similar to those of the other embodiments described above.

The third wiring layer 230 is located on the planarized surface 112F. The third wiring layer 230 includes multiple wiring parts 230*a* that can have different potentials. The multiple wiring parts 230*a* are provided respectively for the light-emitting elements 250. The light-emitting element 250 is located on the wiring part 230*a* with the graphene sheet 140*a* interposed. The electrical resistance in the thickness direction is sufficiently small because the graphene sheet 140*a* is sufficiently thin. Accordingly, the light-emitting surface 253S is electrically connected to the wiring part 230*a* via the graphene sheet 140*a*.

The third wiring layer 230 that includes the wiring part 230*a* is formed of a light-transmitting conductive film and is formed of, for example, an ITO film or a ZnO film. The graphene sheet 140*a* also is formed thin enough to be sufficiently light-transmissive, and the light that is emitted from the light-emitting element 250 passes through the graphene sheet 140*a* and the wiring part 230*a*.

When projected onto the XY plane, the outer perimeter of the wiring part 230*a* is set to include the outer perimeter of the light-emitting element 250 when the light-emitting element 250 is projected onto the wiring part 230*a*. That is, the outer perimeter of the light-emitting element 250 is located within the outer perimeter of the wiring part 230*a* when projected onto the XY plane. The contact area between the wiring part 230*a* and the light-emitting surface 253S can be ensured thereby, and an increase of the contact resistance between the wiring part 230*a* and the light-emitting surface 253S can be suppressed. The wiring part 230*a* is provided to protrude in one direction over the planarized surface 112F. One end of the via 261*a* is connected to the wiring part 230*a*, and the light-emitting element 250 is electrically connected to the via 261*a* by the graphene sheet 140*a* and the wiring part 230*a*.

The light-emitting element 250 includes a top surface 251U located at the side opposite to the light-emitting surface 253S. Similarly to the other embodiments described above, the light-emitting element 250 is a prismatic or cylindrical element.

The light-emitting element 250 includes the p-type semiconductor layer 253, a light-emitting layer 252, and an n-type semiconductor layer 251. The p-type semiconductor layer 253, the light-emitting layer 252, and the n-type semiconductor layer 251 are stacked in this order from the light-emitting surface 253S toward the top surface 251U. According to the embodiment, the light-emitting surface 253S is provided by the p-type semiconductor layer 253, and the top surface 251U is provided by the n-type semiconductor layer 251.

The light-emitting element 250 has a shape similar to that of the light-emitting element 150 of the other embodiments described above when projected onto the XY plane. An appropriate shape of the light-emitting element 250 is selected according to the layout of the other circuit elements, etc.

Similarly to the light-emitting element 150 of the other embodiments described above, the light-emitting element 250 is a so-called light-emitting diode.

The second wiring layer 160 is located on the second inter-layer insulating film 156. The second wiring layer 160 includes the wiring parts 160*d* and 260*a*. Similarly to the other embodiments described above, a portion of the wiring part 160*d* is located above the light-emitting element 250, and another portion is located above the wiring part 110*d*. A portion of the wiring part 260*a* is located above the wiring part 230*a*. For example, the wiring part 260*a* is connected to the power supply line 3 of the circuit of FIG. 15 below.

Similarly to the other embodiments described above, the via 161*d* is included. Specifically, the via 161*d* extends through the second and first inter-layer insulating films 156 and 112 and reach the wiring part 110*d*. The via 161*d* is located between the wiring part 160*d* and the wiring part 110*d* and electrically connects the wiring part 160*d* and the wiring part 110*d*. The connection member 161*a* is located between the wiring part 160*d* and the top surface 251U, and the wiring part 160*d* is electrically connected with the top surface 251U by the connection member 161*a*. Accordingly, the n-type semiconductor layer 251 is electrically connected to the drain region of the transistor 203 via the connection member 161*a*, the wiring part 160*d*, the via 161*d*, the wiring part 110*d*, and the via 111*d*.

The via (the second via) 261*a* extends through the second inter-layer insulating film 156 and reach the wiring part 230*a*. The via 261*a* is located between the wiring part (the second wiring part) 260*a* and the wiring part 230*a* and electrically connects the wiring part 260*a* and the wiring part 230*a*. Accordingly, for example, the p-type semiconductor layer 253 is electrically connected to the power supply line 3 of the circuit of FIG. 15 via the wiring part 230*a*, the via 261*a*, and the wiring part 260*a*.

Figure 15:
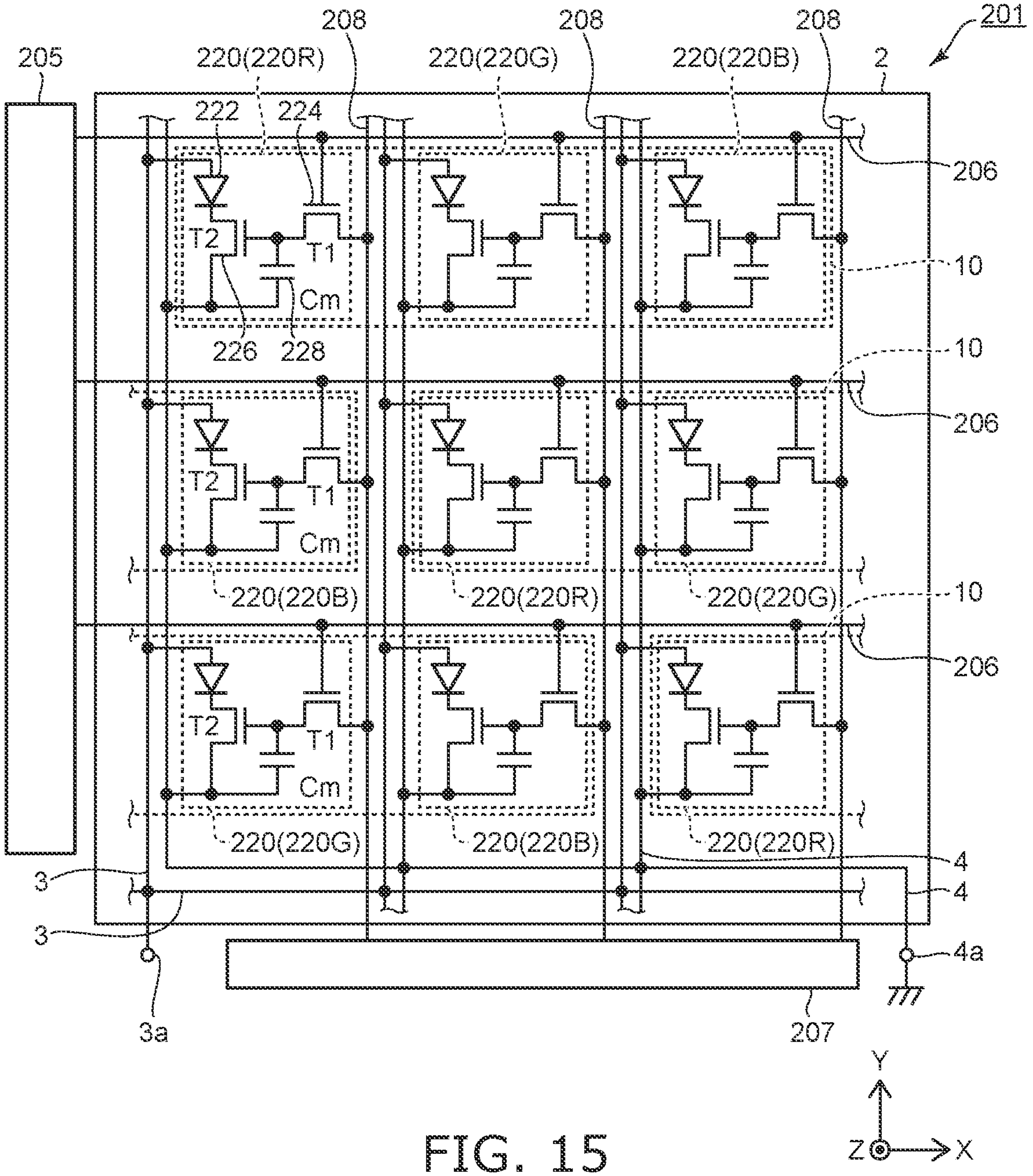
FIG. 15 is a schematic block diagram illustrating the image display device of the second embodiment.

FIG. 15 is a schematic block diagram illustrating the image display device of the embodiment.

As shown in FIG. 15, the image display device 201 of the embodiment includes the display region 2, a row selection circuit 205, and a signal voltage output circuit 207. In the display region 2, similarly to the other embodiments described above, for example, the subpixels 220 are arranged in a lattice shape in the XY plane.

Similarly to the other embodiments described above, the pixel 10 includes the multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes three subpixels 220R, 220G, and 220B, and, for example, the subpixels 220R, 220G, and 220B are arranged in a straight line along the X-axis as in the example. In each pixel 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 15, the select transistor 224 may be displayed as T1, the drive transistor 226 may be displayed as T2, and the capacitor 228 may be displayed as Cm.

According to the embodiment, the light-emitting element 222 is located at the power supply line 3 side, and the drive transistor 226 that is connected in series to the light-emitting element 222 is located at the ground line 4 side. That is, the drive transistor 226 is connected to a lower potential side than the light-emitting element 222. The drive transistor 226 is an n-channel transistor.

The select transistor 224 is connected between a signal line 208 and the gate electrode of the drive transistor 226. The capacitor 228 is connected between the ground line 4 and the gate electrode of the drive transistor 226.

To drive the drive transistor 226 that is an n-channel transistor, the row selection circuit 205 and the signal voltage output circuit 207 supply, to the signal line 208, a signal voltage that has a different polarity from that of the other embodiments described above.

According to the embodiment, because the polarity of the drive transistor 226 is an n-channel, the polarity of the signal voltage and the like are different from those of the other embodiments described above. Specifically, the row selection circuit 205 supplies a select signal to a scanning line 206 to sequentially select one row from the arrangement of the m rows of subpixels 220. The signal voltage output circuit 207 supplies a signal voltage having an analog voltage value necessary for the subpixels 220 of the selected row. The drive transistors 226 of the subpixels 220 of the selected row allow currents corresponding to the signal voltage to flow in the light-emitting elements 222. The light-emitting elements 222 emit light of luminances corresponding to the currents that flow.

A manufacturing method of the embodiment will now be described.

FIGS. 16A to 18 are schematic cross-sectional views illustrating a portion of the method for manufacturing the image display device of the embodiment.

The substrate 102 according to the other embodiments described above with reference to FIG. 5A is used according to the embodiment. In FIG. 5A, the Si layer 1104 is formed on the substrate 102 with the TFT underlying film 106 interposed. In the following description, the process of FIG. 16A and subsequent processes are applied after the process of FIG. 5A.

Figure 16A:
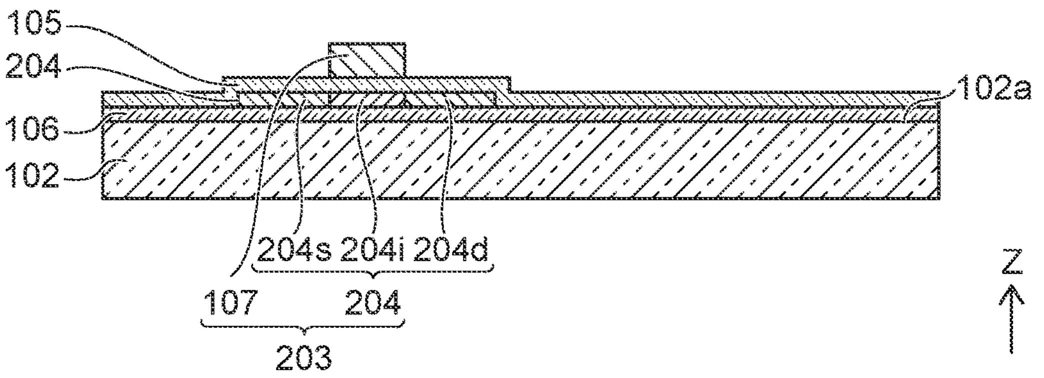
FIG. 16A is a schematic cross-sectional view illustrating a portion of a method for manufacturing the image display device of the second embodiment.

As shown in FIG. 16A, the polycrystallized Si layer 1104 shown in FIG. 5A is patterned into an island configuration to form the TFT channel 204. The insulating layer 105 is formed to cover the TFT underlying film 106 and the TFT channel 204. The insulating layer 105 functions as a gate insulating film. The gate 107 is formed on the TFT channel 204 with the insulating layer 105 interposed. The gate 107 is selectively doped with an impurity such as P or the like and thermally activated to form the transistor (the circuit element) 203. The regions 204*s* and 204*d* are used as n-type active regions and function respectively as the source region and drain region of the transistor 203. The region 204*i* is used as a p-type active region and functions as a channel. Thus, the n-channel TFT is formed.

Figure 16B:
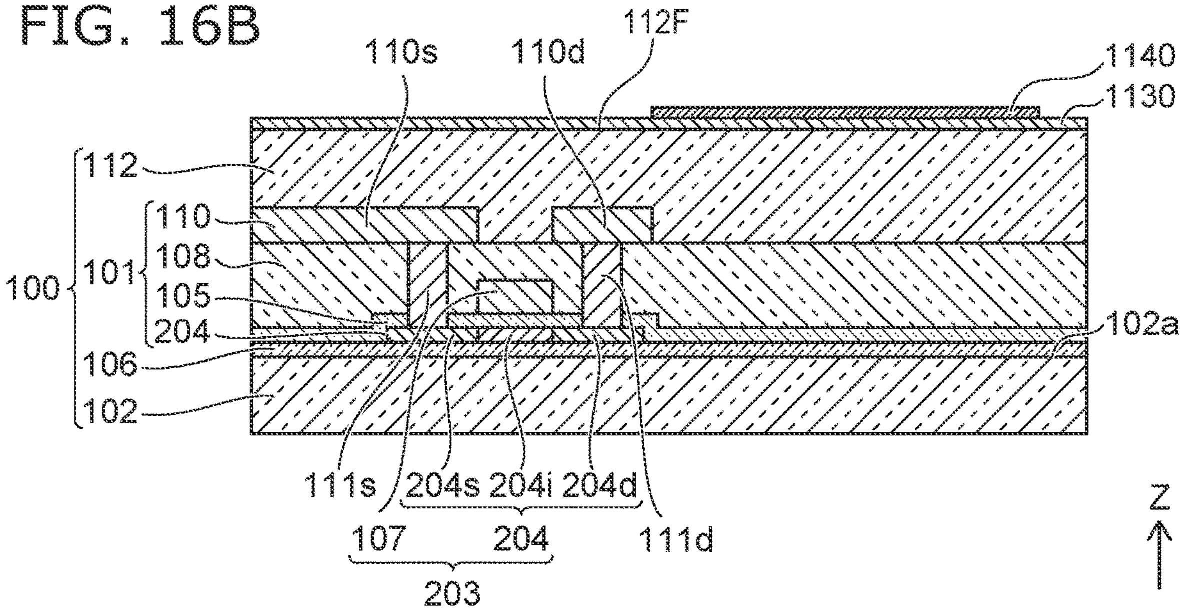
FIG. 16B is a schematic cross-sectional view illustrating a portion of the method for manufacturing the image display device of the second embodiment.

As shown in FIG. 16B, the insulating film 108 is formed to cover the insulating layer 105 and the transistor 203. The vias 111*s* and 111*d* that extend through the insulating film 108 and the insulating layer 105 are formed. The first wiring layer 110 that includes the wiring parts 110*s* and 110*d* is formed on the insulating film 108. The wiring part 110*s* is connected to the via 111*s*, and the wiring part 110*d* is connected to the via 111*d*. The first inter-layer insulating film 112 is formed to cover the insulating film 108 and the first wiring layer 110. Thus, the drive circuit substrate (the first substrate) 100 that includes the p-channel TFT is formed.

A light-transmitting conductive film 1130 is formed on the planarized surface 112F. The graphene layer 1140 is formed at a prescribed position on the light-transmitting conductive film 1130 that is formed.

Figure 17A:
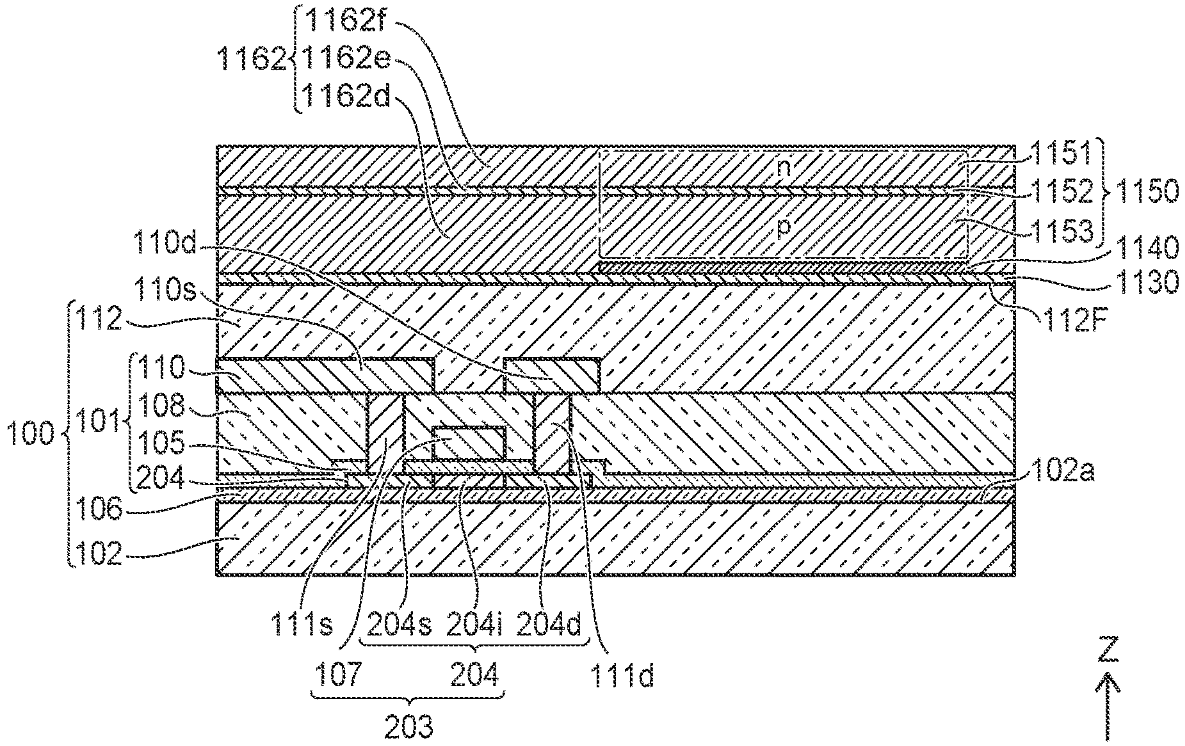
FIG. 17A is a schematic cross-sectional view illustrating a portion of the method for manufacturing the image display device of the second embodiment.

As shown in FIG. 17A, the semiconductor layer 1150 is formed over the graphene layer 1140. The semiconductor layer 1150 includes the p-type semiconductor layer 1153, the light-emitting layer 1152, and the n-type semiconductor layer 1151 formed in this order from the graphene layer 1140 in the positive direction of the Z-axis.

The semiconductor layer 1150 is formed over the graphene layer 1140 inside the double dot-dash line of FIG. 17A. Similarly to the other embodiments described above, there are cases where the amorphous deposit 1162 that includes materials of the growth species such as Ga is deposited on the light-transmitting conductive film 1130 at which the graphene layer 1140 does not exist. In the example, the deposit 1162 includes deposits 1162*d*, 1162*e*, and 1162*f* stacked in this order from the light-transmitting conductive film 1130 in the positive direction of the Z-axis. The deposit 1162*d* is deposited when forming the p-type semiconductor layer 1153, the deposit 1162*e* is deposited when forming the light-emitting layer 1152, and the deposit 1162*f* is deposited when forming the n-type semiconductor layer 1151; however, the configuration is not limited thereto.

Figure 17B:
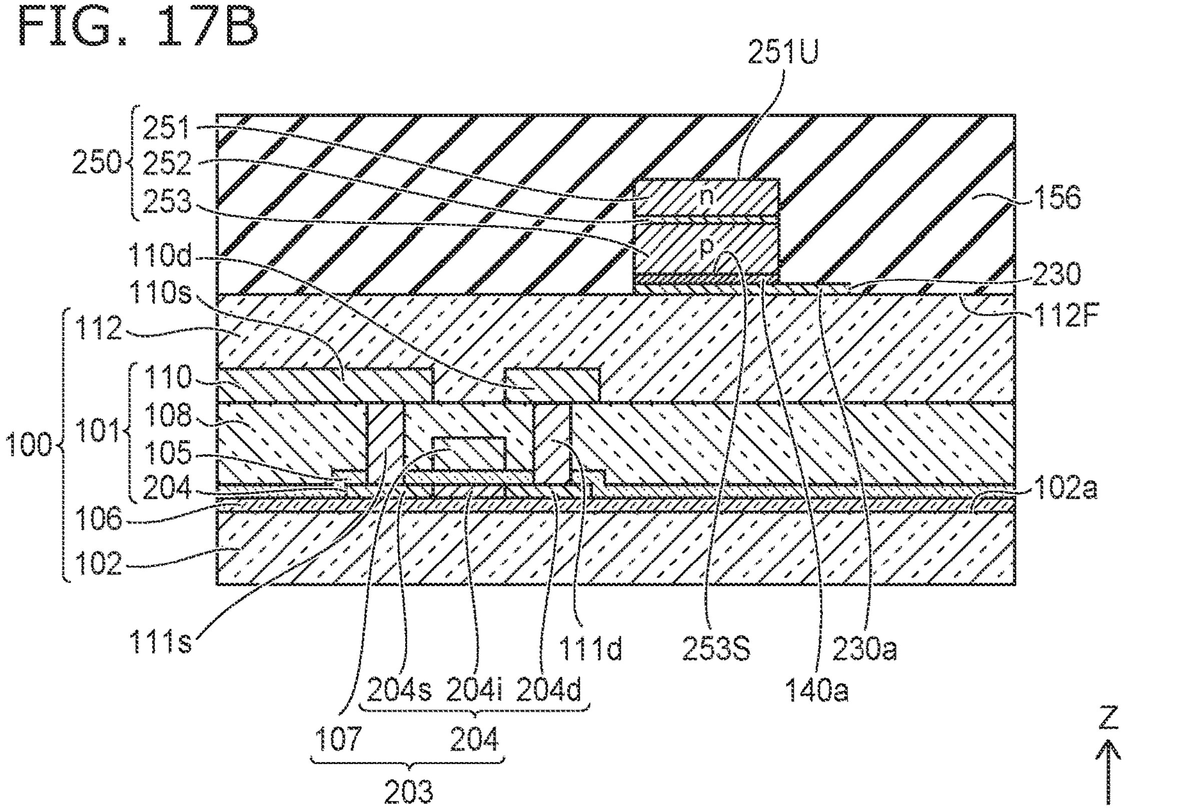
FIG. 17B is a schematic cross-sectional view illustrating a portion of the method for manufacturing the image display device of the second embodiment.

As shown in FIG. 17B, the light-emitting element 250, the graphene sheet 140*a*, and the third wiring layer 230 including the wiring part 230*a* are formed. The semiconductor layer 1150 shown in FIG. 17A is patterned by etching to form the light-emitting element 250. The graphene layer 1140 shown in FIG. 17A is shaped into the graphene sheet 140*a* by over etching when forming the light-emitting element 250. Therefore, the outer perimeter of the graphene sheet 140*a* when projected onto the XY plane substantially matches the outer perimeter of the light-emitting element 250 when projected onto the XY plane.

In the formation process of the third wiring layer 230, the wiring part 230*a* is formed to protrude in one direction from the light-emitting element 250 over the planarized surface 112F. When projected onto the XY plane, the outer perimeter of the wiring part 230*a* is set to include the outer perimeter of the light-emitting element 250 when the light-emitting element 250 is projected onto the wiring part 230*a*. That is, the outer perimeter of the light-emitting element 250 is located within the outer perimeter of the wiring part 230*a* when projected onto the XY plane. The protruding part of the wiring part 230*a* is formed to ensure the region at which one end of the via 261*a* shown in FIG. 18 below is connected. Because the light-emitting surface 253S is connected to the via 261*a* by the wiring part 230*a*, the light-emitting element 250 is shaped to be a single prism or have a circular columnar shape without forming a connection part such as that of the other embodiments described above.

The second inter-layer insulating film 156 is formed after forming the light-emitting element 250, the graphene sheet 140*a*, and the third wiring layer 230. The second inter-layer insulating film 156 is formed to cover the planarized surface 112F, the third wiring layer 230 including the wiring part 230*a*, the graphene sheet 140*a*, and the light-emitting element 250.

Figure 18:
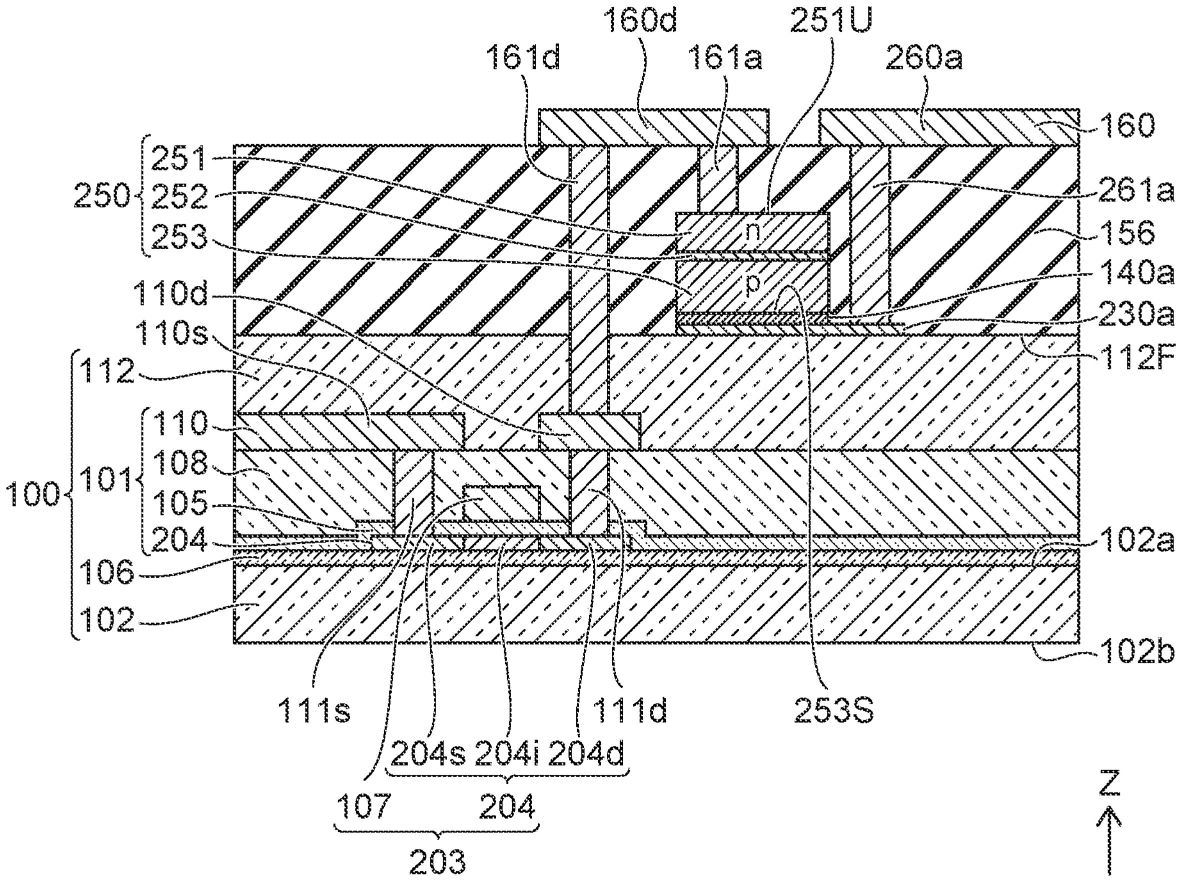
FIG. 18 is a schematic cross-sectional view illustrating a portion of the method for manufacturing the image display device of the second embodiment.

As shown in FIG. 18, a via hole that is formed to extend through the second inter-layer insulating film 156 and reach the wiring part 230*a* is filled with a conductive material to form the via (the second via) 261*a*. The via 161*d* and the connection member 161*a* are formed similarly to those of the other embodiments described above. Specifically, a via hole that is formed to extend through the second and first inter-layer insulating films 156 and 112 and reach the wiring part 110*d* is filled with a conductive material to form the via 161*d*. A contact hole that is formed to reach the top surface 251U is filled with a conductive material to form the connection member 161*a*. Similarly to the other embodiments described above, for example, RIE or the like is used to form the via holes and the contact holes.

Subsequently, the second wiring layer 160 is formed on the second inter-layer insulating film 156, the wiring part 160*d* is connected to the via 161*d* and the connection member 161*a*, and the wiring part 260*a* is connected to the via 261*a*.

Subsequently, a color filter is formed at the exposed surface 102*b* of the substrate 102 similarly to the other embodiments described above, and the subpixel 220 is formed.

Effects of the image display device of the embodiment will now be described.

Similarly to the other embodiments described above, the image display device of the embodiment has the effects of reducing the time of the transfer process for forming the light-emitting element 250 and reducing the number of processes. Also, the light-emitting surface 253S can be the p-type semiconductor layer 253 by setting the polarity of the TFT to be an n-channel. This is advantageous in that the degree of freedom of the circuit element arrangement and circuit design is increased, etc.

According to the embodiment, the light-emitting element 250 is located on the wiring part 230*a* and the graphene sheet 140*a*, and the light-emitting surface 253S is provided in contact with the graphene sheet 140*a*. The third wiring layer 230 that includes the wiring part 230*a* is formed of a light-transmitting conductive film or a light-transmitting metal thin film. The graphene sheet 140*a* is formed to be sufficiently thin and is sufficiently light-transmissive. Therefore, according to the embodiment, sufficient intensity is ensured even when the light emitted from the light-emitting element 250 passes through the graphene sheet 140*a* and the wiring part 230*a*.

That is, a sufficient light emission intensity is ensured even without adding the removal processes of the wiring part 230*a* and the graphene sheet 140*a*, and so the increase of the number of processes can be suppressed, and a reduction of the manufacturing cost can be realized.

According to the embodiment, the wiring part 230*a* is electrically connected to the light-emitting surface 253S, and the light-emitting element 250 can be connected to the via 261*a* with a low resistance. Therefore, the current component of the current flowing in the light-emitting element 250 in directions crossing the Z-axis can be reduced; accordingly, the power loss of the light-emitting element 250 is reduced because the voltage drop is reduced. That is, the substantial luminous efficiency of the light-emitting element 250 having a vertical structure can be increased.

Third Embodiment

Figure 19:
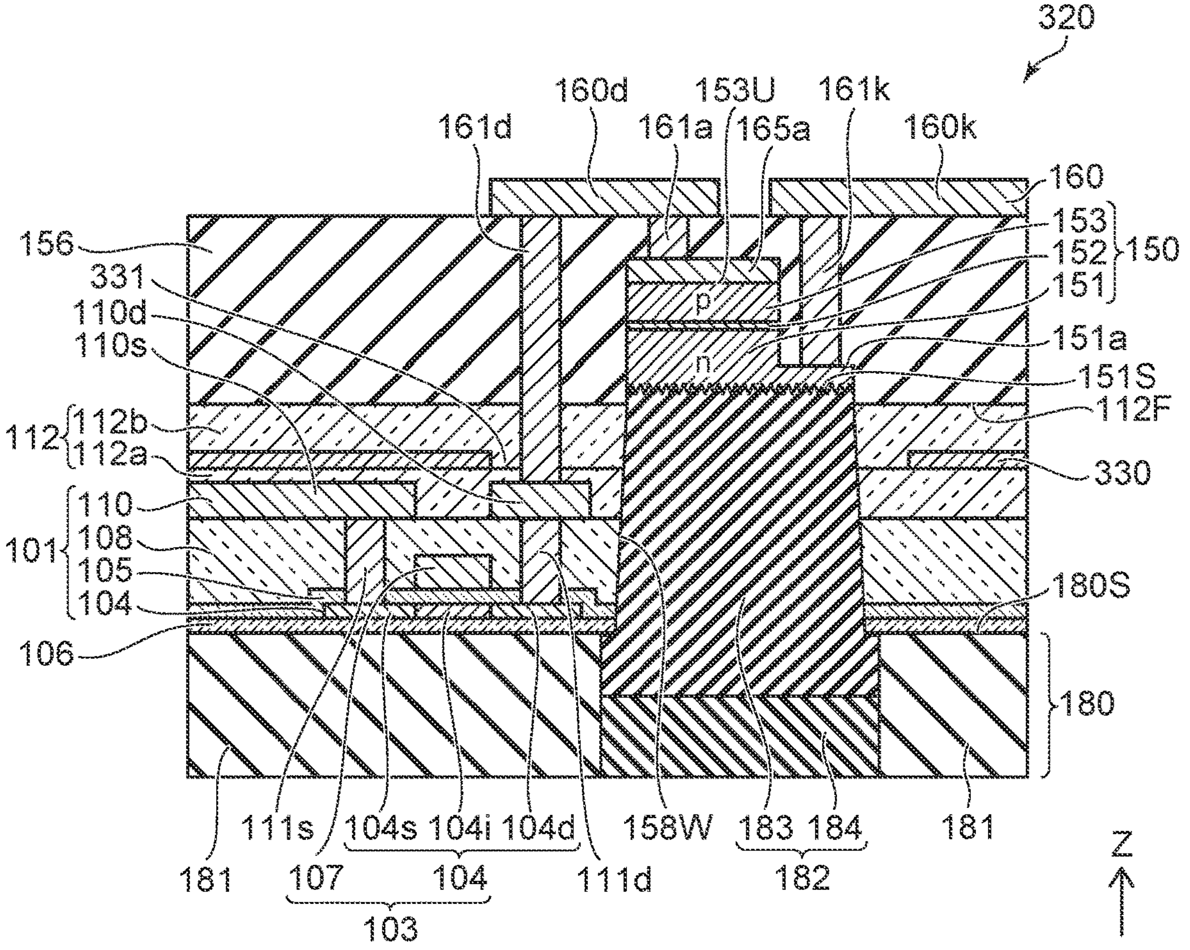
FIG. 19 is a schematic cross-sectional view illustrating a portion of an image display device according to a third embodiment.

FIG. 19 is a schematic cross-sectional view illustrating a portion of an image display device according to the embodiment.

The embodiment differs from the other embodiments described above in that a light-shielding layer 330 is located between the light-emitting element 150 and the transistor 103. Also, the light-emitting element 150 of the embodiment is different from that of the other embodiments described above in that the light-emitting surface 151S is roughened. The same components as those of the other embodiments described above are marked with the same reference numerals, and a detailed description is omitted as appropriate.

As shown in FIG. 19, the image display device includes a subpixel 320. The subpixel 320 includes the color filter (the first member) 180, the transistor 103, the first wiring layer 110, the light-shielding layer 330, the first inter-layer insulating film 112, the light-emitting element 150, the second inter-layer insulating film 156, the via 161*d*, and the second wiring layer 160. The subpixel 320 further includes a light-reflective electrode 165*a*. The subpixel 320 further includes the light-shielding layer 330.

According to the embodiment, the components of the circuit 101 including the transistor 103 are located on the color filter 180. In the example, the transistor 103 is located on the light-shielding part 181 included in the color filter 180. The transistor 103 is formed on the TFT underlying film 106 located on the color filter 180. The TFT underlying film 106 is located on a formation surface (a first surface) 180S of the color filter (the first member) 180, and the transistor 103 is located on the light-shielding part 181 with the TFT underlying film 106 interposed.

The color conversion part (the light-transmitting member) 182 of the color filter 180 extends through the first inter-layer insulating film 112, the light-shielding layer 330, the insulating film 108, the insulating layer 105, and the TFT underlying film 106. The light-emitting surface 151S of the light-emitting element 150 is provided over the color conversion layer 183. The light that is emitted from the light-emitting surface 151S is radiated externally via the color conversion layer 183 and the filter layer 184.

According to the embodiment, the light-emitting surface 151S is roughened. The color conversion layer 183 fills an opening extending through the first inter-layer insulating film 112, the light-shielding layer 330, the insulating film 108, the insulating layer 105, and the TFT underlying film 106. The color conversion layer 183 is provided to cover the roughened light-emitting surface 151S and the wall surface 158W of the opening.

According to the embodiment, the first inter-layer insulating film 112 includes two insulating films 112*a* and 112*b*. For example, the insulating films 112*a* and 112*b* are formed of the same material and form the first inter-layer insulating film 112. The insulating film 112*a* is located on the insulating film 108 and the first wiring layer 110. The light-shielding layer 330 is located on the insulating film 112*a*. The insulating film 112*b* is located on the light-shielding layer 330. That is, the light-shielding layer 330 is located between the insulating films 112*a* and 112*b*. The light-shielding layer 330 is provided over substantially the entire surface of the first inter-layer insulating film 112 between the first inter-layer insulating film 112 and the second inter-layer insulating film 156 other than a through-hole 331.

According to the embodiment, the color conversion part 182 of the color filter 180 extends through the insulating film 112*b*, the light-shielding layer 330, the insulating film 112*a*, the insulating film 108, the insulating layer 105, and the TFT underlying film 106. Among these components, the light-shielding layer 330 includes a through-hole 331 having a larger diameter than the color conversion part 182 when projected onto the XY plane. The color conversion part 182 passes through the through-hole. In the example, the via 161*d* is located proximate to the color conversion part 182, and so the through-hole 331 has a diameter large enough for the via 161*d* to pass.

For example, the light-shielding layer 330 is formed of a light-reflective metal material, but may not be conductive as long as the material is light-shielding. The light-shielding layer 330 may be formed of a black resin. When the light-shielding layer 330 is formed of a black resin, the black resin can be collectively patterned together with the insulating films 112*a* and 112*b* when forming the opening for the color conversion part 182 without pre-forming a through-hole having a sufficiently large diameter.

According to the embodiment, when projected onto the XY plane, the light-shielding layer 330 is set to include substantially the entire outer perimeter of the TFT channel 104 when the TFT channel 104 is projected onto the light-shielding layer 330. That is, the outer perimeter of the TFT channel 104 is located within the outer perimeter of the light-shielding layer 330 when projected onto the XY plane. Therefore, the scattered light and the like of the light-emitting element 150 can be shielded, and malfunction due to light of the transistor 103 can be prevented.

Other than the light-emitting surface 151S being roughened and directly provided on the color conversion layer 183, the light-emitting element 150 is the same as the other and those of the other embodiments described above, and a detailed description is omitted.

The electrode 165*a* is provided over the top surface 153U. The electrode 165*a* is located between the top surface 153U and the connection member 161*a*. The electrode 165*a* is formed of a light-reflective conductive material. The electrode 165*a* realizes an ohmic connection with the p-type semiconductor layer 153. Because the electrode 165*a* is light-reflective, the upward radiated light and/or scattered light of the light-emitting element 150 is reflected toward the light-emitting surface 151S side. The substantial luminous efficiency of the light-emitting element 150 is increased thereby.

The second inter-layer insulating film 156 is provided to cover the planarized surface 112F, the light-emitting element 150, and the electrode 165*a*. The vias 161*d* and 161*k* are provided similarly to those of the other embodiments described above, and the second wiring layer 160 that includes the wiring parts 160*d* and 160*k* is provided similarly to that of the other embodiments described above.

The manufacturing method of the embodiment will now be described.

FIGS. 20A to 23B are schematic cross-sectional views illustrating a portion of the method for manufacturing the image display device of the embodiment.

According to the method for manufacturing the image display device of the embodiment, the process described with reference to FIG. 6A is applied to the processes of preparing the drive circuit substrate 100 shown in FIG. 6A up to the formation of the first wiring layer 110. According to the manufacturing method of the embodiment, the description of FIG. 6A continues with the processes after the first wiring layer 110 is formed.

Figure 20A:
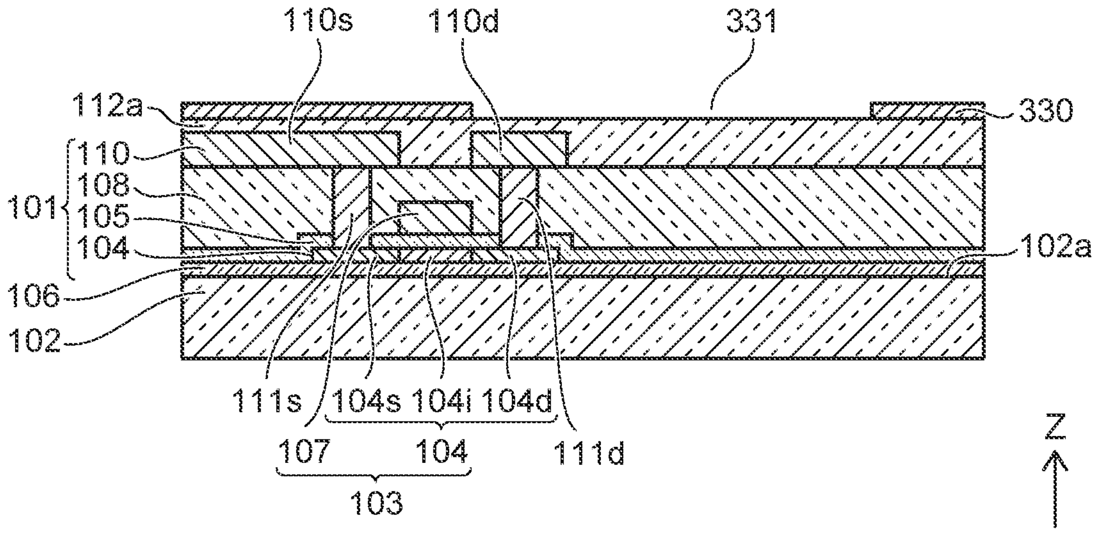
FIG. 20A is a schematic cross-sectional view illustrating a portion of a method for manufacturing the image display device of the third embodiment.

As shown in FIG. 20A, the insulating film 112*a* is formed on the insulating film 108 and the first wiring layer 110. The light-shielding layer 330 that includes the through-hole 331 is formed on the insulating film 112*a*.

Figure 20B:
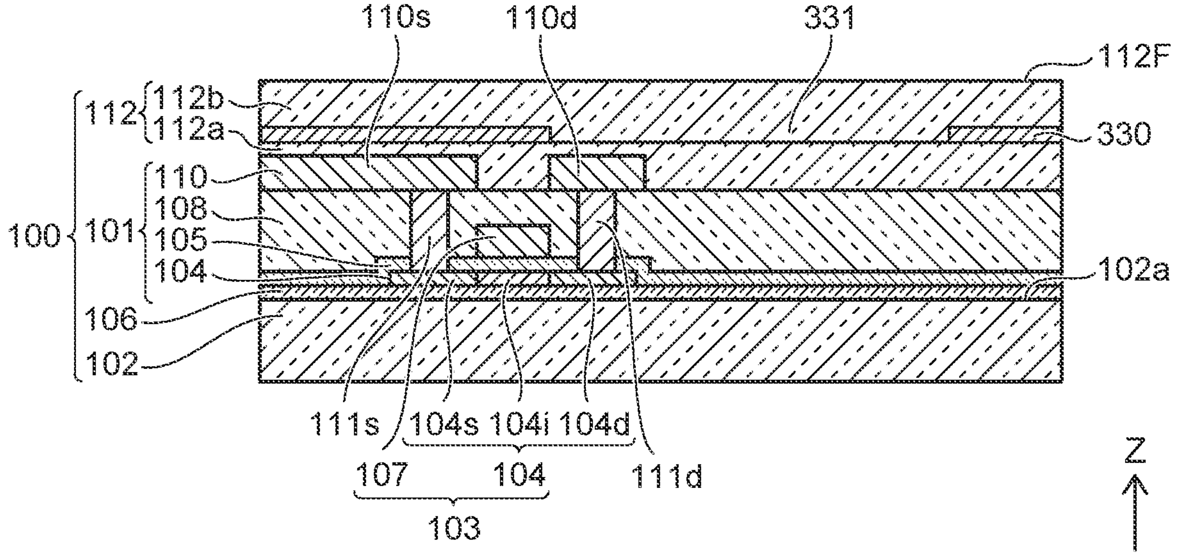
FIG. 20B is a schematic cross-sectional view illustrating a portion of the method for manufacturing the image display device of the third embodiment.

As shown in FIG. 20B, the insulating film 112*b* is formed on the insulating film 112*a* and the light-shielding layer 330. The insulating film 112*b* also is formed inside the through-hole 331. The surface of the insulating film 112*b* is planarized to form the planarized surface 112F. Thus, the drive circuit substrate (the first substrate) 100 that includes the light-shielding layer 330 is formed.

Figure 21A:
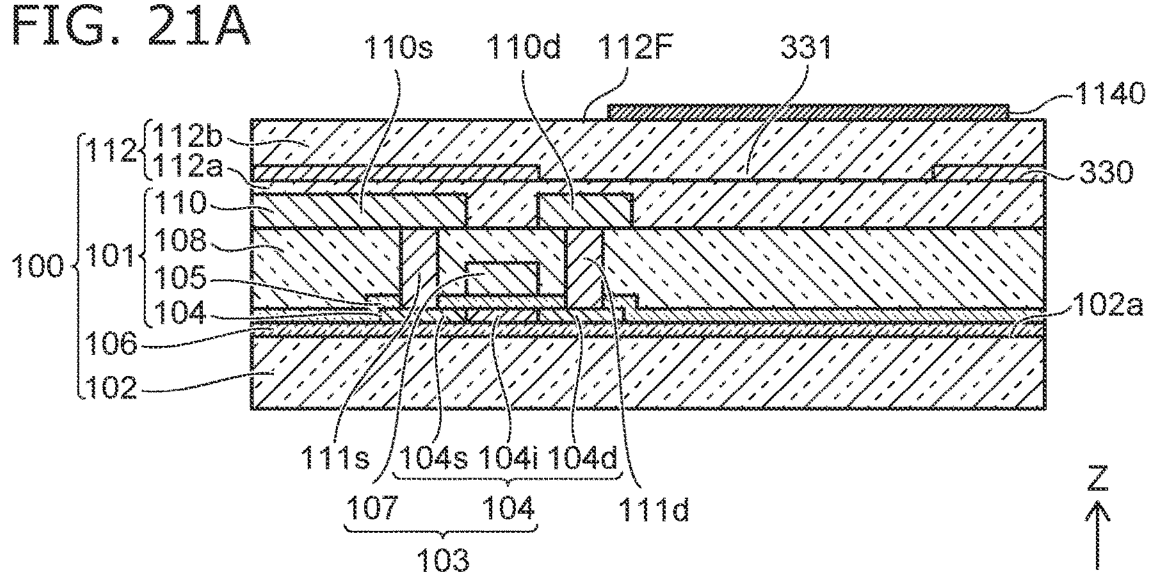
FIG. 21A is a schematic cross-sectional view illustrating a portion of the method for manufacturing the image display device of the third embodiment.

As shown in FIG. 21A, the graphene layer 1140 is formed at a prescribed position on the planarized surface 112F.

Figure 21B:
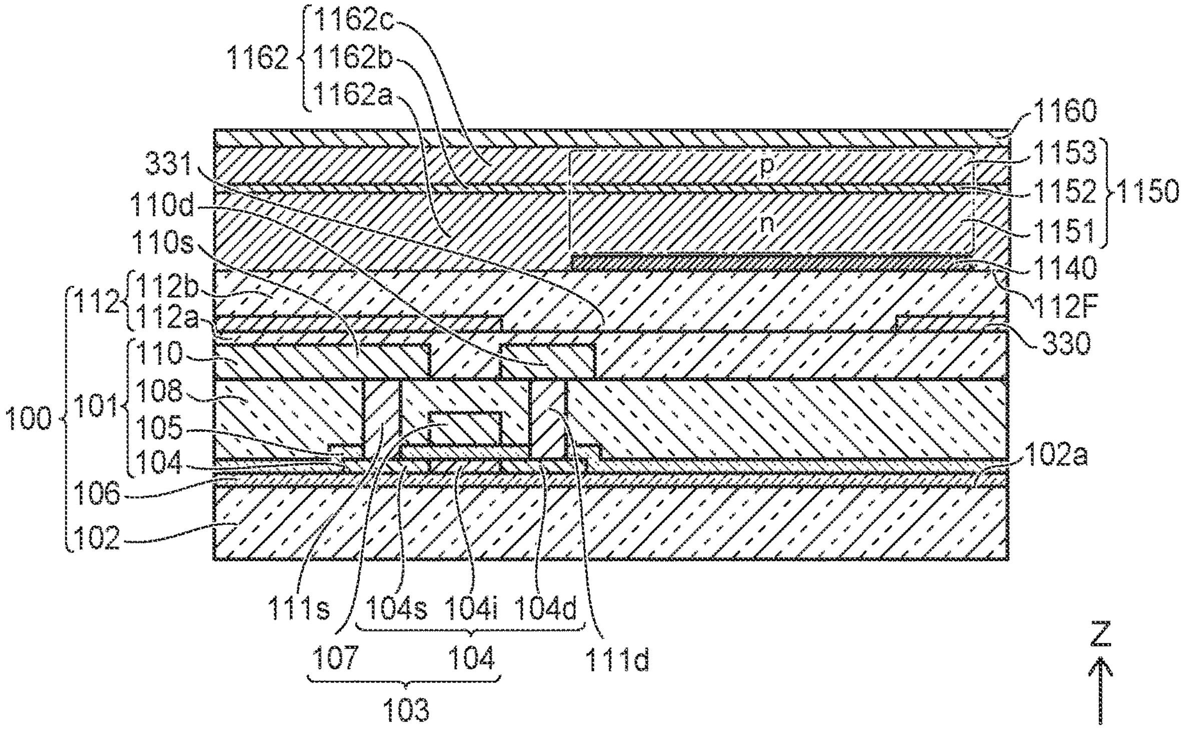
FIG. 21B is a schematic cross-sectional view illustrating a portion of the method for manufacturing the image display device of the third embodiment.

As shown in FIG. 21B, the semiconductor layer 1150 is formed over the graphene layer 1140. The formation process of the semiconductor layer 1150 and the technology to be applied are similar to those of the example described with reference to FIG. 7A. After forming the semiconductor layer 1150, a metal layer 1160 is formed on the p-type semiconductor layer 1153. The metal layer 1160 is formed of a conductive material such as a light-reflective metal, etc.

Figure 22A:
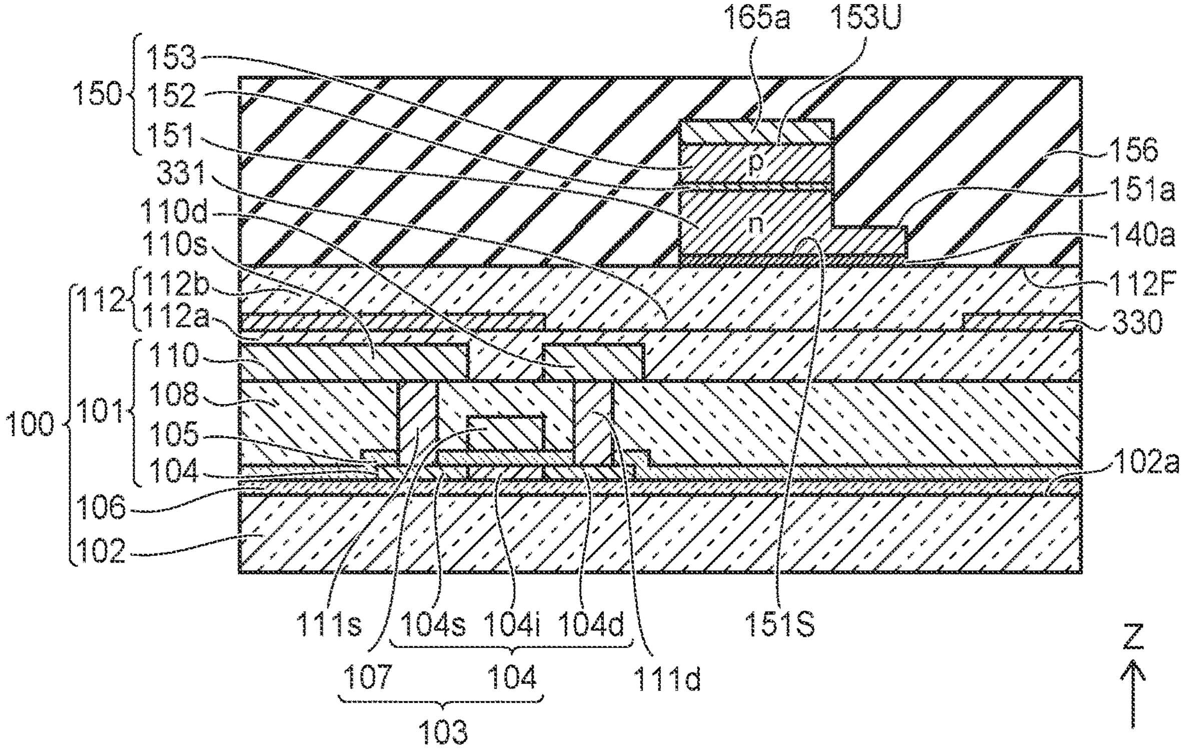
FIG. 22A is a schematic cross-sectional view illustrating a portion of the method for manufacturing the image display device of the third embodiment.

As shown in FIG. 22A, the electrode 165*a*, the light-emitting element 150, and the graphene sheet 140*a* are formed. To form these components, technologies and procedures similar to those of the other embodiments described above are applied. The second inter-layer insulating film 156 is formed to cover the planarized surface 112F, the electrode 165*a* that is formed, the light-emitting element 150, and the graphene sheet 140*a*.

In the formation processes of the electrode 165*a*, the light-emitting element 150, and the graphene sheet 140*a*, the metal layer 1160 shown in FIG. 21B is patterned by etching to form the electrode 165*a*. The semiconductor layer 1150 shown in FIG. 21B is patterned by etching to form the light-emitting element 150. In the formation process of the light-emitting element 150, the other parts are formed after forming the connection part 151*a*. When forming the light-emitting element 150, the graphene sheet 140*a* is formed by over etching of the graphene layer 1140 shown in FIG. 21A. Similarly to the other embodiments described above, RIE or the like is utilized in such patterning by etching.

Figure 22B:
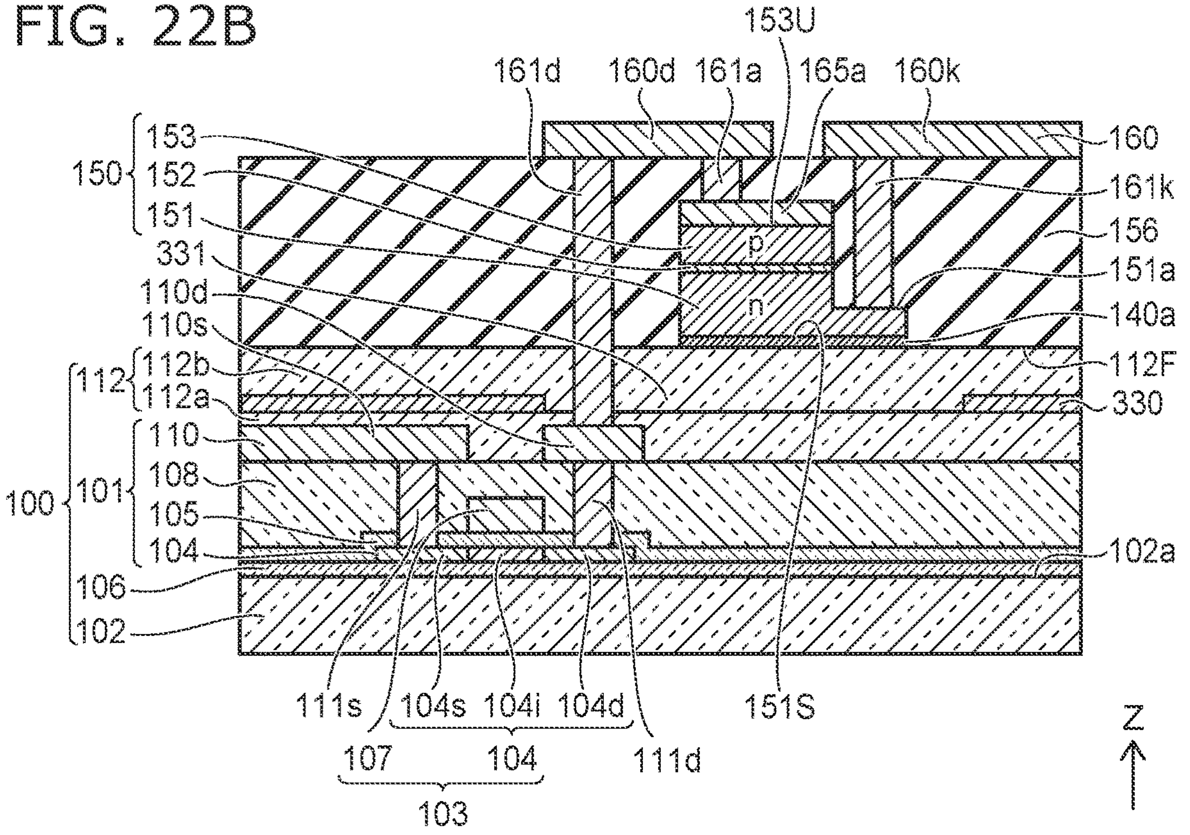
FIG. 22B is a schematic cross-sectional view illustrating a portion of the method for manufacturing the image display device of the third embodiment.

As shown in FIG. 22B, the via 161*d* is formed to extend through the second and first inter-layer insulating films 156 and 112. The via 161*k* is formed to extend through the second inter-layer insulating film 156. A contact hole that is formed in the second inter-layer insulating film 156 is filled with a conductive material to form the connection member 161*a*. The second wiring layer 160 is formed on the second inter-layer insulating film 156, the wiring part 160*d* is connected to the via 161*d* and the connection member 161*a*, and the wiring part 160*k* is connected to the via 161*k*. Technologies and procedures similar to those of the other embodiments described above are applied to these processes.

Figure 23A:
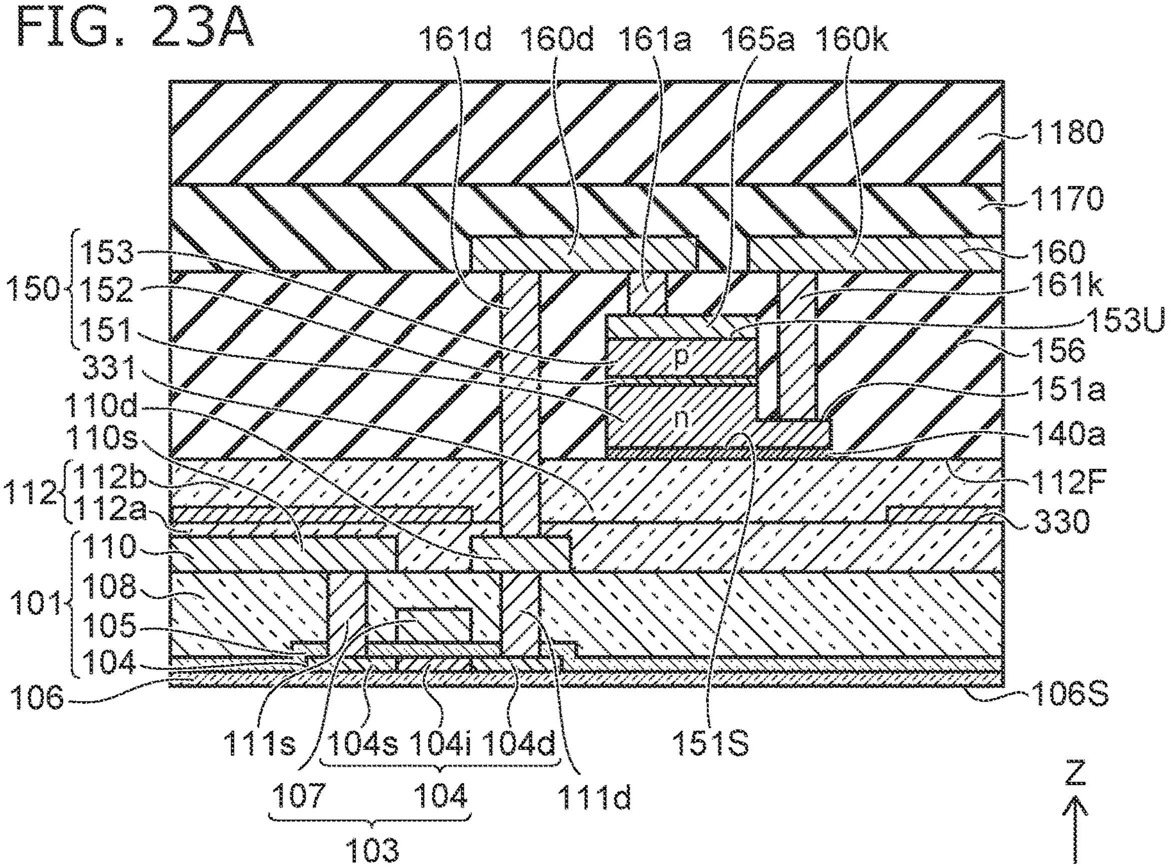
FIG. 23A is a schematic cross-sectional view illustrating a portion of the method for manufacturing the image display device of the third embodiment.

As shown in FIG. 23A, an adhesive layer 1170 is formed over the second inter-layer insulating film 156 and the second wiring layer 160, and a reinforcing substrate 1180 is bonded via the adhesive layer 1170. The reinforcing substrate 1180 can protect from subsequent damage due to stress, impact, etc., when transferring or in the removal process of the substrate 102. After bonding the reinforcing substrate 1180, the substrate 102 is removed by wet etching or laser lift-off, and a surface 106S of the TFT underlying film 106 is exposed.

Figure 23B:
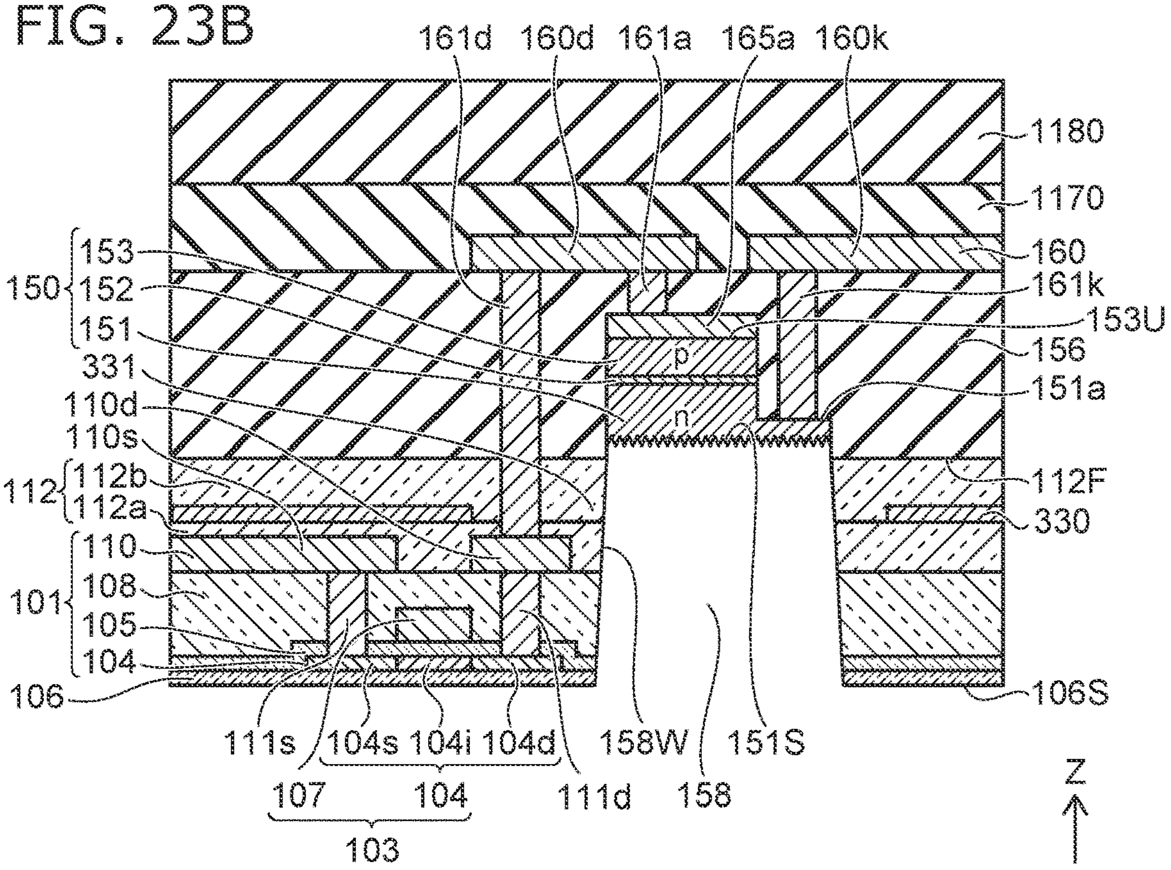
FIG. 23B is a schematic cross-sectional view illustrating a portion of the method for manufacturing the image display device of the third embodiment.

As shown in FIG. 23B, the opening 158 is formed from the surface 106S toward the light-emitting surface 151S. The opening 158 is formed to extend through the TFT underlying film 106, the insulating layer 105, the insulating film 108, the light-shielding layer 330, and the first inter-layer insulating film 112 and reach the light-emitting surface 151S. According to the embodiment, the entire graphene sheet 140*a* shown in FIG. 23A is removed when forming the opening 158. Technologies and procedures similar to those of the other embodiments described above are applicable to the formation process of the opening 158.

The light-emitting surface 151S that is exposed by forming the opening 158 is roughened by wet etching, etc. Subsequently, by applying the processes described with reference to FIGS. 9A to 9D, a color filter is formed, and the subpixel 320 is formed. As described with reference to FIG. 11, the opening 158 may be filled with a transparent resin, and a color filter may be formed by inkjet printing or as a film-type color filter. Also, a color filter may be formed by inkjet or as a film-type color filter by forming the opening 158 through the substrate 102 without removing the substrate 102 after the process of FIG. 22B. The reinforcing substrate 1180 may be removed after forming the color filter, or may be left as-is and removed separately.

Thus, the color filter can be formed, and the subpixel 320 can be formed.

Effects of the image display device of the embodiment will now be described.

The method for manufacturing the image display device of the embodiment has the effects of reducing the time of the transfer process for forming the light-emitting element 150 and reducing the number of processes similarly to the other embodiments described above. The light-emitting surface 151S is the n-type semiconductor layer 151 that has a lower resistance than the p-type; therefore, the n-type semiconductor layer 151 can be formed thick enough that the light-emitting surface 151S can be sufficiently roughened.

By roughening the light-emitting surface 151S, the radiated light is diffused, and so the image display device of the embodiment can be used as a light source having a sufficient light emission area even for a small light-emitting element 150.

In the image display device of the embodiment, the light-shielding layer 330 is located between the insulating films 112*a* and 112*b*. That is, the light-shielding layer 330 is located between the light-emitting element 150 and the transistor 103. Therefore, even when the light-emitting element 150 radiates light, the radiated light, scattered light, and the like does not easily reach the TFT channel 104, and malfunction of the transistor 103 can be prevented.

The light-shielding layer 330 can be formed of a conductive material such as a metal, etc., and the light-shielding layer 330 can be connected to any potential. For example, the light-shielding layer 330 can assist noise suppression by providing a portion of the light-shielding layer 330 directly under a switching element such as the transistor 103, etc., and by connecting to a ground potential, a power supply potential, etc.

When the light-shielding layer 330 is formed of an insulating material such as a black resin, etc., the opening 158 can be formed without providing the through-hole 331 in the formation of the via 161*d* described with reference to FIG. 22B and the formation of the opening 158 described with reference to FIG. 23B. Therefore, malfunction of the transistor 103, etc., can be prevented more reliably because the formation process of the through-hole 331 can be omitted, and a gap due to the through-hole 331 that may pass light can be prevented.

The application of the light-shielding layer 330 is not limited to the embodiment; the light-shielding layer 330 is applicable commonly to the subpixels of the other embodiments described above and the other embodiments described below. Effects similar to those described above can be obtained when applying to the other embodiments as well.

According to the embodiment, the periphery of the light-emitting element 150 other than the light-emitting surface 151S is covered with the second inter-layer insulating film 156. The second inter-layer insulating film 156 can be formed of a light-reflective material, e.g., a white resin. According to the embodiment, the light-reflective electrode 165*a* is provided over the top surface 153U at the side opposite to the light-emitting surface 151S. Accordingly, the light that is radiated by the light-emitting element is confined inside the light-emitting element 150, and a portion or the greater part of the light is guided to the light-emitting surface 151S. Accordingly, the substantial luminous efficiency of the light-emitting element 150 is increased.

In the example, the insulating films 112*a* and 112*b* and the insulating film 108 are formed of a light-transmitting resin, e.g., a transparent resin. When the insulating films 112*a* and 112*b* and the insulating film 108 are formed of a light-reflective material such as a white resin, etc., the substantial luminous efficiency of the light-emitting element 150 can be further increased.

The configuration and method for manufacturing a light-emitting element including a roughened light-emitting surface are described in the example above. In a light-emitting element that includes a connection part, a roughened light-emitting surface is applicable as in the embodiment by adding a process of forming an opening exposing the light-emitting surface. The light-emitting element 150 of the first embodiment and a semiconductor layer 750 of the seventh embodiment described below are specific applications. Also, according to the fifth and sixth embodiments described below, the light-emitting surface can be roughened by modifying the connection using the light-transmitting wiring part to a connection using a connection part formed in the light-emitting element. The effects described above can be provided by roughening the light-emitting surface of a component of the light-emitting element.

Fourth Embodiment

Figure 24:
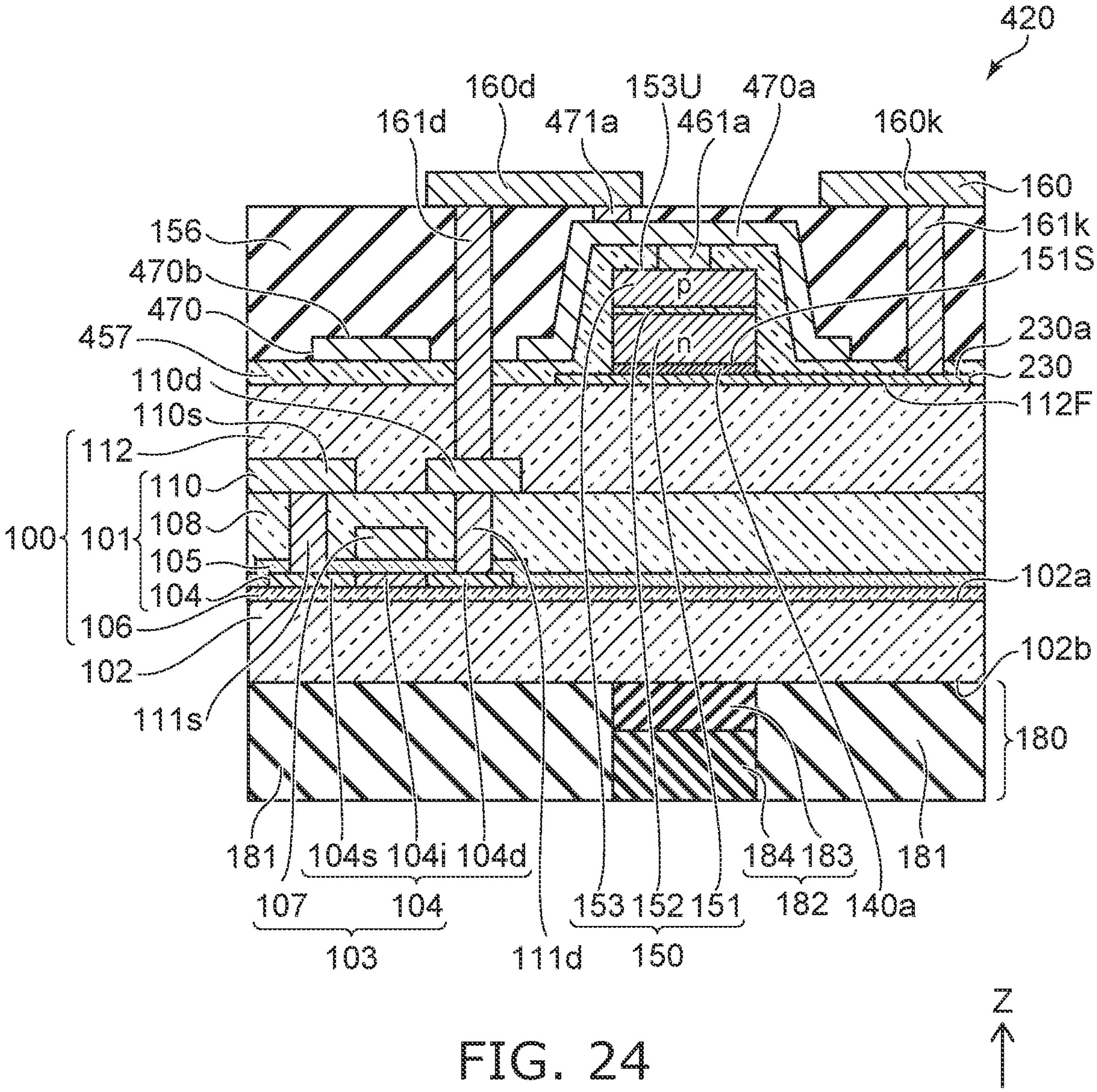
FIG. 24 is a schematic cross-sectional view illustrating a portion of an image display device according to a fourth embodiment.

FIG. 24 is a schematic cross-sectional view illustrating a portion of an image display device of the embodiment.

The embodiment differs from the other embodiments described above in that a fourth wiring layer 470 that is located on the light-emitting element 150 is included. Otherwise, the embodiment is the same as the other embodiments described above; the same components are marked with the same reference numerals, and a detailed description is omitted as appropriate. According to the embodiment, the light-transmitting third wiring layer 230 is used to connect between the second wiring layer 160 and the n-type semiconductor layer 151 providing the light-emitting surface 151*s*.

As shown in FIG. 24, the image display device of the embodiment includes a subpixel 420. The subpixel 420 includes the substrate 102, the transistor 103, the first wiring layer 110, the first inter-layer insulating film 112, the third wiring layer 230, the light-emitting element 150, the fourth wiring layer 470, the second inter-layer insulating film 156, the via 161*d*, and the second wiring layer 160. The subpixel 420 further includes a color filter.

According to the embodiment, the drive circuit substrate 100 is configured to include the substrate 102, the TFT underlying film 106, the circuit 101, and the first inter-layer insulating film 112. The configuration of the drive circuit substrate 100 is the same as that of the first embodiment, and a detailed description is omitted.

The third wiring layer 230 that includes the wiring part 230*a* is located on the planarized surface 112F. The configurations of the third wiring layer 230 and the wiring part 230*a* and the like are similar to those of the second embodiment described with reference to FIG. 14, and a detailed description is omitted.

The light-emitting element 150 is located on the wiring part 230*a* with the graphene sheet 140*a* interposed.

A resin layer 457 is located on the planarized surface 112F, the third wiring layer 230 including the wiring part 230*a*, the graphene sheet 140*a*, and the light-emitting element 150. The resin layer 457 is, for example, a transparent resin. The fourth wiring layer 470 is located on the resin layer 457. The fourth wiring layer 470 can include multiple wiring parts. The multiple wiring parts can be connected to different potentials. In the example, the fourth wiring layer 470 includes wiring parts 470*a* and 470*b* that are formed to be separated from each other.

The wiring part (the first electrode) 470*a* is provided over the top and side of the light-emitting element 150 and covers the top surface 153U and the side surface of the light-emitting element 150. The wiring part 470*a* functions as a member for light reflection. The wiring part 470*a* covers almost the entire light-emitting element other than the light-emitting surface 151S. Accordingly, the wiring part 470*a* increases the substantial luminous efficiency of the light-emitting element 150 by reflecting the sideward and upward-scattered light and reflected light of the light-emitting element 150 toward the light-emitting surface 151S side. A connection electrode 461*a* is located between the top surface 153U and the wiring part 470*a* and electrically connects the top surface 153U and the wiring part 470*a*.

When the resin layer 457 is a transparent resin, the scattered light and the like that is emitted from the top and side of the light-emitting element 150 is reflected by the wiring part 470*a* toward the light-emitting surface 151S side. Therefore, the substantial luminous efficiency of the light-emitting element 150 is increased. When a highly light-reflective material such as a white resin or the like is used as the resin layer 457, the wiring part 470*a* is located on the resin layer 457, and so a higher light reflectance can be realized because the scattered light and the like leaking from the resin layer 457 can be reflected toward the light-emitting surface 151S side.

The second inter-layer insulating film 156 is provided to cover the resin layer 457 and the fourth wiring layer 470. The second wiring layer 160 that includes the wiring parts 160*d* and 160*k* is located on the second inter-layer insulating film 156.

The via 161*d* extends through the second inter-layer insulating film 156, the resin layer 457, and the first inter-layer insulating film 112 and reach the wiring part 110*d*. The via 161*d* is located between the wiring part 160*d* and the wiring part 110*d* and electrically connects the wiring part 160*d* and the wiring part 110*d*. The wiring part 160*d* is connected to the wiring part 470*a* via a connection member 471*a*. Accordingly, the p-type semiconductor layer 153 is electrically connected to the drain region of the transistor 103 via the connection electrode 461*a*, the wiring part 470*a*, the connection member 471*a*, the wiring part 160*d*, the via 161*d*, the wiring part 110*d*, and the via 111*d*.

The via 161*k* extends through the second inter-layer insulating film 156 and the resin layer 457 and reach the wiring part 230*a*. The via 161*k* is located between the wiring part 160*k* and the wiring part 230*a* and electrically connects the wiring part 160*k* and the wiring part 230*a*. Accordingly, for example, the n-type semiconductor layer 151 is electrically connected to the ground line 4 of the circuit of FIG. 3 via the graphene sheet 140*a*, the wiring part 230*a*, the via 161*k*, and the wiring part 160*k*.

A method for manufacturing the image display device of the embodiment will now be described.

FIGS. 25A to 26B are schematic cross-sectional views illustrating a portion of the method for manufacturing the image display device of the embodiment.

Figure 25A:
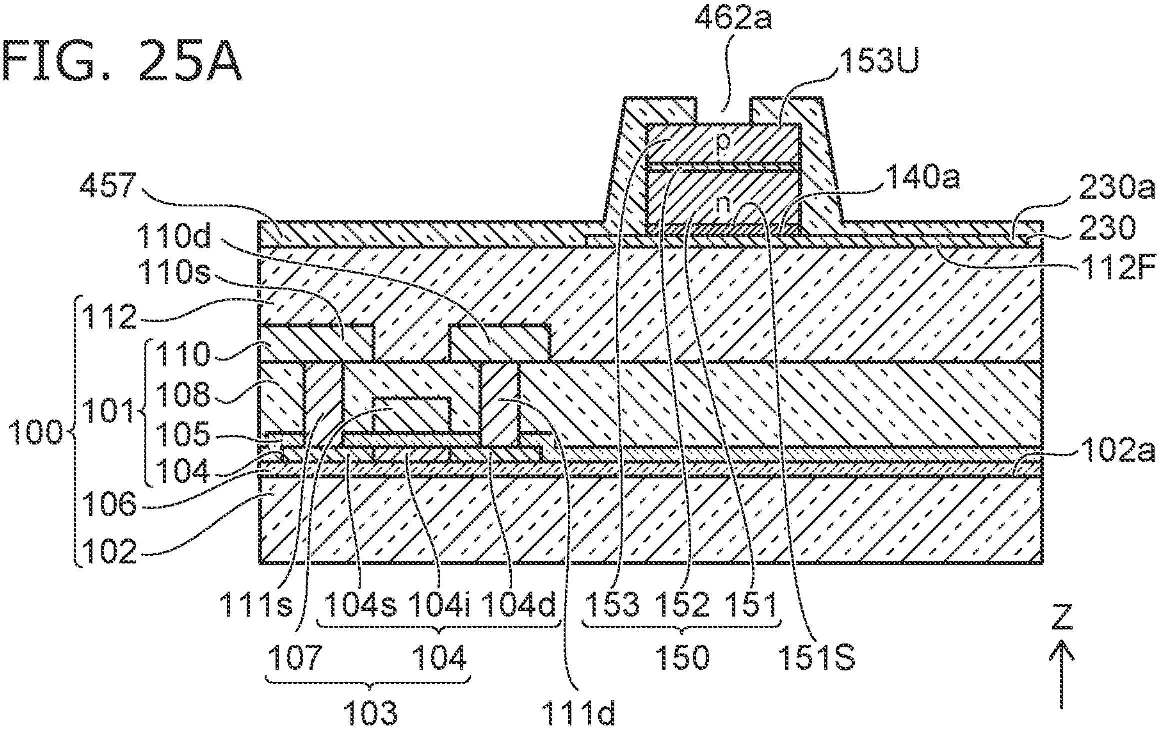
FIG. 25A is a schematic cross-sectional view illustrating a portion of a method for manufacturing the image display device of the fourth embodiment.

According to the embodiment, the processes up to forming the light-transmitting conductive film 1130, forming the graphene layer 1140, and forming the semiconductor layer 1150 as described with reference to FIG. 17A are the same as those of the other embodiments described above. In the following description, the process of FIG. 25A is performed after the process of FIG. 17A. However, according to the embodiment, the semiconductor layer 1150 that is formed on the graphene layer 1140 includes the n-type semiconductor layer 1151, the light-emitting layer 1152, and the p-type semiconductor layer 1153 stacked in this order from the graphene layer 1140 side. Therefore, in the application of FIG. 17A of the embodiment, the semiconductor layer 1150 includes the n-type semiconductor layer 1151, the light-emitting layer 1152, and the p-type semiconductor layer 1153 stacked in this order. The formation process of such a semiconductor layer 1150 is described with reference to FIG. 7A.

As shown in FIG. 25A, the light-transmitting conductive film 1130 shown in FIG. 17A is patterned by etching to form the third wiring layer 230 including the wiring part 230*a*. The semiconductor layer 1150 shown in FIG. 17A is patterned by etching to form the light-emitting element 150. The graphene layer 1140 is shaped into the graphene sheet 140*a* by over etching when forming the light-emitting element 150.

The resin layer 457 is formed to cover the planarized surface 112F, the third wiring layer 230 including the wiring part 230*a*, the graphene sheet 140*a*, and the light-emitting element 150. An opening 462*a* is formed in the resin layer 457 to expose a portion of the top surface 153U of the light-emitting element 150.

Figure 25B:
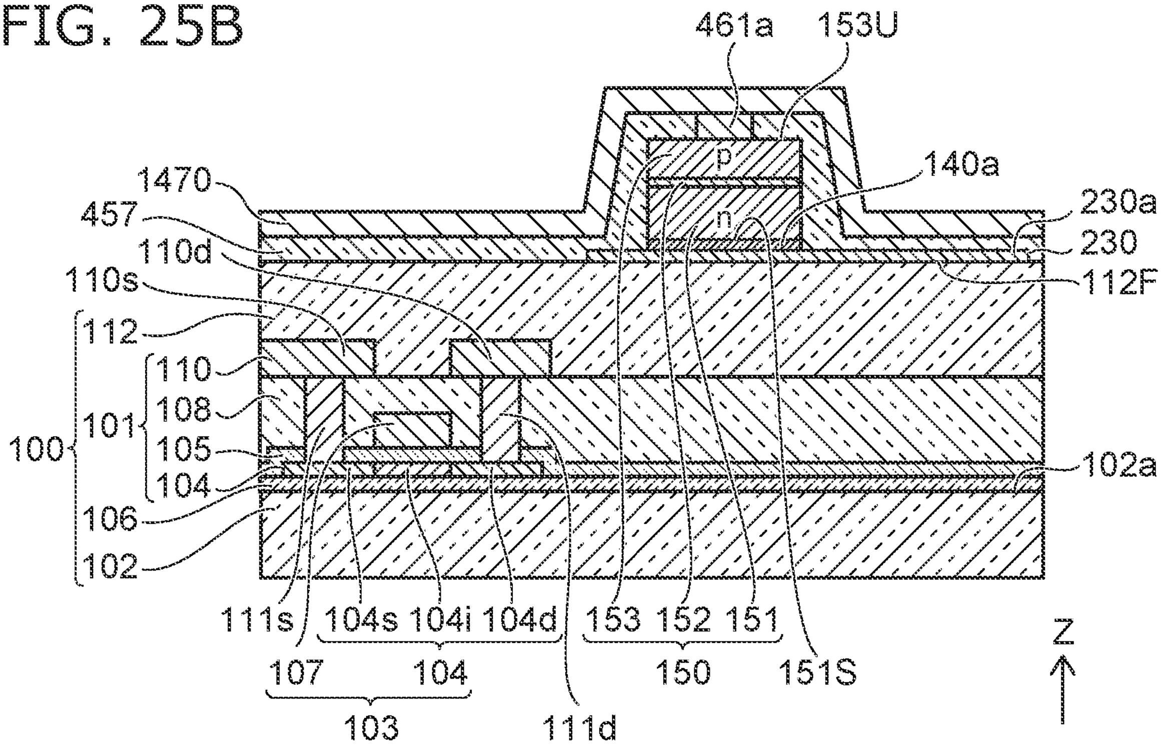
FIG. 25B is a schematic cross-sectional view illustrating a portion of the method for manufacturing the image display device of the fourth embodiment.

Subsequently, as shown in FIG. 25B, a metal layer 1470 is formed to cover the resin layer 457. The connection electrode 461*a* may be formed simultaneously when forming the metal layer 1470 by filling the opening 462*a* shown in FIG. 25A, or the metal layer 1470 may be formed by filling the opening 462*a* after forming the connection electrode 461*a*.

Figure 26A:
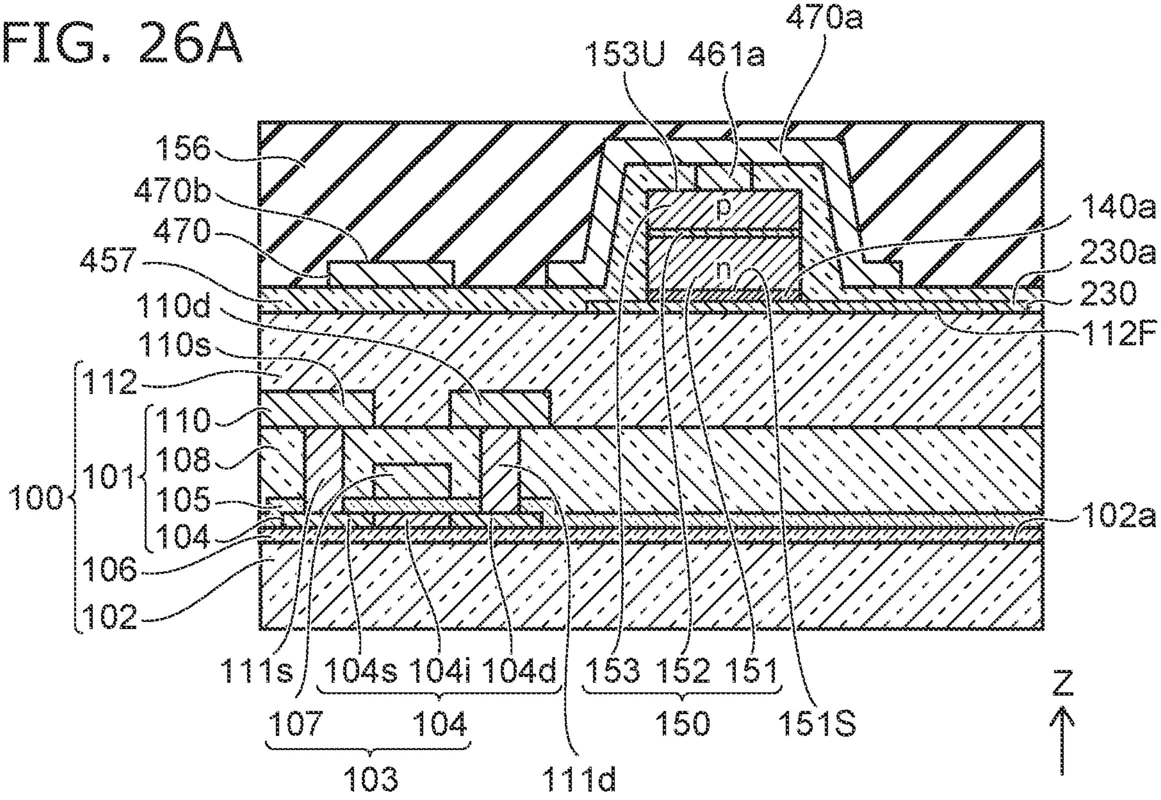
FIG. 26A is a schematic cross-sectional view illustrating a portion of the method for manufacturing the image display device of the fourth embodiment.

As shown in FIG. 26A, the metal layer 1470 shown in FIG. 25B is patterned by etching to form the fourth wiring layer 470. The wiring part 470*a* and the wiring part 470*b* are formed to be separated from each other when forming the fourth wiring layer 470. The wiring part 470*a* is formed to cover the top surface 153U and the side surface of the light-emitting element. The second inter-layer insulating film 156 is formed to cover the resin layer 457 and the fourth wiring layer 470.

Figure 26B:
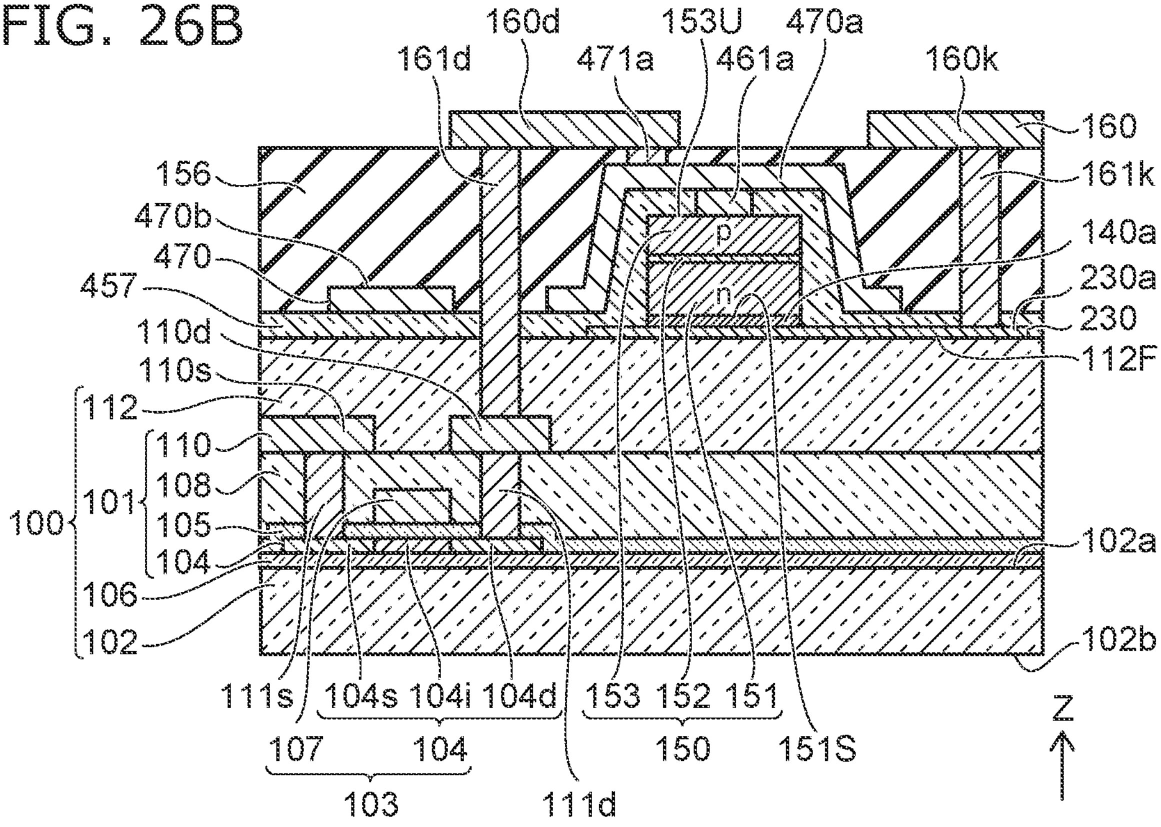
FIG. 26B is a schematic cross-sectional view illustrating a portion of the method for manufacturing the image display device of the fourth embodiment.

As shown in FIG. 26B, the second wiring layer 160 that includes the wiring parts 160*d* and 160*k* is formed on the second inter-layer insulating film 156. The via 161*k* is formed to extend through the second inter-layer insulating film 156 and reach the wiring part 230*a*. The via (the second via) 161*k* electrically connects the wiring part 160*k* and the wiring part 230*a* between the wiring part 160*k* and the wiring part 230*a*. Similarly to the other embodiments described above, the via 161*d* is formed, and the second wiring layer 160 and the first wiring layer 110 are electrically connected. A contact hole that is formed as an opening in the second inter-layer insulating film 156 is filled with a conductive material to form the connection member 471*a*, and the wiring part 160*d* and the wiring part 470*a* are connected.

Subsequently, a color filter is formed at the exposed surface 102*b* of the substrate 102, and the subpixel 420 is formed.

Effects of the image display device of the embodiment will now be described.

The image display device of the embodiment has the effects of reducing the time of the transfer process for forming the light-emitting element 150 and reducing the number of processes similarly to the other embodiments described above. The image display device of the embodiment has the other following effects.

The third wiring layer 230 that includes the wiring part 230*a* is formed of a light-transmitting conductive film such as an ITO film, a metal thin film, etc., and is easy to pattern, and there are cases where the series of manufacturing processes of the light-emitting element 150 and the third wiring layer 230 can be reduced.

According to the embodiment, the light-emitting element 150 can have a vertical structure because the wiring part 230*a* is used to draw out the electrode of the light-emitting surface 151S side. The light-emitting element 150 that has the vertical structure is advantageous in that the components of the current flowing through the semiconductor layer in directions crossing the Z-axis can be reduced, so that the current flows substantially in the direction along the Z-axis; therefore, the loss of the semiconductor layer can be reduced.

In the image display device of the embodiment, the subpixel 420 includes the fourth wiring layer 470. The fourth wiring layer 470 is electrically isolated from the light-emitting element 150 by the resin layer 457. The fourth wiring layer 470 includes the wiring part 470*a*, and the wiring part 470*a* covers the top surface 153U and the side surface of the light-emitting element 150 via the resin layer 457. Therefore, the upward and sideward-scattered light and the like of the light-emitting element 150 can be reflected toward the light-emitting surface 151S side. Therefore, the substantial luminous efficiency of the light-emitting element 150 can be increased. The resin layer 457 may be made smooth by reflow, etc., and the wiring part 470*a* may be formed in a parabolic curved shape. Thus, the light emission from the light-emitting element 150 can approach parallel light in the negative direction of the Z-axis.

Fifth Embodiment

Figure 27:
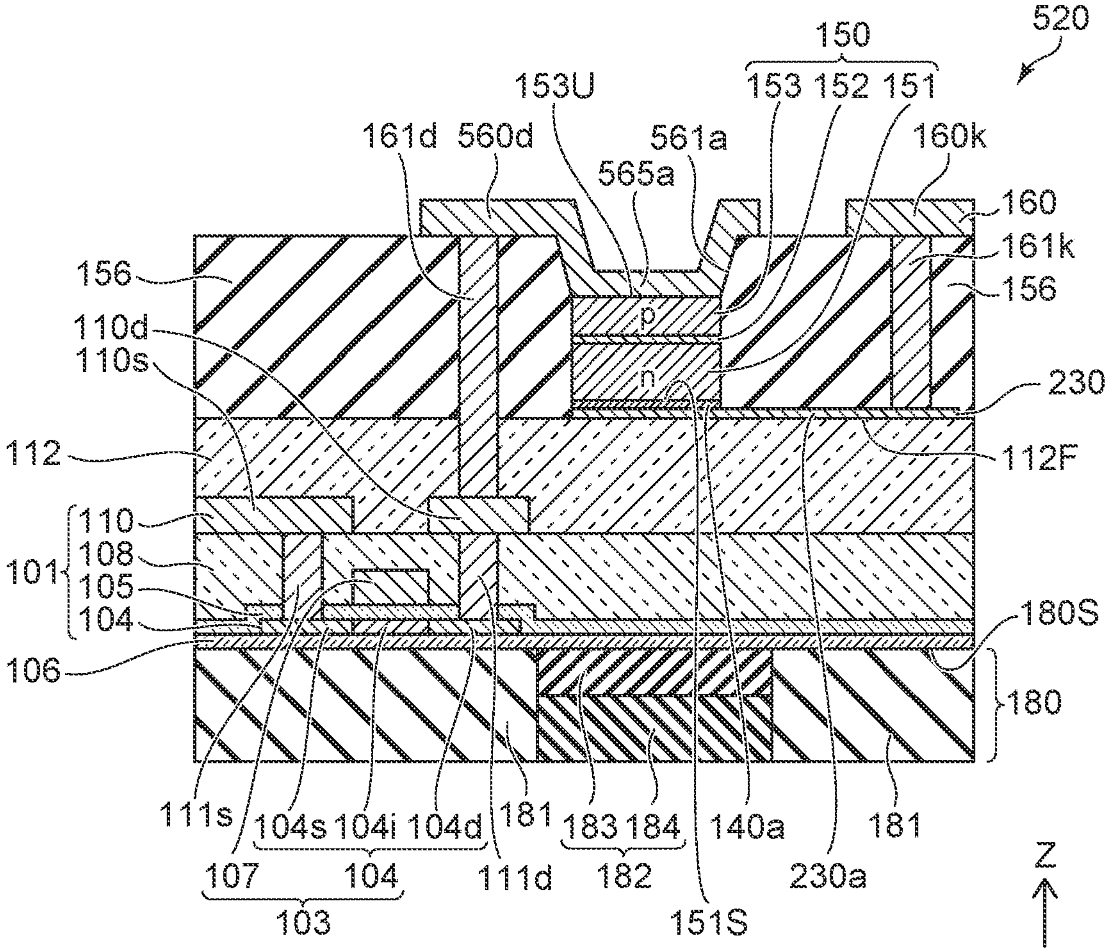
FIG. 27 is a schematic cross-sectional view illustrating a portion of an image display device according to a fifth embodiment.

FIG. 27 is a schematic cross-sectional view illustrating a portion of an image display device of the embodiment.

The embodiment differs from the other embodiments described above in that an electrode 565*a* that covers the top surface 153U of the light-emitting element 150 is included, and the electrode 565*a* is connected to a wiring part 560*d* formed in a contact hole 561*a* for the electrode 565*a*. Otherwise, the embodiment is the same as the other embodiments; the same components are marked with the same reference numerals, and a detailed description is omitted as appropriate.

As shown in FIG. 27, the image display device of the embodiment includes a subpixel 520. The subpixel 520 includes the color filter (the first member) 180, the transistor 103, the first wiring layer 110, the first inter-layer insulating film 112, the third wiring layer 230, the graphene sheet 140*a*, the light-emitting element 150, the second inter-layer insulating film 156, the via 161*d*, and the second wiring layer 160. In the subpixel 520 according to the embodiment, the second wiring layer 160 includes the wiring part 560*d*. The light-reflective electrode (second electrode) 565*a* is provided over the top surface 153U, and the electrode 565*a* is connected with the wiring part 560*d*.

According to the embodiment, the components of the circuit 101 including the transistor 103 are located on the formation surface (the first surface) 180S of the color filter (the first member) 180 with the TFT underlying film 106 interposed. The light-emitting element 150 is located on the color filter 180 with the insulating film 108 provided to cover the transistor 103 and the like and the first inter-layer insulating film 112 on the insulating film 108 interposed. In the example, the components of the circuit 101 are located on the light-shielding part 181 of the color filter 180, and the light-emitting element 150 is located on the color conversion part 182 of the color filter 180. The light that is emitted from the light-emitting element 150 is incident on the color conversion part 182 of the color filter 180 via the first inter-layer insulating film 112, the insulating film 108, the insulating layer 105, and the TFT underlying film 106. The configurations of the color filter 180, the transistor 103, etc., are the same as those of the other embodiments described above, and a detailed description is omitted.

Similarly to the other embodiments described above, the third wiring layer 230 that includes the wiring part 230*a* is located on the planarized surface 112F, and the light-emitting element 150 is located on the wiring part 230*a* with the graphene sheet 140*a* interposed. The wiring part 230*a* is provided to protrude in one direction over the planarized surface 112F, and one end of the via 161*k* is connected to the wiring part 230*a* similarly to the other embodiments described above.

The light-emitting element 150 includes the n-type semiconductor layer 151, the light-emitting layer 152, and the p-type semiconductor layer 153 stacked in this order from the light-emitting surface 151S toward the top surface 153U. The electrode 565*a* is provided over the top surface 153U at the side opposite to the light-emitting surface 151S. The electrode 565*a* is formed of a light-reflective conductive material.

The contact hole 561*a* is formed above the light-emitting element 150. The contact hole 561*a* is formed by removing a portion of the second inter-layer insulating film 156. The opening diameter of the contact hole is set to be sufficiently large, and the inner perimeter of the contact hole 561*a* is set to be the same as the outer perimeter of the top surface 153U when projected onto the XY plane or slightly inward of the outer perimeter of the top surface 153U when projected onto the XY plane.

The electrode 565*a* is located at the bottom portion of the contact hole 561*a*. Therefore, the outer perimeter of the electrode 565*a* when projected onto the XY plane substantially matches the inner perimeter of the contact hole 561*a* when projected onto the XY plane. Accordingly, the electrode 565*a* is provided to cover the entire top surface 153U or substantially the entire top surface 153U. The electrode 565*a* is light-reflective and therefore reflects the upward-scattered light and the like of the light-emitting element 150 toward the light-emitting surface 151S side. Therefore, the substantial luminous efficiency of the light-emitting element 150 is increased. The electrode 565*a* may be formed as a continuous body with the wiring part 560*d* formed on the wall surface of the contact hole 561*a*.

The second wiring layer 160 includes the wiring part 560*d*. The wiring part 560*d* is located on the second inter-layer insulating film 156 and on the wall surface of the contact hole 561*a*, and is connected to the electrode 565*a*. The wiring part 560*d* is connected to the wiring part 110*d* by the via 161*d*, and so the p-type semiconductor layer 153 is electrically connected to the drain region of the transistor 103 via the electrode 565*a*, the wiring part 560*d*, the via 161*d*, the wiring part 110*d*, and the via 111*d*.

A method for manufacturing the image display device of the embodiment will now be described.

Figure 28A:
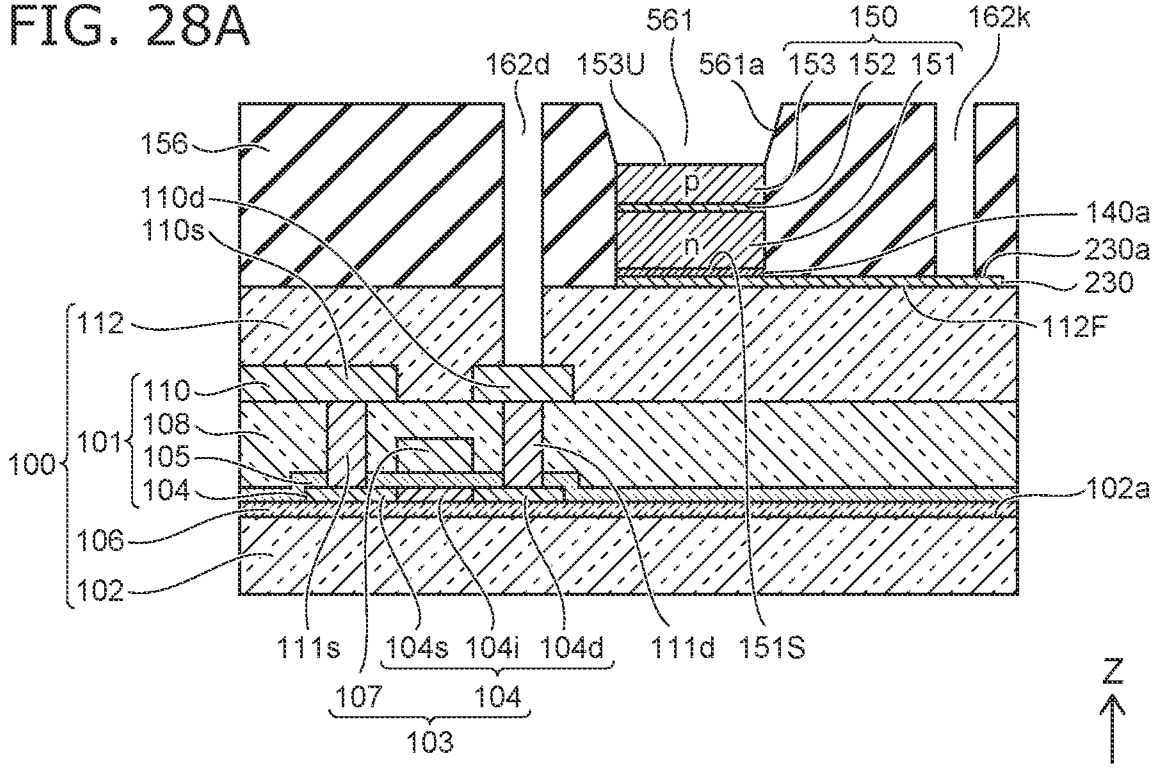
FIG. 28A is a schematic cross-sectional view illustrating a portion of a method for manufacturing the image display device of the fifth embodiment.
Figure 28B:
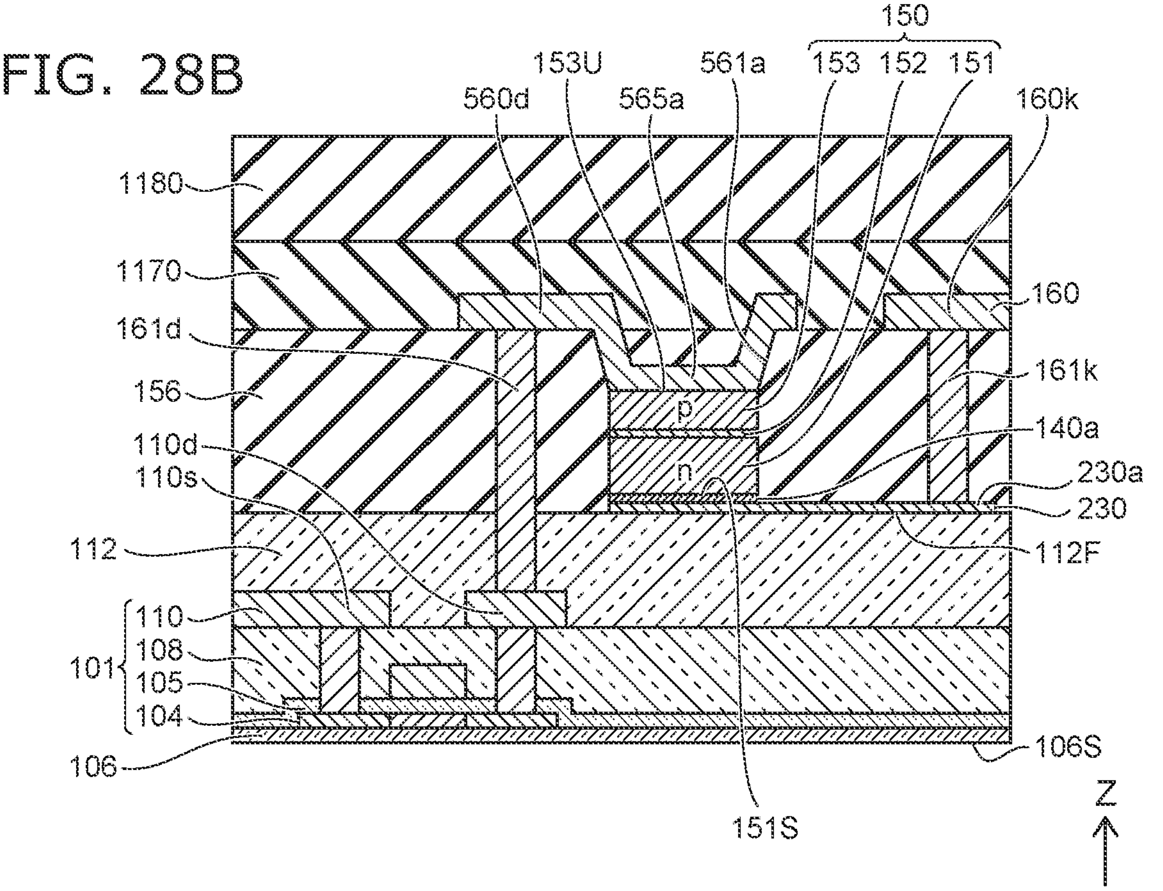
FIG. 28B is a schematic cross-sectional view illustrating a portion of the method for manufacturing the image display device of the fifth embodiment.

FIGS. 28A and 28B are schematic cross-sectional views illustrating the method for manufacturing the image display device of the embodiment.

According to the method for manufacturing the image display device of the embodiment, similarly to the fourth embodiment described above, the processes up to the formation process of the semiconductor layer 1150 shown in FIG. 17A are the same as those of the other embodiments described above. In the following description, the process of FIG. 28A is performed after the process of FIG. 17A. However, in the description of the application of FIG. 17A according to the embodiment, the semiconductor layer 1150 includes the n-type semiconductor layer 1151, the light-emitting layer 1152, and the p-type semiconductor layer 1153 stacked in this order from the graphene layer 1140 side.

As shown in FIG. 28A, the light-transmitting conductive film 1130 shown in FIG. 17A is patterned by etching to form the third wiring layer 230 including the wiring part 230*a*. The semiconductor layer 1150 shown in FIG. 17A is patterned by etching to form the light-emitting element 150. The graphene layer 1140 shown in FIG. 17A is shaped into the graphene sheet 140*a* by over etching when forming the light-emitting element 150. The second inter-layer insulating film 156 is formed to cover the planarized surface 112F, the third wiring layer 230 including the wiring part 230*a*, the graphene sheet 140*a*, and the light-emitting element 150.

The via hole 162*d* is formed to extend through the second and first inter-layer insulating films 156 and 112 and reach the wiring part 110*d*. A via hole 162*k* is formed to extend through the second inter-layer insulating film 156 and reach the wiring part 230*a*. A portion of the second inter-layer insulating film 156 on the light-emitting element 150 is removed to expose the top surface 153U in an opening 561.

Although it is favorable for the entire top surface 153U to be exposed by the opening 561 of the contact hole 561*a*, the shape of the exposed top surface 153U is appropriately set according to the formation accuracy of the contact hole 561*a*. For example, the inner perimeter of the contact hole 561*a* when projected onto the XY plane is set to be slightly smaller than the outer perimeter of the top surface 153U when projected onto the XY plane.

For example, the via holes 162*d* and 162*k* are simultaneously formed. The contact hole 561*a* may be formed simultaneously with the via holes 162*d* and 162*k* or may be formed separately.

As shown in FIG. 28B, the via holes 162*d* and 162*k* shown in FIG. 28A are filled with a conductive material to form the vias 161*d* and 161*k*. The bottom portion of the contact hole 561*a*, i.e., the top surface 153U, may be covered with a conductive material in the formation process of the vias 161*d* and 161*k*.

The second wiring layer 160 is formed on the second inter-layer insulating film 156. When forming the second wiring layer 160, a conductive layer that is used to form the second wiring layer 160 is formed on the second inter-layer insulating film 156 and patterned by etching to form the second wiring layer 160 including the wiring parts 560*d* and 160*k*. In addition to the second inter-layer insulating film 156, the conductive layer is formed over the wall surface of the contact hole 561*a* and the exposed top surface 153U.

Thus, the wiring part 560*d* that is connected to the via 161*d* is formed, and the wiring part 160*k* that is connected to the via 161*k* is formed. The wiring part 560*d* is provided over the wall surface of the contact hole 561*a* and is therefore electrically connected with the top surface 153U as well.

The adhesive layer 1170 is located on the second inter-layer insulating film 156 and the second wiring layer 160, and the reinforcing substrate 1180 is bonded by the adhesive layer 1170. Subsequently, the substrate 102 is removed by wet etching, etc., and the surface 106S of the TFT underlying film 106 is exposed.

Subsequently, a color filter is formed on the surface 106S, and the subpixel 520 is formed.

Effects of the image display device of the embodiment will now be described.

The image display device of the embodiment has the effects of reducing the time of the transfer process for forming the light-emitting element 150 and reducing the number of processes similarly to the image display devices of the other embodiments described above. Also, according to the embodiment, the scattered light and the like radiated upward by the light-emitting element 150 can be reflected toward the light-emitting surface 151S side because the electrode 565*a* is provided over the top surface 153U. Therefore, the substantial luminous efficiency of the light-emitting element 150 is increased.

According to the embodiment, the formation of the contact hole 561*a* for forming the electrode 565*a* can be performed in the formation process of the vias 161*d* and 161*k*. The connection to the top surface 153U by the second wiring layer 160 also can be performed in the formation process of the second wiring layer 160. It is therefore unnecessary to add a process for forming the electrode 565*a*; the manufacturing processes can be reduced, and the period from material input to product completion can be shortened.

Sixth Embodiment

Figure 29:
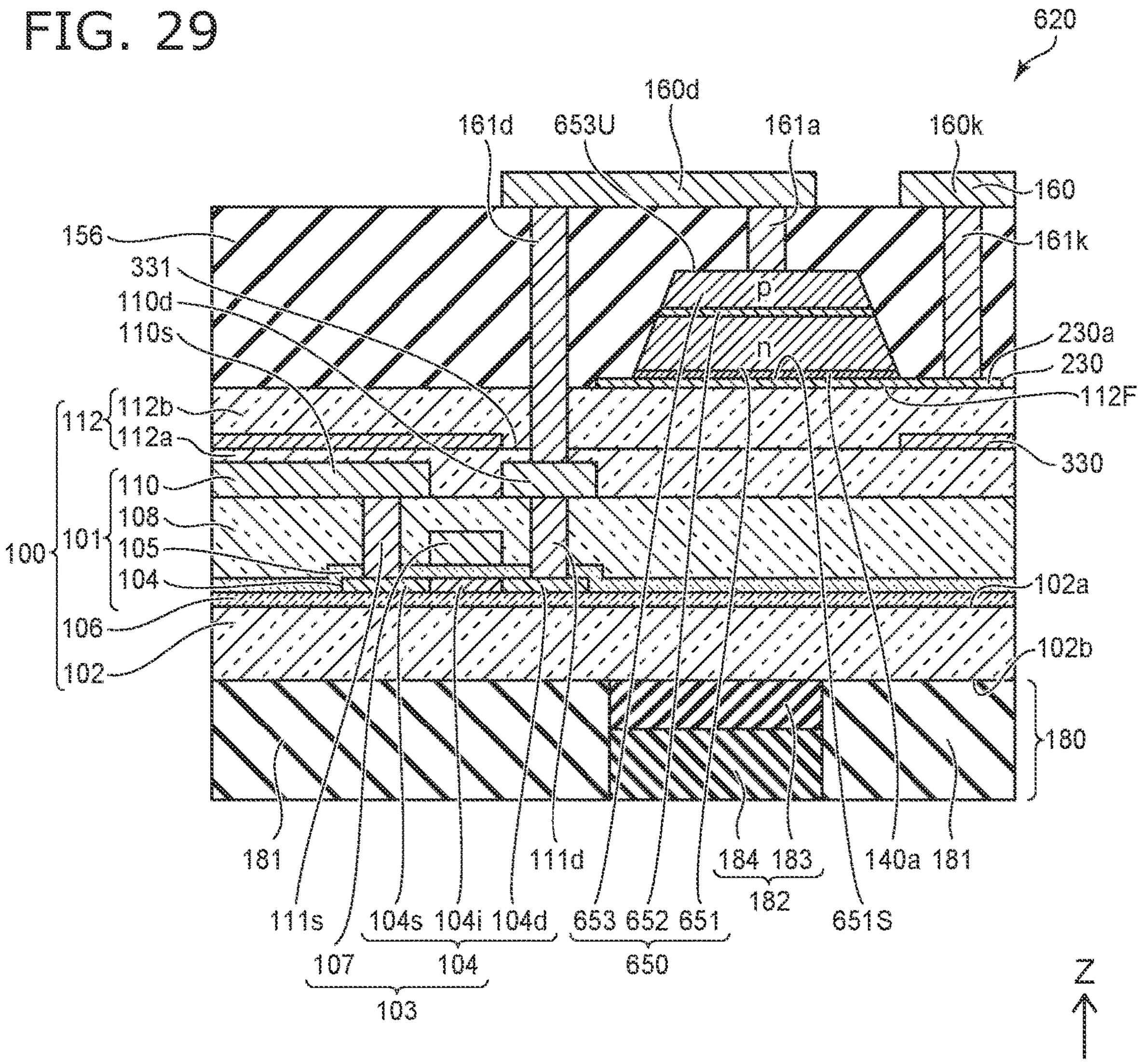
FIG. 29 is a schematic cross-sectional view illustrating a portion of an image display device according to a sixth embodiment.

FIG. 29 is a schematic cross-sectional view illustrating a portion of an image display device of the embodiment.

The configuration of a light-emitting element 650 according to the embodiment is different from that of the other embodiments. The other components are the same as those of the other embodiments described above. The same components are marked with the same reference numerals, and a detailed description is omitted as appropriate.

As shown in FIG. 29, the image display device of the embodiment includes a subpixel 620. The subpixel 620 includes the substrate 102, the transistor 103, the first wiring layer 110, the light-shielding layer 330, the first inter-layer insulating film 112, the third wiring layer 230, the graphene sheet 140*a*, the light-emitting element 650, the second inter-layer insulating film 156, and the second wiring layer 160. The subpixel 620 further includes the color filter 180.

The embodiment includes the light-shielding layer 330. The light-shielding layer 330 has the same configuration described with reference to FIG. 19 according to the third embodiment. When projected onto the XY plane, the light-shielding layer 330 is set to include the outer perimeter of the TFT channel 104 when the TFT channel 104 is projected onto the light-shielding layer 330. That is, the outer perimeter of the TFT channel 104 is located within the outer perimeter of the light-shielding layer 330 when projected onto the XY plane. The through-hole 331 is provided in the light-shielding layer 330. The through-hole 331 is provided to insulate between the optical path and the via 161*d* similarly to the third embodiment.

According to the embodiment, a light-emitting surface 651S is located on the wiring part 230*a* with the graphene sheet 140*a* interposed, and is connected to the via 161*k* by the wiring part 230*a*.

The light-emitting element 650 is a pyramid frustum-shaped or circular frustum-shaped element formed so that the area decreases toward the positive direction of the Z-axis when projected onto the XY plane.

Figure 30:
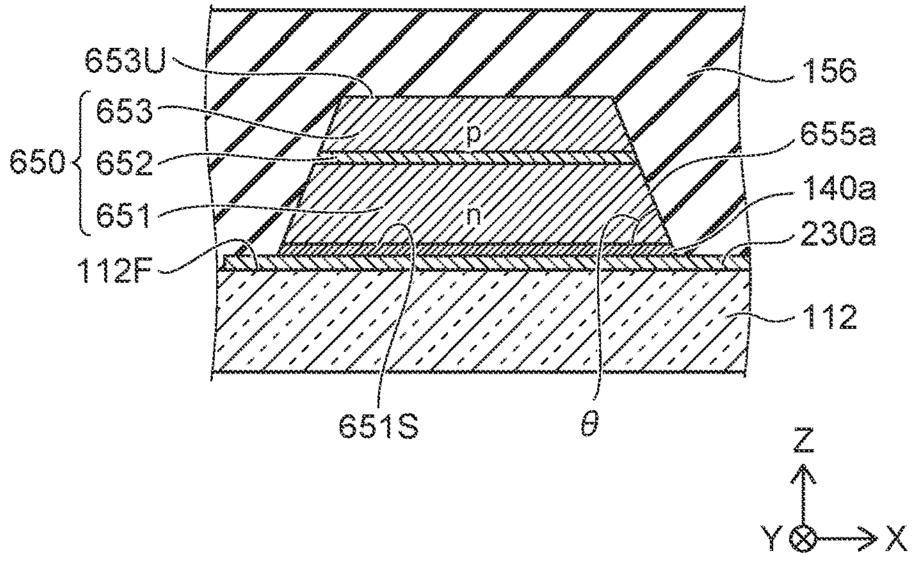
FIG. 30 is a schematic cross-sectional view illustrating a portion of the image display device of the sixth embodiment.

FIG. 30 is a schematic cross-sectional view illustrating a portion of the image display device of the embodiment.

FIG. 30 is a partially enlarged view of FIG. 29 and shows the relationship between the light-emitting surface 651S and a side surface 655*a* of the light-emitting element 650.

As shown in FIG. 30, the planarized surface 112F is a plane that is substantially parallel to the XY plane. The light-emitting element 650 is located on the planarized surface 112F with the graphene sheet 140*a* and the wiring part 230*a* interposed. The light-emitting surface 651S is a surface that is substantially parallel to the planarized surface 112F and substantially parallel to the XY plane. Although the light that is emitted by the light-emitting surface 651S is incident on the first inter-layer insulating film 112 via the graphene sheet 140*a* and the wiring part 230*a*, the thicknesses of the graphene sheet 140*a* and the wiring part 230*a* are thin enough that the reflection and absorption of the light is sufficiently small.

The light-emitting element 650 includes a top surface 653U at the side opposite to the light-emitting surface 651S. The light-emitting element 650 includes the side surface 655*a*. The side surface 655*a* is a surface between the top surface 653U and the planarized surface 112F and is adjacent to the light-emitting surface 651S. An interior angle θ of the angle between the light-emitting surface 651S and the side surface 655*a* is less than 90°. The interior angle θ is favorably about 70°. The interior angle θ is more favorably less than the critical angle of the side surface 655*a* determined based on the refractive index of the light-emitting element 650 and the refractive index of the second inter-layer insulating film 156. The light-emitting element 650 is covered with the second inter-layer insulating film 156, and the side surface 655*a* contacts the second inter-layer insulating film 156.

For example, a critical angle θc of the interior angle θ between the planarized surface 112F and the side surface 655*a* of the light-emitting element 650 is determined as follows.

The critical angle θc of the light emitted from the light-emitting element 650 into the second inter-layer insulating film 156 is determined using the following Formula (1) for a refractive index n0 of the light-emitting element 650 and a refractive index n1 of the second inter-layer insulating film 156.

$$\theta c = 90° - \sin^{-1}(n1/n0) \qquad (1)$$

For example, it is known that the refractive index of a general transparent organic insulating material such as an acrylic resin or the like is about 1.4 to 1.5. Therefore, when the light-emitting element 650 is formed of GaN and the second inter-layer insulating film 156 is formed of a general transparent organic insulating material, it follows that the refractive index n0 of the light-emitting element 650 equals 2.5, and the refractive index n1 of the second inter-layer insulating film 156 equals 1.4. Substituting these values in Formula (1) gives critical angle θc=56°.

This indicates that when the interior angle θ between the planarized surface 112F and the side surface 655*a* is set to θc=56°, the light radiated from a light-emitting layer 652 that is parallel to the light-emitting surface 651S is totally reflected at the side surface 655*a*. This also indicates that the light radiated from the light-emitting layer 652 that has a component in the positive direction of the Z-axis also is totally reflected at the side surface 655*a*. The second inter-layer insulating film 156 described above is taken to be a transparent resin for simplicity. Even when the transparent resin is a white resin, the effects on the refractive index of the fine scattering particles for the white resin are small; therefore, the refractive index of the fine scattering particles are ignored in the calculations described above.

On the other hand, the light radiated from the light-emitting layer 652 that has a component in the negative direction of the Z-axis is emitted from the side surface 655*a* at an emergence angle corresponding to the refractive index at the side surface 655*a*. The light that is incident on the second inter-layer insulating film 156 is emitted from the second inter-layer insulating film 156 at an angle determined by the refractive index of the second inter-layer insulating film 156.

The light that is totally reflected at the side surface 655*a* is re-reflected by the other element interfaces and the top surface 653U, and the re-reflected light that has a component in the negative direction of the Z-axis is emitted from the light-emitting surface 651S and the side surface 655*a*. The light that is parallel to the planarized surface 112F and the light that has a component in the positive direction of the Z-axis are totally reflected at the side surface 655*a*.

Thus, the light radiated from the light-emitting layer 652 that is parallel to the planarized surface 112F or has a component in the positive direction of the Z-axis is converted into light having a component in the negative direction of the Z-axis by the side surface 655*a* and the top surface 653U. Accordingly, the ratio of the light from the light-emitting element 650 that is emitted toward the light-emitting surface 651S is increased, and the substantial luminous efficiency of the light-emitting element 650 is improved.

By setting θ<θc, substantially all of the light having a component parallel to the planarized surface 112F can be totally reflected inside the light-emitting element 650. Because the critical angle θc is about 56° when the refractive index of the second inter-layer insulating film 156 is set to n=1.4, it is more favorable to set the interior angle θ to be 45°, 30°, etc. The critical angle θc decreases as the refractive index n of the material increases. However, even if the interior angle θ is set to about 70°, substantially all of the light having a component in the negative direction of the Z-axis can be converted into light having a component in the positive direction of the Z-axis; therefore, considering the manufacturing fluctuation, etc., for example, the interior angle θ may be set to be not more than 80°, etc.

A method for manufacturing the image display device of the embodiment will now be described.

The manufacturing processes of the light-emitting element 650 according to the embodiment are different from those of the other embodiments; otherwise, the manufacturing processes of the other embodiments described above are applicable. The different portions of the manufacturing processes will now be described.

According to the embodiment, the following processes are performed to form the shape of the light-emitting element 650 shown in FIG. 29. According to the embodiment, the following processes are applied after the process described with reference to FIG. 17A. In the application of the process of FIG. 17A according to the embodiment, the configuration of the semiconductor layer 1150 includes the n-type semiconductor layer 1151, the light-emitting layer 1152, and the p-type semiconductor layer 1153 stacked in this order from the graphene sheet 140*a* side.

The semiconductor layer 1150 shown in FIG. 17A is patterned by etching into the shape of the light-emitting element 650 shown in FIG. 29. To shape the light-emitting element 650, the etching rate is selected so that the side surface 655*a* shown in FIG. 30 has the interior angle θ with respect to the light-emitting surface 651S. For example, the etching is selected so that the etching rate is higher proximate to the top surface 653U. It is favorable to set the etching rate to linearly increase from the light-emitting surface 651S side toward the top surface 653U side.

Specifically, for example, a contrivance when exposing is performed so that the resist mask pattern in the dry etching gradually becomes thin toward the end portions. Accordingly, the resist gradually recedes from the thin portions in the dry etching, and the etching amount can be increased from the light-emitting surface 651S toward the top surface 653U side. Thereby, the side surface 655*a* is formed to have a substantially constant angle with respect to the light-emitting surface 651S. Therefore, the light-emitting element 650 is so that the areas of the layers from the top surface 653U when projected onto the XY plane increase in the order of a p-type semiconductor layer 653, the light-emitting layer 652, and an n-type semiconductor layer 651.

Subsequently, the subpixel 620 is formed similarly to that of the other embodiments.

Effects of the image display device of the embodiment will now be described.

The image display device of the embodiment has the following effects in addition to the effects of reducing the time of the transfer process for forming the light-emitting element 650 and reducing the number of processes similarly to the image display devices of the other embodiments described above.

In the image display device of the embodiment, the light-emitting element 650 is formed to include the side surface 655*a* having the interior angle θ with respect to the light-emitting surface 651S at which the light-emitting element 650 is located. The interior angle θ is less than 90° and is set based on the critical angle θc determined by the refractive indexes of the materials of the light-emitting element 650 and the second inter-layer insulating film 156. The interior angle θ can convert the light radiated from the light-emitting layer 652 that is light traveling sideward and above the light-emitting element 650 into light traveling toward the light-emitting surface 651S side, which can be emitted. The substantial luminous efficiency of the light-emitting element 650 is increased by setting the interior angle θ to be sufficiently small.

According to the embodiment, the light-emitting element 650 can have a vertical structure in which the via 161*k* is connected using the wiring part 230*a* of the third wiring layer 230. Therefore, the component crossing the Z-axis of the current flowing through the light-emitting element 650 can be reduced, and the substantial luminous efficiency can be increased. According to the embodiment, the light-emitting element is not limited to a vertical structure and may have a lateral structure by providing a connection part in the light-emitting element. Here, a light-emitting element that has a lateral structure is a light-emitting element of a structure such as that of the first embodiment that includes the connection part 151*a* beside the semiconductor layer in which the light-emitting surface is provided. By the light-emitting element having a lateral structure, the light-emitting surface can be easily roughened, and a substantial luminous efficiency increase and diffusion of light due to the roughening can be realized.

Seventh Embodiment

Figure 31:
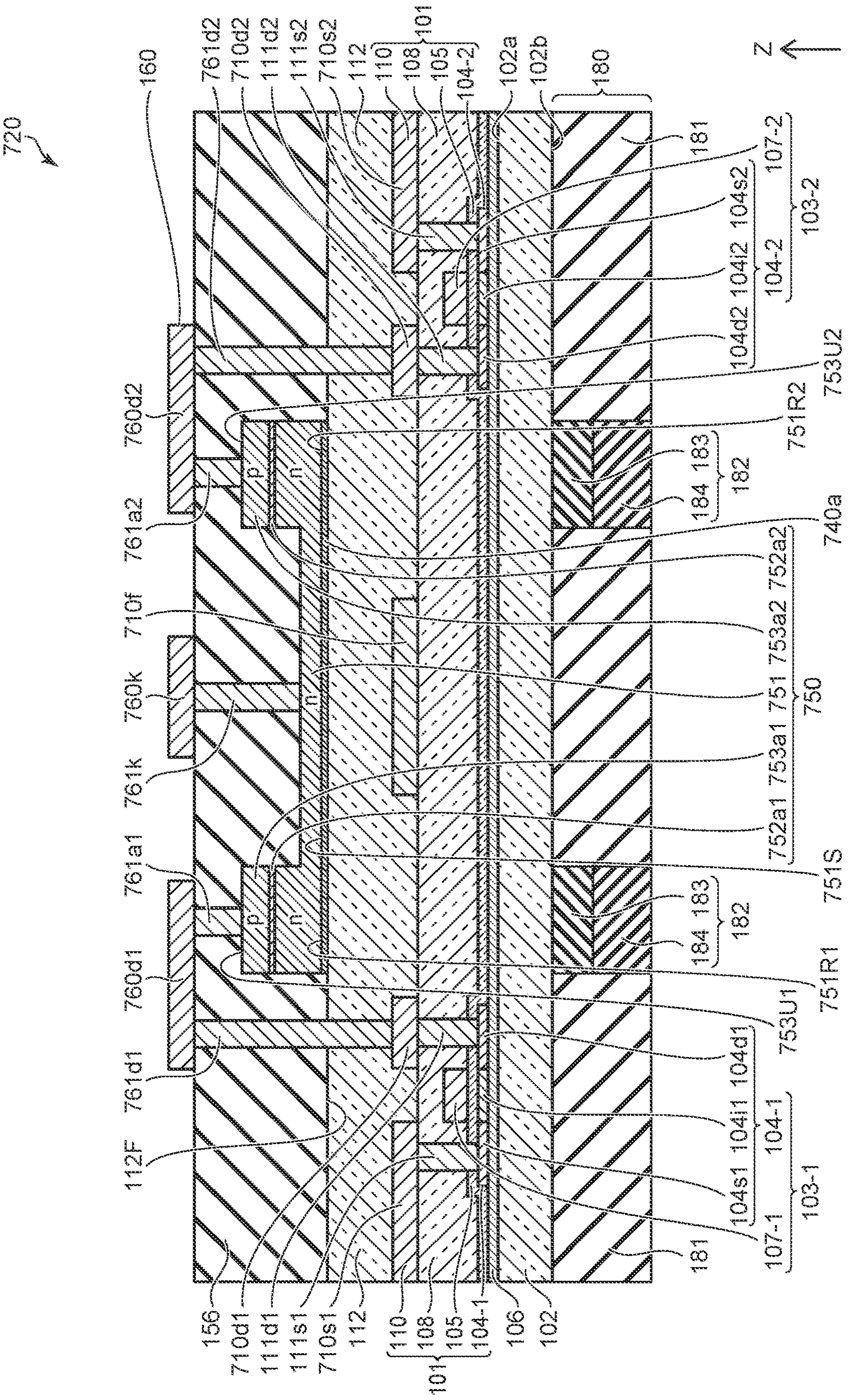
FIG. 31 is a schematic cross-sectional view illustrating a portion of an image display device according to a seventh embodiment.

FIG. 31 is a schematic cross-sectional view illustrating a portion of an image display device of the embodiment.

The embodiment differs from the other embodiments in that the image display device includes a subpixel group 720 including multiple light-emitting regions for one light-emitting surface. The same components are marked with the same reference numerals, and a detailed description is omitted as appropriate.

As shown in FIG. 31, the image display device of the embodiment includes the subpixel group 720. The subpixel group 720 includes the substrate 102, a graphene sheet 740*a*, multiple transistors 103-1 and 103-2, the first wiring layer 110, the first inter-layer insulating film 112, the semiconductor layer 750, the second inter-layer insulating film 156, vias 761*d*1 and 761*d*2, and the second wiring layer 160. The subpixel group 720 further includes the color filter 180.

In the subpixel group 720, the transistors 103-1 and 103-2 are located on the TFT underlying film 106 located on the one surface 102*a* of the substrate 102. The components of the circuit 101 including the transistors 103-1 and 103-2 are covered with the insulating film 108 and are covered with the first inter-layer insulating film 112 together with the first wiring layer 110. The semiconductor layer 750 is located on the planarized surface 112F of the first inter-layer insulating film 112. The color filter 180 is located at the other surface 102*b* of the substrate 102.

According to the embodiment, holes are injected from one side of the semiconductor layer 750 via the first wiring layer 110 and the vias 761*d*1 and 761*d*2 by switching the p-channel transistors 103-1 and 103-2 on. Electrons are injected from the other side of the semiconductor layer 750 via the second wiring layer 160 by switching the p-channel transistors 103-1 and 103-2 on. Light-emitting layers 752*a*1 and 752*a*2 of the semiconductor layer 750 that are separated from each other emit light when the holes and the electrons are injected and the holes and the electrons combine. For example, the circuit configuration shown in FIG. 3 is applied to the drive circuit for driving the light-emitting layers 752*a*1 and 752*a*2. The example of the second embodiment in which the n-type semiconductor layer and p-type semiconductor layer of the semiconductor layer are interchanged also can be used as a configuration that drives the semiconductor layer with an n-channel transistor. In such a case, the circuit configuration of FIG. 15 is applied to the drive circuit.

The configuration of the subpixel group 720 will now be described in detail.

The TFT underlying film 106 is formed on the surface 102*a*. The TFT underlying film 106 is planarized, and the TFT channels 104-1 and 104-2, etc., are formed on the TFT underlying film 106.

The insulating layer 105 covers the TFT underlying film 106 and the TFT channels 104-1 and 104-2. A gate 107-1 is located on the TFT channel 104-1 with the insulating layer 105 interposed. A gate 107-2 is located on the TFT channel 104-2 with the insulating layer 105 interposed. The transistor 103-1 includes the TFT channel 104-1 and the gate 107-1. The transistor 103-2 includes the TFT channel 104-2 and the gate 107-2.

The TFT channel 104-1 includes regions 104*s*1 and 104*d*1 doped to be of the p-type, and the regions 104*s*1 and 104*d*1 are respectively the source region and drain region of the transistor 103-1. A region 104*i*1 is doped to be of the n-type and forms the channel of the transistor 103-1. Similarly, the TFT channel 104-2 also includes regions 104*s*2 and 104*d*2 doped to be of the p-type, and the regions 104*s*2 and 104*d*2 are respectively the source region and drain region of the transistor 103-2. A region 104*i*2 is doped to be of the n-type and forms the channel of the transistor 103-2.

The insulating film 108 covers the insulating layer 105 and the gates 107-1 and 107-2. According to the embodiment, the circuit 101 includes the TFT channels 104-1 and 104-2, the insulating layer 105, the insulating film 108, vias 111*s*1, 111*d*1, 111*s*2, and 111*d*2, and the first wiring layer 110.

The first wiring layer 110 is located on the insulating film 108. The first wiring layer 110 includes wiring parts 710*f*, 710*s*1, 710*s*2, 710*d*1, and 710*d*2.

The wiring part 710*f* is located between light-emitting regions 751R1 and 751R2. Although the wiring part 710*f* is not electrically connected to any circuit component illustrated in FIG. 31 in the example, the wiring part 710*f* can be connected to any potential or circuit component. By providing the wiring part 710*f* between the light-emitting regions 751R1 and 751R2, the light that is emitted from the light-emitting regions 751R1 and 751R2 is shielded. The wiring part 710*f* is not limited to having a light-shielding function for the transistors 103-1 and 103-2 and functions to prevent crossing of the light emitted by the light-emitting regions 751R1 and 751R2.

The wiring part 710*s*1 is located above the region 104*s*1. The via 111*s*1 is located between the wiring part 710*s*1 and the region 104*s*1 and electrically connects the wiring part 710*s*1 and the region 104*s*1. The wiring part 710*s*2 is located above the region 104*s*2. The via 111*s*2 is located between the wiring part 710*s*2 and the region 104*s*2 and electrically connects the wiring part 710*s*2 and the region 104*s*2. For example, the wiring parts 710*s*1 and 710*s*2 are connected to the power supply line 3 of the circuit shown in FIG. 3.

The wiring part 710*d*1 is located above the region 104*d*1. The via 111*d*1 is located between the wiring part 710*d*1 and the region 104*d*1 and electrically connects the wiring part 710*d*1 and the region 104*d*1. The wiring part 710*d*1 is connected to one end of the via 761*d*1. The wiring part 710*d*2 is located above the region 104*d*2. The via 111*d*2 is located between the wiring part 710*d*2 and the region 104*d*2 and electrically connects the wiring part 710*d*2 and the region 104*d*2. The wiring part 710*d*2 is connected to one end of the via 761*d*2.

The first inter-layer insulating film 112 is provided to cover the insulating film 108 and the first wiring layer 110. The first inter-layer insulating film 112 includes the planarized surface 112F.

The graphene sheet 740*a* is located on the planarized surface 112F. The graphene sheet 740*a* is sufficiently thin and is highly light-transmissive.

The semiconductor layer 750 is located on the graphene sheet 740*a*. The outer perimeter of the graphene sheet 740*a* when projected onto the XY plane substantially matches the outer perimeter of the semiconductor layer 750 when projected onto the XY plane. A light-emitting surface 751S of the semiconductor layer 750 contacts the graphene sheet 740*a*. The light-emitting surface 751S is a surface of an n-type semiconductor layer 751. The light-emitting surface 751S includes the multiple light-emitting regions 751R1 and 751R2.

The semiconductor layer 750 includes the n-type semiconductor layer 751, the light-emitting layers 752*a*1 and 752*a*2, and p-type semiconductor layers 753*a*1 and 753*a*2. The light-emitting layer 752*a*1 is located on the n-type semiconductor layer 751. The light-emitting layer 752*a*2 is separated from the light-emitting layer 752*a*1 and is located on the n-type semiconductor layer 751. The p-type semiconductor layer 753*a*1 is located on the light-emitting layer 752*a*1. The p-type semiconductor layer 753*a*2 is separated from the p-type semiconductor layer 753*a*1 and is located on the light-emitting layer 752*a*2.

The p-type semiconductor layer 753*a*1 includes a top surface 753U1 located at the side opposite to the surface at which the light-emitting layer 752*a*1 is located. The p-type semiconductor layer 753*a*2 includes a top surface 753U2 located at the side opposite to the surface at which the light-emitting layer 752*a*2 is located.

The light-emitting region 751R1 is a region that substantially matches the region of the light-emitting surface 751S at the side opposite to the top surface 753U1. The light-emitting region 751R2 is a region that substantially matches the region of the light-emitting surface 751S at the side opposite to the top surface 753U2.

Figure 32:
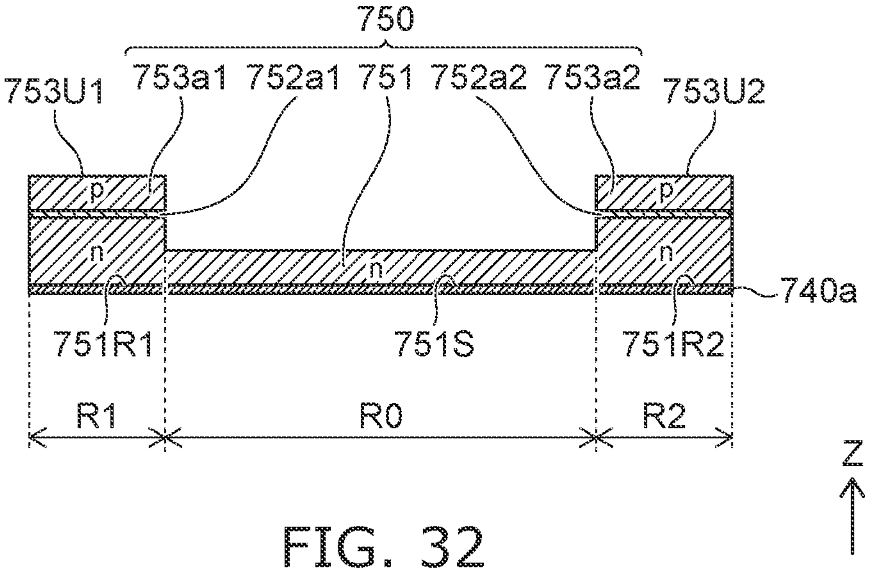
FIG. 32 is a schematic cross-sectional view illustrating a portion of the image display device of the seventh embodiment.

FIG. 32 is a schematic cross-sectional view illustrating a portion of an image display device of the embodiment.

FIG. 32 is a schematic view for describing the light-emitting regions 751R1 and 751R2.

As shown in FIG. 32, the light-emitting regions 751R1 and 751R2 are surfaces on the light-emitting surface 751S. In FIG. 32, the parts of the semiconductor layer 750 that include the light-emitting regions 751R1 and 751R2 are respectively called light-emitting parts R1 and R2. The light-emitting part R1 includes the p-type semiconductor layer 753*a*1, the light-emitting layer 752*a*1, and a portion of the n-type semiconductor layer 751. The light-emitting part R2 includes the p-type semiconductor layer 753*a*2, the light-emitting layer 752*a*2, and a portion of the n-type semiconductor layer 751.

According to the embodiment, the light-emitting region 751R1 is the surface at the side opposite to the top surface 753U1 in the light-emitting part R1. The light-emitting region 751R2 is the surface at the side opposite to the top surface 753U2 in the light-emitting part R2. The light-emitting surface 751S is covered with the graphene sheet 740*a*. According to the method for manufacturing the image display device, the graphene sheet 740*a* is formed by patterning the graphene layer 1140 by etching as described with reference to FIG. 7B, etc. The graphene sheet 740*a* is formed by over etching of the graphene layer 1140 when forming the semiconductor layer 750. Therefore, the outer perimeter of the graphene sheet 740*a* when projected onto the XY plane substantially matches the outer perimeter of the semiconductor layer 750 when projected onto the XY plane.

The semiconductor layer 750 includes a connection part R0. The connection part R0 is located between the light-emitting parts R1 and R2 and is a portion of the n-type semiconductor layer 751. One end of a via 761*k* shown in FIG. 31 is connected to the connection part R0 and provides a current path between the light-emitting parts R1 and R2.

In the light-emitting part R1, the electrons that are supplied via the connection part R0 are supplied to the light-emitting layer 752*a*1. In the light-emitting part R1, the holes that are supplied through the top surface 753U1 are supplied to the light-emitting layer 752*a*1. The electrons and the holes that are supplied to the light-emitting layer 752*a*1 combine and emit light. The light that is emitted by the light-emitting layer 752*a*1 passes through the portion of the n-type semiconductor layer 751 of the light-emitting part R1 and reaches the light-emitting surface 751S. Because the light travels straight substantially along the Z-axis direction through the light-emitting part R1, the portion of the light-emitting surface 751S that emits light is the light-emitting region 751R1. Accordingly, in the example, when projected onto the XY plane, the light-emitting region 751R1 substantially matches the region surrounded with the outer perimeter of the light-emitting layer 752*a*1 projected onto the light-emitting surface 751S.

The light-emitting part R2 is similar to the light-emitting part R1. Specifically, in the light-emitting part R2, the electrons that are supplied via the connection part R0 are supplied to the light-emitting layer 752*a*2. In the light-emitting part R2, the holes that are supplied through the top surface 753U2 are supplied to the light-emitting layer 752*a*2. The electrons and the holes that are supplied to the light-emitting layer 752*a*2 combine and emit light. The light that is emitted by the light-emitting layer 752*a*2 passes through the portion of the n-type semiconductor layer 751 of the light-emitting part R2 and reaches the light-emitting surface 751S. Because the light travels straight substantially along the Z-axis direction through the light-emitting part R2, the portion of the light-emitting surface 751S that emits light is the light-emitting region 751R2. Accordingly, in the example, when projected onto the XY plane, the light-emitting region 751R2 substantially matches the region surrounded with the outer perimeter of the light-emitting layer 752*a*2 projected onto the light-emitting surface 751S.

Thus, in the semiconductor layer 750, the n-type semiconductor layer 751 can be shared, and the multiple light-emitting regions 751R1 and 751R2 can be formed on the light-emitting surface 751S.

According to the embodiment, the semiconductor layer 750 can be formed by using a portion of the n-type semiconductor layer 751 as the connection part R0 for the multiple light-emitting layers 752*a*1 and 752*a*2 and the multiple p-type semiconductor layers 753*a*1 and 753*a*2 of the semiconductor layer 750. Accordingly, the semiconductor layer 750 can be formed similarly to the method for forming the light-emitting elements 150 and 250 according to the first and second embodiments and the like described above.

The description continues now by returning to FIG. 31.

The second inter-layer insulating film 156 is provided to cover the planarized surface 112F, the graphene sheet 740*a*, and the semiconductor layer 750.

The second wiring layer 160 is located on the second inter-layer insulating film 156. The second wiring layer 160 includes wiring parts 760*d*1, 760*d*2, and 760*k*. The wiring part 760*d*1 is connected to the top surface 753U1 via a connection member 761*a*1. The wiring part 760*d*2 is connected to the top surface 753U2 via a connection member 761*a*2. For example, the wiring part 760*k* is connected to the ground line 4 of the circuit of FIG. 3.

The via 761*d*1 extends through the second and first inter-layer insulating films 156 and 112 and reach the wiring part 710*d*1. The via 761*d*1 is located between the wiring part 760*d*1 and the wiring part 710*d*1 and electrically connects the wiring part 760*d*1 and the wiring part 710*d*1. The via 761*d*2 extends through the second and first inter-layer insulating films 156 and 112 and reach the wiring part 710*d*2. The via 761*d*2 is located between the wiring part 760*d*2 and the wiring part 710*d*2 and electrically connects the wiring part 760*d*2 and the wiring part 710*d*2.

The via 761*k* extends through the second inter-layer insulating film 156 and reach the n-type semiconductor layer 751. The via 761*k* electrically connects the wiring part 760*k* and the n-type semiconductor layer 751 between the wiring part 760*k* and the n-type semiconductor layer 751.

For example, the transistors 103-1 and 103-2 are drive transistors of adjacent subpixels and are sequentially driven. When the holes supplied from the transistor 103-1 are injected into the light-emitting layer 752*a*1 and the electrons supplied from the wiring part 760*k* are injected into the light-emitting layer 752*a*1, the light-emitting layer 752*a*1 emits light, and the light is radiated from the light-emitting region 751R1. When the holes supplied from the transistor 103-2 are injected into the light-emitting layer 752*a*2 and the electrons supplied from the wiring part 760*k* are injected into the light-emitting layer 752*a*2, the light-emitting layer 752*a*2 emits light, and the light is radiated from the light-emitting region 751R2.

Effects of the image display device of the embodiment will now be described.

The image display device of the embodiment has the effects of reducing the time of the transfer process for forming the semiconductor layer 750 and reducing the number of processes similarly to the image display devices of the other embodiments described above. Also, because the connection part R0 can be shared by the multiple light-emitting parts R1 and R2, the number of the vias 761*k* provided in the connection part R0 can be reduced. The pitch of the light-emitting parts R1 and R2 included in the subpixel group 720 can be reduced by reducing the number of vias, and a small and high-definition image display device is possible.

According to the embodiment, it is necessary for the light emitted by the light-emitting regions 751R1 and 751R2 to pass through the first inter-layer insulating film 112, the insulating film 108, the insulating layer 105, the TFT underlying film 106, and the substrate 102 until being radiated externally. It is therefore considered that the light spreads in the path until being radiated externally. According to the embodiment, because the wiring part 710*f* is located partway through the path up to where the light is radiated externally, the mixing of light emitted from adjacent pixels is prevented by shielding the spreading light. Therefore, the pixel pitch can be reduced, and a high-quality image display device can be realized. Although two light-emitting regions are described in the example, the light-emitting regions are not limited to two and can be any number of three or more.

Eighth Embodiment

The image display device described above can be used as an image display module having the appropriate number of pixels in, for example, a computer display, a television, a portable terminal such as a smartphone, car navigation, etc.

Figure 33:
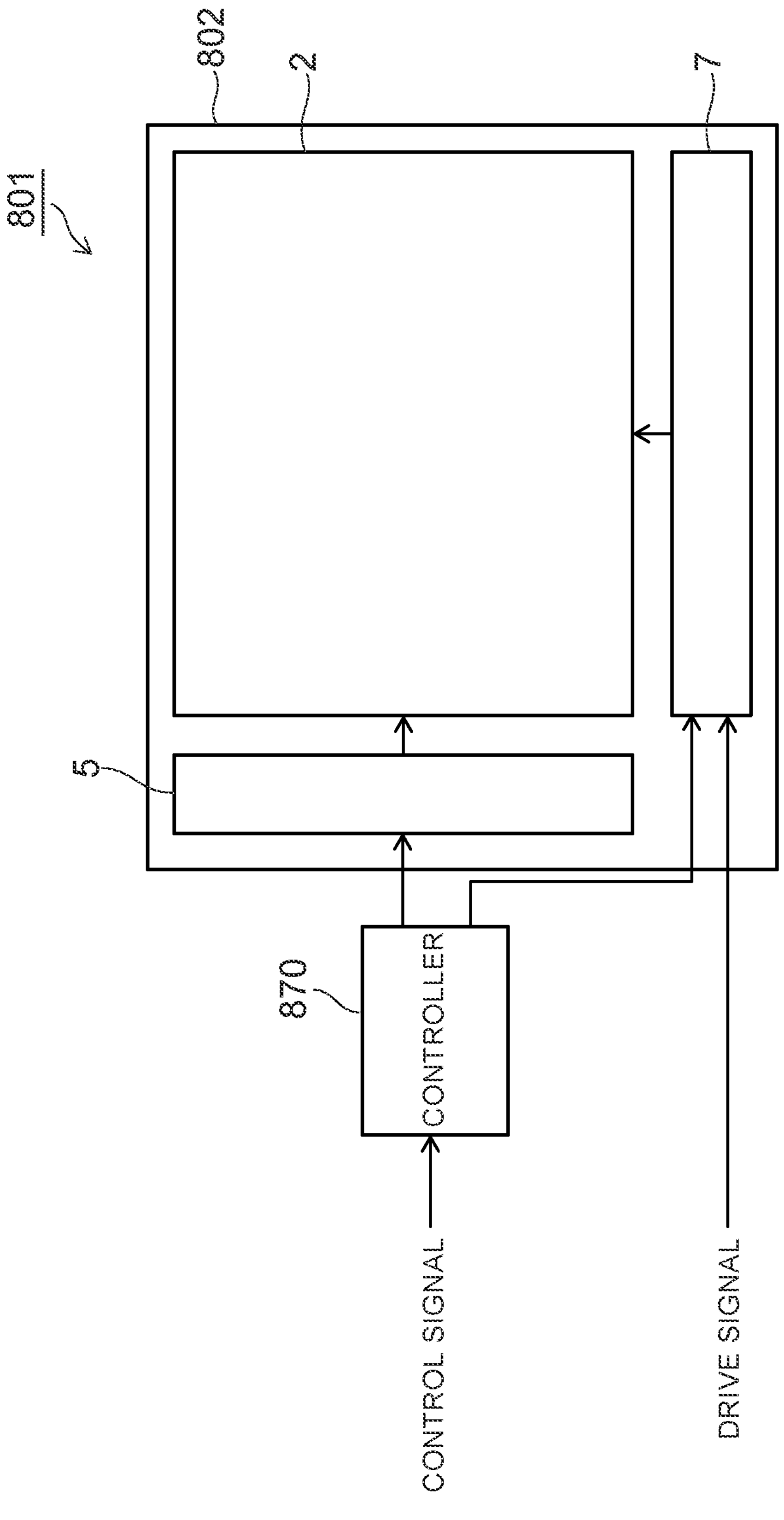
FIG. 33 is a block diagram illustrating an image display device according to an eighth embodiment.

FIG. 33 is a block diagram illustrating the image display device according to the embodiment.

FIG. 33 shows the major parts of the configuration of a computer display.

As shown in FIG. 33, the image display device 801 includes an image display module 802. The image display module 802 is, for example, an image display device that includes the configuration according to the first embodiment described above. The image display module 802 includes the display region 2 in which multiple subpixels including the subpixels 20 are arranged, the row selection circuit 5, and the signal voltage output circuit 7.

The image display device 801 further includes a controller 870. The controller 870 receives input of control signals to be separated and generated by not-illustrated interface circuitry, and controls the driving and the drive sequence of the subpixels in the row selection circuit 5 and the signal voltage output circuit 7.

Modification

Figure 34:
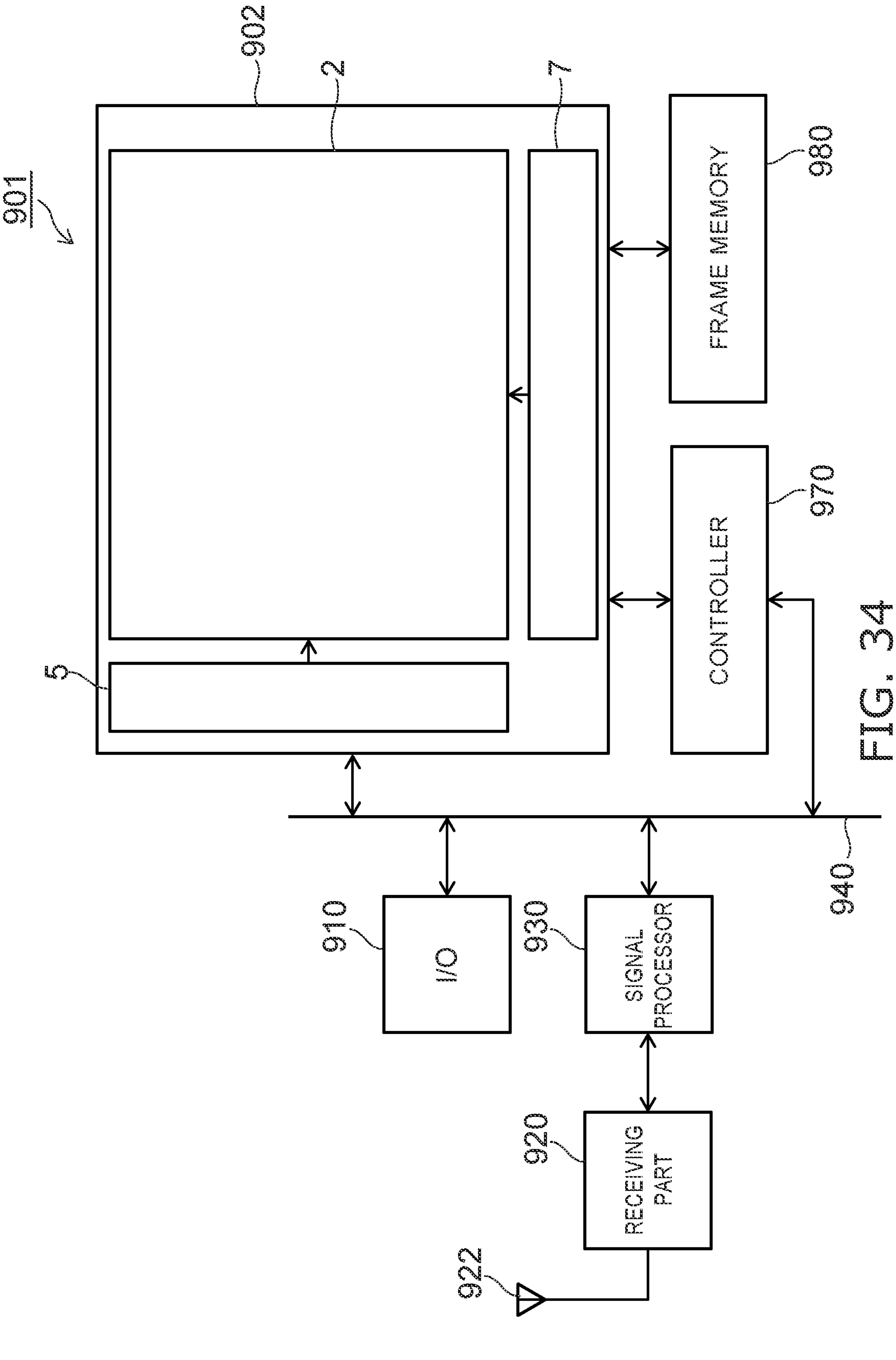
FIG. 34 is a block diagram illustrating an image display device according to a modification of the eighth embodiment.

FIG. 34 is a block diagram illustrating an image display device according to a modification of the embodiment.

FIG. 34 shows the configuration of a high-definition thin television.

As shown in FIG. 34, the image display device 901 includes an image display module 902. The image display module 902 is, for example, the image display device 1 that includes the configuration according to the first embodiment described above. The image display device 901 includes a controller 970 and a frame memory 980. The controller 970 controls the drive sequence of the subpixels of the display region 2 based on a control signal supplied by a bus 940. The frame memory 980 stores one frame of display data and is used for smooth processing such as video image reproduction, etc.

The image display device 901 includes an I/O circuit 910. The I/O circuit 910 is labeled as simply "I/O" in FIG. 34. The I/O circuit 910 provides interface circuitry for connecting with an external terminal, a device, etc. The I/O circuit 910 includes, for example, an audio interface, a USB interface that connects an external hard disk device, etc.

The image display device 901 includes a receiving part 920 and a signal processor 930. An antenna 922 is connected to the receiving part 920, and the necessary signal is separated and generated from the radio wave received by the antenna 922. The signal processor 930 includes a DSP (Digital Signal Processor), a CPU (Central Processing Unit), etc., and the signal that is separated and generated by the receiving part 920 is separated and generated into image data, voice data, etc., by the signal processor 930.

Another image display device also can be made by using the receiving part 920 and the signal processor 930 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment and other embodiments may be used. The image display module according to the embodiment and its modifications are configured to include many subpixels as shown in FIGS. 12 and 13.

According to the embodiments described above, a method for manufacturing an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions described in the claims and their equivalents. Also, the embodiments described above can be implemented in combination with each other.

What is claimed is:

1. A method for manufacturing an image display device, the method comprising:
- preparing a first substrate that comprises:
  - a circuit element formed on a first surface of a substrate,
  - a first wiring layer connected to the circuit element, and
  - a first insulating film covering the circuit element and the first wiring layer;
- forming a graphene-including layer on the first insulating film;
- forming a semiconductor layer on the graphene-including layer, the semiconductor layer comprising a light-emitting layer;
- forming a light-emitting element by patterning the semiconductor layer, the light-emitting element including:
  - a light-emitting surface on the graphene-including layer, and
  - a top surface at a side opposite to the light-emitting surface;
- forming a second insulating film covering the first insulating film, the graphene-including layer, and the light-emitting element;
- forming a first via extending through the first and second insulating films; and
- forming a second wiring layer on the second insulating film;
- removing the substrate;
- forming a wavelength conversion member in place of the substrate that has been removed; and
- exposing the light-emitting surface and roughening the light-emitting surface by forming an opening extending through the first insulating film, wherein:
- the first via is located between the first wiring layer and the second wiring layer and electrically connects the first wiring layer and the second wiring layer.

2. The method according to claim 1, further comprising:
- forming a second via extending through the second insulating film, wherein:
- the light-emitting element comprises a connection part located along the first surface, and the second via is located between the second wiring layer and the connection part and electrically connects the second wiring layer and the connection part.

3. The method according to claim 1, further comprising:

before the formation of the graphene-including layer, forming a third wiring layer on the first insulating film, the third wiring layer being light-transmissive; and forming a second via extending through the second insulating film, the second via being located between the second wiring layer and the third wiring layer and electrically connecting the first wiring layer and the third wiring layer.

4. The method according to claim 1, further comprising:

before the forming of the second insulating film, forming a fourth wiring layer to cover the top surface and a side surface of the light-emitting element.

5. The method according to claim 1, wherein:

the wavelength conversion member comprises a light-shielding part and a color conversion part, and the color conversion part is formed inside the opening.

6. The method according to claim 1, wherein:

the preparing of the first substrate comprises forming a light-shielding layer on the circuit element.

7. The method according to claim 1, wherein:

the semiconductor layer comprises a gallium nitride compound semiconductor.

8. The method according to claim 1, wherein:

the substrate is light-transmissive.

9. The method according to claim 8, further comprising:

forming a wavelength conversion member at a second surface of the substrate, the second surface being at a side opposite to the first surface.

* * * * *